(12) United States Patent
Chen et al.

(10) Patent No.: US 9,006,966 B2
(45) Date of Patent: Apr. 14, 2015

(54) COATINGS FOR PHOTOLUMINESCENT MATERIALS

(71) Applicant: Intematix Corporation, Fremont, CA (US)

(72) Inventors: Xufang Chen, Newark, CA (US); Yi-Qun Li, Danville, CA (US); Yuming Xie, Sugarland, TX (US); Haoguo Zhu, Fremont, CA (US); Xiongfei Shen, Newark, CA (US); Shengfeng Liu, Fremont, CA (US); Dejie Tao, Fremont, CA (US)

(73) Assignee: Intematix Corporation, Fremont, CA (US)

( * ) Notice: Subject to any disclaimer, the term of this patent is extended or adjusted under 35 U.S.C. 154(b) by 27 days.

(21) Appl. No.: 13/671,501

(22) Filed: Nov. 7, 2012

(65) Prior Publication Data

US 2013/0127332 A1    May 23, 2013

Related U.S. Application Data

(60) Provisional application No. 61/557,308, filed on Nov. 8, 2011, provisional application No. 61/577,056, filed on Dec. 18, 2011, provisional application No. 61/576,975, filed on Dec. 16, 2011.

(51) Int. Cl.
*C09K 11/02* (2006.01)
*H05B 33/12* (2006.01)
*H01L 33/50* (2010.01)

(52) U.S. Cl.
CPC ............. *C09K 11/025* (2013.01); *H05B 33/12* (2013.01); *H01L 33/502* (2013.01); *H01L 2224/48091* (2013.01); *H01L 2224/49107* (2013.01); *H01L 2224/73265* (2013.01)

(58) Field of Classification Search
CPC ............... C09K 11/025; H01L 2224/48091; H01L 2224/49107; H01L 2224/73265; H01L 33/502
USPC .................................................. 313/498–512
See application file for complete search history.

(56) References Cited

U.S. PATENT DOCUMENTS

| 3,875,449 A | 4/1975 | Byler et al. |
| 5,604,396 A | 2/1997 | Watanabe et al. |

(Continued)

FOREIGN PATENT DOCUMENTS

| EP | 2175007 A1 | 4/2010 |
| JP | 2000-160155 A | 6/2000 |

(Continued)

OTHER PUBLICATIONS

International Search Report and Written Opinion issued Mar. 26, 2013 for PCT/US2012/059442.

(Continued)

*Primary Examiner* — Anne Hines
(74) *Attorney, Agent, or Firm* — David H. Jaffer; Pillsbury Winthrop Shaw Pittman LLP

(57) ABSTRACT

The teachings are generally directed to phosphors having combination coatings with multifunctional characteristics that increase the performance and/or reliability of the phosphor. The teachings include highly reliable phosphors having coatings that contain more than one inorganic component, more than one layer, more than one thicknesses, more than one combination of layers or thicknesses, a gradient-interface between components, a primer thickness or layer to inhibit or prevent leaching of phosphor components into the coatings, a sealant layer to inhibit or prevent entry of moisture or oxygen from the environment, a mixed composition layer as a sealant and multifunctional combination coatings.

25 Claims, 24 Drawing Sheets

(56) References Cited

U.S. PATENT DOCUMENTS

| | | |
|---|---|---|
| 7,311,858 B2 | 12/2007 | Wang et al. |
| 7,390,437 B2 | 6/2008 | Dong et al. |
| 7,399,428 B2 | 7/2008 | Li et al. |
| 7,655,156 B2 | 2/2010 | Cheng et al. |
| 7,755,276 B2 | 7/2010 | Wang et al. |
| 7,922,937 B2 | 4/2011 | Li et al. |
| 2006/0001352 A1 | 1/2006 | Murata et al. |
| 2006/0078734 A1 | 4/2006 | Braune et al. |
| 2007/0125984 A1 | 6/2007 | Tian et al. |
| 2008/0111472 A1 | 5/2008 | Liu et al. |
| 2008/0138268 A1 | 6/2008 | Tao et al. |
| 2008/0241590 A1 | 10/2008 | Kim et al. |
| 2009/0283721 A1 | 11/2009 | Liu et al. |
| 2009/0294731 A1 | 12/2009 | Li et al. |
| 2010/0084962 A1 | 4/2010 | Winkler et al. |
| 2010/0259156 A1 | 10/2010 | Winkler et al. |
| 2010/0283076 A1 | 11/2010 | Winkler et al. |
| 2010/0308712 A1 | 12/2010 | Liu et al. |
| 2011/0090683 A1 | 4/2011 | Petry et al. |
| 2013/0092964 A1 | 4/2013 | Li et al. |

FOREIGN PATENT DOCUMENTS

| | | |
|---|---|---|
| JP | 2008-063446 A | 3/2008 |
| JP | 2009-132902 A | 6/2009 |
| KR | 10-2010-0100898 A | 9/2010 |

OTHER PUBLICATIONS

Lee et al., Applied Surface Science vol. 257, Issue 20, Aug. 2011, pp. 8355-8359.

US 9,006,966 B2

COATINGS FOR PHOTOLUMINESCENT MATERIALS

CROSS-REFERENCE TO RELATED APPLICATIONS

This application claims the benefit of U.S. Provisional Application No. 61/577,056 filed Dec. 18, 2011, U.S. Provisional Application No. 61/576,975 filed Dec. 16, 2011 and U.S. Provisional Application No. 61/557,308 filed Nov. 8, 2011, all incorporated herein by reference in their entirety.

FIELD OF THE INVENTION

The teachings provided herein are generally directed to phosphors having coatings with characteristics that increase the performance and/or reliability of the phosphor. Furthermore, the teachings provided herein are also directed to the fabrication of nitride phosphors.

BACKGROUND OF THE INVENTION

Phosphors are photoluminescent materials. A performance of a phosphor can be measured at the time of the phosphor's production and then reassessed over a period of time. The change in performance of the phosphor over time is a measure of the reliability of the phosphor's performance. The performance of a phosphor can be affected at the time of production or during use, for example by contamination of the phosphor with undesired elements, for example due to continued exposure to heat, oxygen, and moisture. Although some phosphors are considered to have a better reliability and thermal stability than others, the performance of these phosphors over time, i.e., their reliability, can be detrimentally affected by such continued exposure to heat, oxygen, and moisture during use.

Photoluminescent materials are integral components of white light emitting diodes (LEDs) which are typically used as backlight sources of various display sources including, for example, mobile phones and liquid crystal display devices. More recently, white-light-emitting LEDs using photoluminescent materials have been extensively used in lighting and proposed as substitutes for conventional white light sources, such as incandescent, fluorescent and halogen lamps.

Accordingly, one of skill will appreciate having highly reliable, coated, nitride-based red phosphors that can be used, for example, in LEDs. A desirable phosphor could have (i) a low oxygen contamination at the time of manufacture to provide (ii) a high initial performance, and (iii) a uniform inorganic compound layer, such as a silicon-dioxide coating to maintain a high performance over an extended period of time in a harsh environment.

Furthermore, phosphors can be coated with metal oxides to improve their reliability by serving as a barrier layer. The coatings, however, also vary in performance and reliability in themselves. For example, coatings can vary in porosity, can be more or less amorphous or hygroscopic than others, can have varying uniformities or morphologies, can be more physically susceptible to damage during use, for example, more apt to crack under use, or the like. Moreover, phosphors can not only serve as a barrier to the entry of contaminants, but they can absorb water or another contaminant, or perhaps result in a leaching of important phosphor components, during manufacturing of the coated phosphor, for example, which can affect the performance and/or reliability of the phosphor. In addition, since moisture is a contaminant that can cause phosphor degradation and color change, one of skill would appreciate a coating combination that results in a reduction in the amount of moisture reaching the phosphor and a reduction in leaching of chemicals from the phosphor to provide coated phosphors having an improved performance and/or reliability.

Accordingly, one of skill will appreciate phosphors having combination coatings with multifunctional characteristics that increase the performance and/or reliability of the phosphor. Such phosphors can be used, for example, to increase the reliability of products using LEDs. A desirable phosphor could have a coating that includes (i) a primer material having a primer thickness that inhibits or prevents a leaching of chemical from the phosphor; and (ii) a sealant material having a sealant thickness to inhibit or prevent the contamination of the phosphor from the operating environment, the combination primer and sealant materials providing a multifunctional coating that maintains a high performance over an extended period of time in a harsh environment.

SUMMARY OF THE INVENTION

The teachings provided herein are generally directed to phosphors having combination coatings with multifunctional characteristics that increase the performance and/or reliability of the phosphor. The teachings include phosphors having coatings that contain more than one inorganic component, more than one layer, more than one thickness, more than one combination of layers or thicknesses, a gradient-interface between components, a primer thickness or layer to inhibit or prevent leaching of phosphor components into the coatings, a sealant layer to inhibit or prevent entry of moisture or oxygen from the environment, and multifunctional combination coatings thereof.

In some embodiments, the teachings are directed to a multifunctional coating for a photoluminescent material. The coating can comprise at least two metal oxides, the two metal oxides including: a primer material having a primer thickness on the surface of the photoluminescent material, the primer thickness functioning to at least inhibit a leaching of a component of the photoluminescent material into the coating; and, a sealant material between the primer layer and operating environment, the sealant material having a sealant thickness that functions to inhibit or prevent oxygen or moisture from diffusing through the coating and into the photoluminescent material. The sealant material can be an outermost thickness adjacent to the operating environment.

In some embodiments, the teachings are directed to a multifunctional coating for a photoluminescent material. The coating can comprise at least two metal/semiconductor oxides, the two metal/semiconductor oxides forming a mixed composition layer on the surface of the photoluminescent material. (For example, the at least two oxides may be: $Al_2O_3$ and $SiO_2$; or $TiO_2$ and $SiO_2$.) The two metal/semiconductor oxides in the mixed composition layer being mixed together in a certain ratio (said ratio varying through the thickness of the layer) to at least: inhibit a leaching of a component of the photoluminescent material into the coating; and/or inhibit or prevent oxygen or moisture from diffusing through the coating and into the photoluminescent material. The mixed composition layer can be an outermost thickness adjacent to the operating environment.

The teachings are also directed to a photoluminescent material having a multifunctional coating. The multifunctional coating can comprise a photoluminescent material having a surface and a coating having at least two metal oxides. The two metal oxides can include, for example: a primer thickness on the surface of the photoluminescent material, the primer thickness comprising a primer metal oxide that functions to at least inhibit a leaching of a component of the photoluminescent material into the coating; and, a sealant material between the primer layer and operating environment, the sealant material having a sealant thickness that functions to inhibit or prevent oxygen or moisture from diffusing through the coating and into the photoluminescent material. The sealant material can be an outermost thickness adjacent to the operating environment.

The teachings are also directed to a photoluminescent material coated with a plurality of oxides. The coated photoluminescent material can comprise a photoluminescent material having a surface; and, a coating having at least two metal/semiconductor oxides. The two metal/semiconductor oxides can include a primer material having a primer thickness consisting of titanium dioxide on the surface of the photoluminescent material, and a sealant material between the primer layer and operating environment, the sealant material having a sealant thickness that functions to inhibit or prevent oxygen or moisture from diffusing through the coating and into the photoluminescent material. The sealant material can be an outermost thickness adjacent to the operating environment.

The teachings are also directed to a photoluminescent material coated with a plurality of oxides. The coated photoluminescent material can comprise a photoluminescent material having a surface; and, a coating having at least two metal/semiconductor oxides. The two metal/semiconductor oxides being aluminum oxide and silicon oxide mixed together in a certain thickness covering the surface of the photoluminescent material to form a mixed composition layer. The mixed composition layer comprising aluminum oxide and silicon oxide with a certain thickness that can act as a sealant material between the photoluminescent material and the operating environment. The sealant material having a sealant thickness that functions to inhibit or prevent oxygen or moisture from diffusing through the coating and into the photoluminescent material. The sealant material can be an outermost layer adjacent to the operating environment.

The teachings are also directed to a method of making a photoluminescent material having a multifunctional coating. The method can comprise depositing (i) a thickness of a primer metal oxide on a surface of a photoluminescent material and (ii) a thickness of a sealant metal/semiconductor oxide providing an outermost surface for the photoluminescent material. The primer metal oxide can be generated from a precursor of the primer metal oxide in a liquid phase. The depositing of the thickness of the primer metal oxide can occur for a time effective to deposit the thickness of the primer metal oxide to a thickness of at least about 20 nm on the surface of the photoluminescent material in a single coating cycle, although thinner layers can be deposited, and the primer metal oxide is deposited on the surface at a rate of between about 1 nm and about 100 nm per hour. And, the depositing of the thickness of the sealant metal/semiconductor oxide occurs for a time effective to deposit the thickness of the sealant metal/semiconductor oxide to a thickness of at least about 20 nm, although thinner layers can be deposited, to provide the outermost surface of the photoluminescent material in a single coating cycle. The sealant metal oxide can be deposited on the surface, for example, at a rate of between about 1 nm and about 100 nm per hour.

In some embodiments, the method can further comprise forming a gradient-interface thickness between the primer thickness and the outermost, sealant thickness, the gradient-interface thickness having a mixture of the primer metal oxide and the sealant metal/semiconductor oxide. And, in some embodiments, the depositing can include forming the primer thickness as a discrete layer, and forming the sealant thickness as a discrete layer.

In some embodiments, the method can further comprise forming a mixed composition coating between the photoluminescent material and the operating environment, the mixed composition coating comprising a mixture of two metal/semiconductor oxides. And, in some embodiments, the depositing can include forming the mixed composition coating as a discrete layer. The latter mixed composition coating being formed when two metal/semiconductor oxides deposit at the same time in a certain (varying) ratio with time.

In some embodiments, the depositing can comprise forming a mixture of the precursor and a solvent; and, gradually adding water and heating the mixture to a first temperature (for example, 40-45° C.) and holding the mixture at said first temperature for a period of time to control (i) a rate of formation of the primer metal oxide or sealant metal oxide from the precursor, and (ii) a rate of deposition of the primer metal oxide or sealant metal oxide. In some embodiments, the depositing can comprise adding a photoluminescent material to a solvent to form a first mixture; adjusting the pH of the first mixture to prepare for a hydrolysis of a precursor of the primer metal oxide or sealant metal oxide; adding the precursor of the primer metal oxide or sealant metal oxide to the first mixture to form a second mixture, where the precursor can be added at a controlled rate to the first mixture, and the amount of the precursor added can be such that there is less than about 20% by weight of the primer metal oxide or sealant metal oxide as compared to the weight of the photoluminescent material; mixing the second mixture at a second temperature (for example, 50-55° C.) for a period of time to allow for a deposition of the primer metal oxide on a surface of the photoluminescent material or a sealant metal oxide as an outermost sealant thickness; washing the coated photoluminescent material; purifying the coated photoluminescent material; drying the coated photoluminescent material; and, calcining the coated photoluminescent material.

In some embodiments, the precursor is an organometallic compound. And, in some embodiments, the precursor is an inorganic salt.

In some embodiments, a coated photoluminescent material is produced using a method taught herein, and an intensity of photoluminescence from the photoluminescent material in an uncoated form can be the same, or substantially the same, as the photoluminescent material having the coating.

The teachings are also directed to a nitride phosphor coated with a plurality of metal/semiconductor oxides. The coated nitride phosphor can comprise a nitride phosphor having a surface; and, a coating having at least two metal/semiconductor oxides. The two metal/semiconductor oxides can include a primer material having a primer thickness consisting of titanium dioxide on the surface of the photoluminescent material, and a sealant material between the primer material and environment, the sealant material having a sealant thickness consisting of silicon dioxide. The sealant material can be an outermost thickness that is adjacent to the operating environment. The titanium dioxide can at least inhibit a leaching of components from the photoluminescent material, and the silicon dioxide can at least inhibit a diffusion of water or oxygen into the photoluminescent material.

The teachings are also directed to a nitride phosphor coated with a plurality of metal/semiconductor oxides. The coated nitride phosphor can comprise a nitride phosphor having a surface; and, a coating having at least two metal/semiconductor oxides. The two metal/semiconductor oxides can include a mixed composition thickness comprising aluminum oxide and silicon oxide on the surface of the photoluminescent material. The mixed composition material can be an outermost thickness that is adjacent to the operating environment. The mixed composition layer comprising aluminum oxide and silicon oxide can at least inhibit a leaching of components from the photoluminescent material, and can at least inhibit a diffusion of water or oxygen into the photoluminescent material.

The photoluminescent material can be a silicate phosphor, a nitride phosphor, an aluminate phosphor, an oxynitride phosphor, a sulfide phosphor an oxysulfide phosphor, etc.

The teachings are also directed to a light emitting device, comprising a solid state light emitter; and, a coated photoluminescent material as taught herein. In some embodiments, the light-emitting device comprises a silicate phosphor, a nitride phosphor, or an aluminate phosphor.

The coatings can be produced in discrete layers, or the coating process can be continuous, transitioning the coating components in a manner that creates a gradient-interface layer. In some embodiments, the primer thickness is a discrete layer, and the sealant thickness is a discrete layer. In some embodiments, the coating further comprises a gradient-interface thickness between the primer thickness and the outermost, sealant thickness, the gradient-interface thickness having a mixture of titanium dioxide and silicon dioxide. In some embodiments, the thickness of the coating can range from about 20 nm to about 500 nm, although thicker and thinner coatings can be used.

The coatings can be produced in discrete layers, or the coating process can be continuous, transitioning the coating components in a manner that creates a mixed composition layer. In some embodiments, the mixed composition thickness is a discrete layer in which aluminum oxide and silicon dioxide are mixed together in a certain ratio (which may vary through the thickness—see below), in which the Al/Si molar ratio is from 1:1 to 1:30. In some embodiments, the mixed composition coating layer further comprises a gradient-interface thickness between the photoluminescent material and the outermost surface of the coating, the gradient-interface thickness having a mixture of aluminum oxide and silicon dioxide in an Al/Si molar ratio ranging from 1:1 to 1:50. In some embodiments, the thickness of the coating can range from about 10 nm to about 200 nm, although thicker and thinner coatings may be used. And, in some embodiments, the mixed composition thickness is at least within the range of 10 nm to 100 nm.

Although embodiments of the present invention are generally directed to coatings comprising combinations of materials, the present invention also includes coatings comprising $SiO_2$ alone, which may also provide a significant advantage over the prior art. Many of the teachings for the combination coatings provided herein also apply to $SiO_2$ coatings—for example, $SiO_2$ coatings may be applied to the same range of phosphor materials, in a wide range of thicknesses and uniformities as described above for the coatings comprising combinations of materials.

In some embodiments, the teachings are directed to a silicon-dioxide coated, photoluminescent material, comprising a nitride-based red phosphor having the formula M-A-B—(N,D):Z; and, a layer of a silicon dioxide on a surface of the phosphor. In these embodiments, M is a divalent element; A is a trivalent element; B is a tetravalent element; N is nitrogen; Z is an activator; and D is a halogen. The phosphor can be configured to emit visible light having a peak emission wavelength of at least about 600 nm. And, in some embodiments, the intensity of photoluminescence from the photoluminescent material in an uncoated form is the same, or substantially the same, as the intensity of photoluminescence from the photoluminescent material having the layer comprising silicon dioxide.

In some embodiments, the nitride phosphor can have the formula $M_mM_aM_b(N,D)_n:Z_z$; wherein, $M_m$ is M; $M_a$ is A; $M_b$ is B; $(N,D)_n$ is (N,D); and, $Z_z$ is Z. The stoichiometry of (m+z):a:b:n in these embodiments can be about 1:1:1:3.

In some embodiments, the nitride phosphor can have the formula $M_mM_aM_bD_{3w}N_{[(2/3)m+z+a+(4/3)b-w]}Z_z$; wherein, $M_m$ is M and is selected from the group consisting of Be, Mg, Ca, Sr, Ba, Zn, Cd, and Hg; $M_a$ is A and is selected from the group consisting of B, Al, Ga, In, Y, Sc, P, As, La, Sm, Sb, and Bi; $M_b$ is B selected from the group consisting of C, Si, Ge, Sn, Ni, Hf, Mo, W, Cr, Pb, Ti, and Zr; $D_{3w}N_{[(2/3)m+z+a+(4/3)b-w]}$ is (N,D), and D is selected from the group consisting of F, Cl, Br, and I; and, $Z_z$ is Z; and is selected from the group consisting of Eu, Ce, Mn, Tb, and Sm. The stoichiometry can be for example, $0.01 \leq m \leq 1.5$; $0.01 \leq a \leq 1.5$; $0.01 \leq b \leq 1.5$; $0.0001 \leq w \leq 0.6000$, and $0.0001 \leq z \leq 0.5000$.

In some embodiments, the nitride phosphor can have the formula $Ca_{1-x}AlSiN_3Eu_x:D$; wherein, x ranges from 0.0001 to 0.500 in increments of 0.001, and D comprises fluorine, chlorine, bromine, or iodine. And, in some embodiments, D is chlorine.

In some embodiments, the nitride phosphor can have the formula $CaAlSi(N_{1-x},D_x)3:Eu^{2+}$; wherein, x ranges from 0.0001 to 0.500 in increments of 0.001, and D comprises fluorine, chlorine, bromine, or iodine. And, in some embodiments, D is chlorine.

In some embodiments, the nitride phosphor can have the formula $Ca_{0.2}Sr_{0.795}AlSiN_3Eu_{0.005}Cl_{0.05}$, $Ca_{0.2}Sr_{0.797}AlSiN_3Eu_{0.003}Cl_{0.05}$, or $Ca_{0.2}Sr_{0.993}AlSN_3Eu_{0.007}Cl_{0.008}$.

The teachings are also directed to a method of creating the coated phosphors, the method comprising applying silicon dioxide to a surface of the nitride phosphor.

As such, the teachings included a coated, photoluminescent material, comprising a nitride-based red phosphor having the formula $Ca_{0.2}Sr_{0.795}AlSiN_3Eu_{0.005}Cl_{0.05}$, $Ca_{0.2}Sr_{0.797}AlSiN_3Eu_{0.003}Cl_{0.05}$, or $Ca_{0.2}Sr_{0.993}AlSiN_3Eu_{0.007}Cl_{0.008}$; and, a layer of silicon dioxide on a surface of the phosphor, the layer having a thickness ranging from about 5 nm to about 100 nm. In these embodiments, the intensity of photoluminescence from the photoluminescent material in an uncoated form is the same, or substantially the same, as the intensity of photoluminescence from the photoluminescent material having the layer comprising silicon dioxide. Moreover, the thickness of the silicon dioxide layer can be uniform, varying by less than about 2%. And, the thickness of the silicon dioxide layer can range from about 5 nm to about 100 nm, or from about 15 nm to about 20 nm.

In some embodiments, the light emitting device taught herein can comprise a silicate phosphor, an aluminate phosphor, a nitride phosphor, an oxynitride phosphor, a sulfide phosphor, an oxysulfide phosphor, etc. In some embodiments, the coatings taught herein can comprise silicon dioxide, titanium dioxide, aluminum oxide, zinc oxide, or boron oxide. And, in some embodiments, the coatings taught herein can comprise silicon dioxide, titanium dioxide, aluminum oxide and/or a combination thereof.

According to embodiments of the present invention, which are an invention standing on their own, the teachings are directed to a phosphor of the formula $M_mM_aM_bD_{3w}N_{[(2/3)m+z+a+(4/3)b-w]}Z_z$; wherein, $M_m$ is M and is selected from the group consisting of Be, Mg, Ca, Sr, Ba, Zn, Cd, and Hg; $M_a$ is A and is selected from the group consisting of B, Al, Ga, In, Y, Sc, P, As, La, Sm, Sb, and Bi; $M_b$ is B selected from the group consisting of C, Si, Ge, Sn, Ni, Hf, Mo, W, Cr, Pb, Ti, and Zr; $D_{3w}N_{[(2/3)m+z+a+(4/3)b-w]}$ is (N,D), and D is selected from the group consisting of F, Cl, Br, and I; and, $Z_z$ is Z; and is selected from the group consisting of Eu, Ce, Mn, Tb, and Sm. The stoichiometry can be for example, $0.01 \leq m \leq 1.5$; $0.01 \leq a \leq 1.5$; $0.01 \leq b \leq 1.5$; $0.0001 \leq w \leq 0.6000$, and $0.0001 \leq z \leq 0.5000$. In other embodiments, the nitride phosphor can have the formula $CaSr_{0.8-x}AlSiN_3:Eu_x:D$ wherein, x ranges from about 0.001 to about 0.009 and D comprises fluorine, chlorine, bromine, or iodine. The phosphor may have the formula $Ca_{0.2}Sr_{0.799}AlSiN_3Eu_{0.001}:Cl_{0.05}$, $Ca_{0.2}Sr_{0.798}AlSiN_3Eu_{0.002}:Cl_{0.05}$, $Ca_{0.2}Sr_{0.797}AlSiN_3Eu_{0.003}:Cl_{0.05}$, $Ca_{0.2}Sr_{0.796}AlSiN_3Eu_{0.004}:Cl_{0.05}$, $Ca_{0.2}Sr_{0.794}AlSiN_3Eu_{0.006}:Cl_{0.05}$, $Ca_{0.2}Sr_{0.793}AlSiN_3Eu_{0.007}:Cl_{0.05}$, $Ca_{0.2}Sr_{0.792}AlSiN_3Eu_{0.008}:Cl_{0.05}$, $Ca_{0.2}Sr_{0.791}AlSiN_3Eu_{0.009}:Cl_{0.05}$ or $Ca_{0.2}Sr_{0.7925}AlSiN_3Eu_{0.0075}:Cl_{0.05}$. In other embodiments the phosphor may have the formula $Ca_{1-x}AlSiN_3Eu_x:D$; wherein, x ranges from about 0.0001 to about 0.500 and D comprises fluorine, chlorine, bromine, or iodine, for example having the formula $Ca_{0.993}AlSiN_3Eu_{0.007}Cl_{0.008}$.

The teachings are also directed to methods of making the aforementioned nitride phosphor.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

The teachings provided herein are generally directed to highly reliable phosphors having combination coatings with multifunctional characteristics that increase the performance and/or reliability of the phosphor. The teachings include highly reliable phosphors having coatings that contain more than one inorganic component, more than one layer, more than one thicknesses, more than one combination of layers or thicknesses, a gradient-interface between components, a primer thickness or layer to inhibit or prevent leaching of phosphor components into the coatings, a sealant layer to inhibit or prevent entry of moisture or oxygen from the environment, and multifunctional combination coatings thereof. Such coated phosphors are particularly useful in the white light illumination industry, which utilizes the so-called "white LED."

Figure 1:
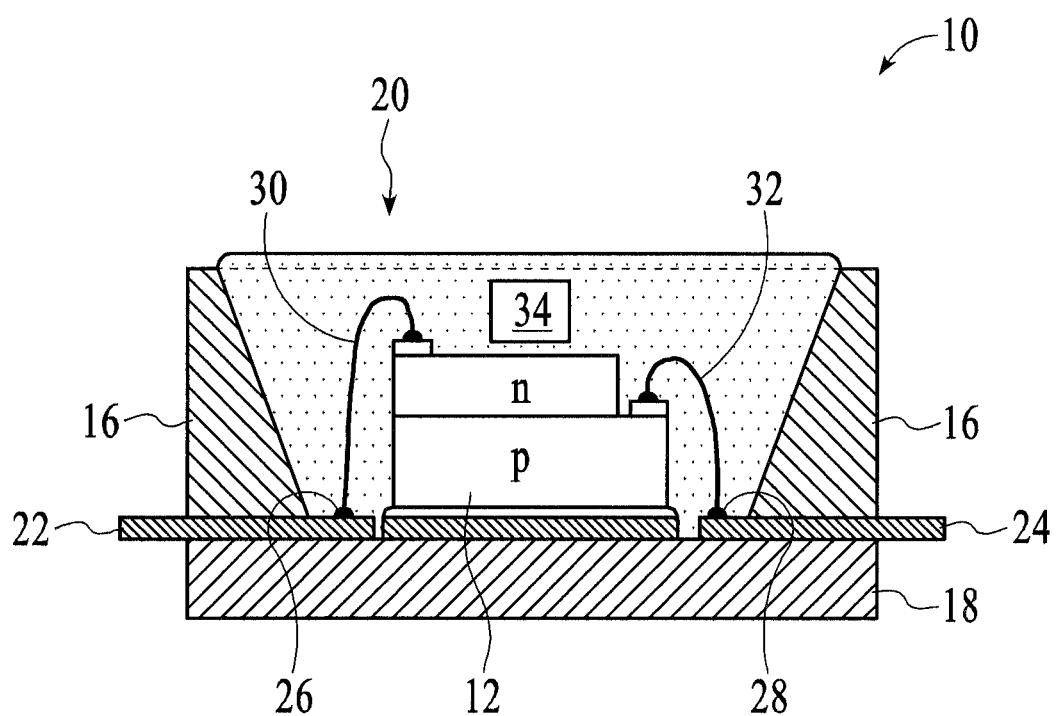
FIG. 1 illustrates a light emitting device, according to some embodiments of the present invention.

FIG. 1 illustrates a light emitting device, according to some embodiments. The device 10 can comprise a blue light emitting GaN (gallium nitride) LED chip 12, for example, housed within a package 14. The package 14, which can for example comprise a low temperature co-fired ceramic (LTCC) or high temperature polymer, comprises upper and lower body parts 16, 18. The upper body part 16 defines a recess 20, often circular in shape, which is configured to receive the LED chips 12. The package 14 further comprises electrical connectors 22,24 that also define corresponding electrode contact pads 26,28 on the floor of the recess 20. Using adhesive or soldering, the LED chip 12 is mounted to the floor of the recess 20. The LED chip's electrode pads are electrically connected to corresponding electrode contact pads 26,28 on the floor of the package using bond wires 30,32 and the recess 20 is completely filled with a transparent polymer material 34, typically a silicone, which is loaded with the powdered coated phosphor material such that the exposed surfaces of the LED chip 12 are covered by the phosphor/polymer material mixture. To enhance the emission brightness of the device the walls of the recess are inclined and have a light reflective surface.

Figure 2A:
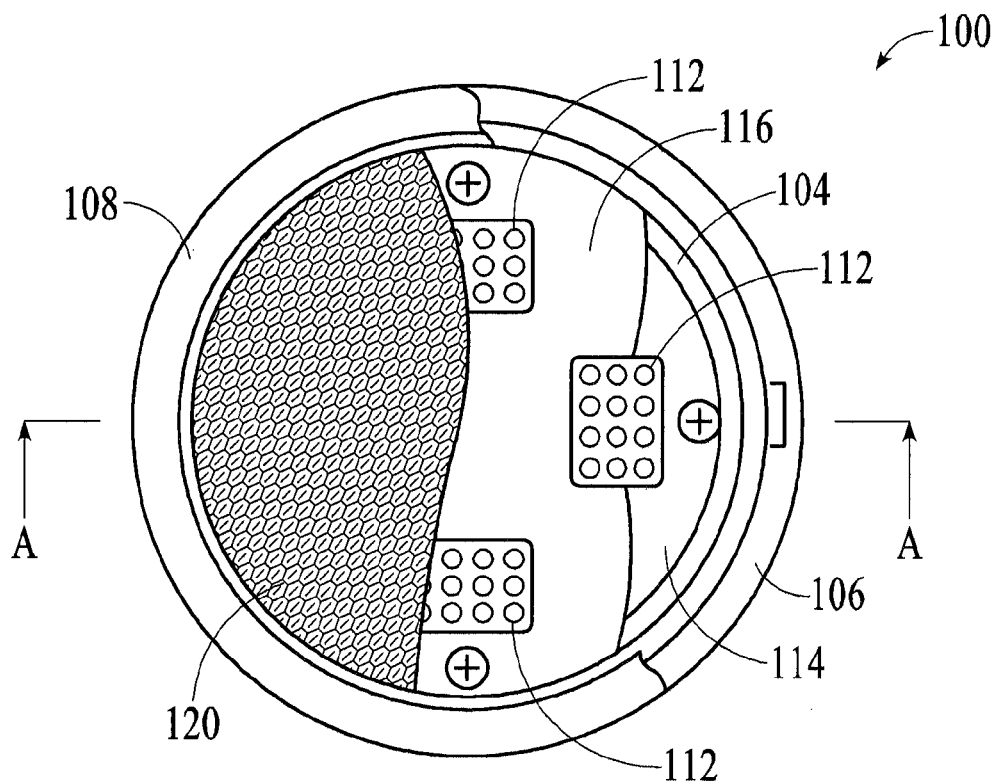
FIGS. 2A and 2B illustrate a solid-state light emitting device, according to some embodiments of the present invention.
Figure 2B:
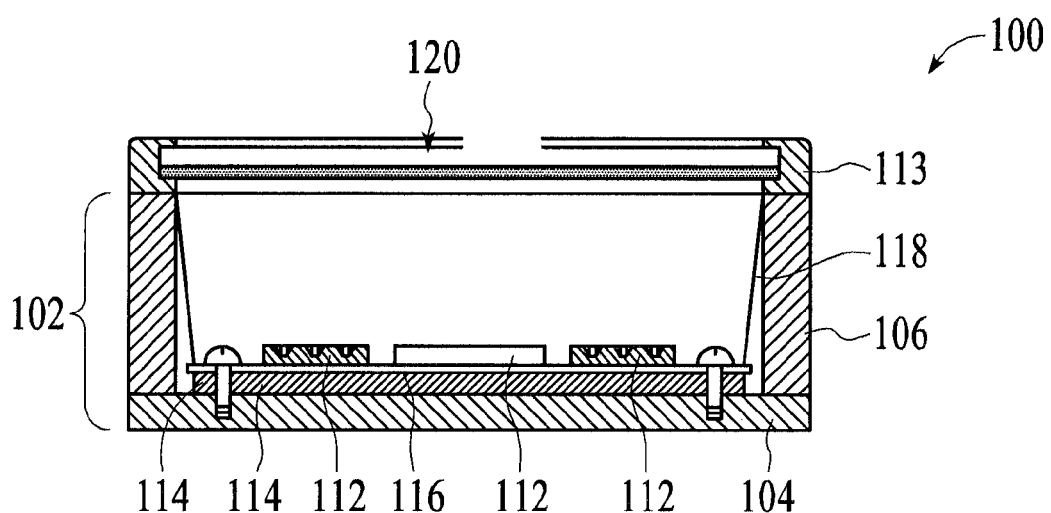

FIGS. 2A and 2B illustrates a solid-state light emitting device, according to some embodiments. The device 100 is configured to generate warm white light with a CCT (Correlated Color Temperature) of approximately 3000K and a luminous flux of approximately 1000 lumens and can be used as a part of a downlight or other lighting fixture. The device 100 comprises a hollow cylindrical body 102 composed of a circular disc-shaped base 104, a hollow cylindrical wall portion 106 and a detachable annular top 108. To aid in the dissipation of heat, the base 104 is preferably fabricated from aluminum, an alloy of aluminum or any material with a high thermal conductivity. The base 104 can be attached to the wall portion 106 by screws or bolts or by other fasteners or by means of an adhesive.

The device 100 further comprises a plurality (four in the example illustrated) of blue light emitting LEDs 112 (blue LEDs) that are mounted in thermal communication with a circular-shaped MCPCB (metal core printed circuit board) 114. The blue LEDs 112 can comprise a ceramic packaged array of twelve 0.4 W GaN-based (gallium nitride-based) blue LED chips that are configured as a rectangular array 3 rows by 4 columns.

To maximize the emission of light, the device 100 can further comprise light reflective surfaces 116,118 that respectively cover the face of the MCPCB 114 and the inner curved surface of the top 108. The device 100 further comprises a photoluminescent wavelength conversion component 120 that is operable to absorb a proportion of the blue light generated by the LEDs 112 and convert it to light of a different wavelength by a process of photoluminescence. The emission product of the device 100 comprises the combined light generated by the LEDs 112 and the photoluminescent wavelength conversion component 120. The wavelength conversion component is positioned remotely to the LEDs 112 and is spatially separated from the LEDs. In this patent specification "remotely" and "remote" means in a spaced or separated relationship. The wavelength conversion component 120 is configured to completely cover the housing opening such that all light emitted by the lamp passes through the component 120. As shown the wavelength conversion component 120 can be detachably mounted to the top of the wall portion 106 using the top 108 enabling the component and emission color of the lamp to be readily changed.

Figure 3:
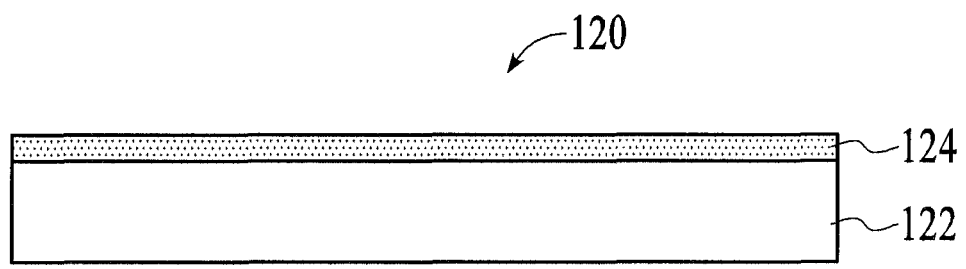
FIG. 3 illustrates the wavelength conversion components of an LED, according to some embodiments of the present invention.

FIG. 3 illustrates the wavelength conversion components of an LED, according to some embodiments. The wavelength conversion component 120 comprises a light transmissive substrate 122 and a wavelength conversion layer 124 containing one or more coated photoluminescent materials. The light transmissive substrate 122 can be any material that is substantially transmissive to light in a wavelength range from 380 nm to 740 nm and can comprise a light transmissive polymer such as a polycarbonate or acrylic or a glass such as a borosilicate glass. For the device 100, the substrate 122 comprises a planar circular disc of diameter $\phi=62$ mm and thickness t1 which is typically in the range of 0.5 mm to 3 mm. In some embodiments the substrate can comprise other geometries such as being convex or concave in form such as for example being dome shaped or cylindrical. The wavelength conversion layer 124 is deposited by thoroughly mixing the coated photoluminescent material in known proportions with a liquid light transmissive binder material to form a suspension and the resulting phosphor composition, "phosphor ink", deposited directly onto the substrate 122. The wavelength conversion layer can be deposited by screen printing, slot die coating, spin coating or doctor blading.

Figure 4:
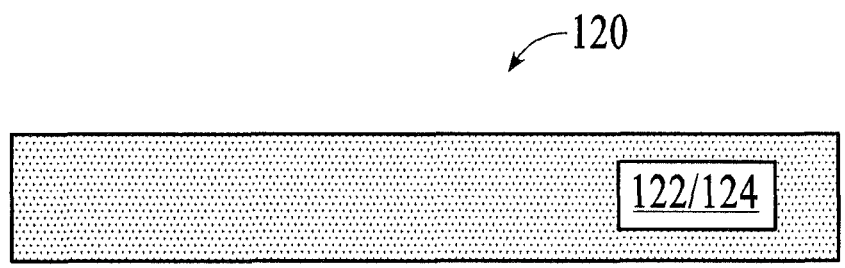
FIG. 4 illustrates a coated photoluminescent material as incorporated in the wavelength conversion component and homogenously distributed throughout the volume of the component, according to some embodiments of the present invention.

FIG. 4 illustrates a coated photoluminescent material as incorporated in the wavelength conversion component and homogenously distributed throughout the volume of the component, according to some embodiments. This can be considered an alternative to the embodiment shown in FIG. 3.

The coatings taught herein can be designed, for example, to enhance the reliability and/or performance of such devices that use the phosphor. Such coatings can result in a benefit such as, for example, physical and chemical improvements in phosphor performance and/or reliability. The coatings, for example, can increase photoluminescence, brightness, and/or color stability, as well as prevent or inhibit (i) degradation of the photoluminescent material itself or (ii) physical failure of the photoluminescent material, each of which can occur, for instance, at high temperatures and/or high humidities. In some embodiments, the coatings taught herein can be designed, for example, to reduce the reaction of phosphor chemicals with water that must pass through the coating to get to the phosphor surface. The coatings taught herein can do two things: (i) reduce the leaching of chemical from the phosphor to the surface of the phosphor by depositing either a basic or neutral coating as a primer material on the surface of the phosphor; and (ii) reduce entry of moisture from the ambient environment by depositing a less porous coating as a sealant material as a layer positioned between the primer coat and the ambient environment, which can be an outermost thickness adjacent to the environmental conditions.

The coatings can be designed to be multifunctional in order to inhibit degradation reactions that occur on the surface of a phosphor, degradation reactions that deleteriously affect performance and/or reliability of the phosphor. Such a coating can comprise at least two metal/semiconductor oxides, for example, each positioned to perform a function that relates at least to inhibiting a degradation reaction. The two metal/semiconductor oxides can include a primer material having a primer thickness on the surface of the photoluminescent material. The primer thickness can be selected to function in a manner that at least inhibits a leaching of a component of the photoluminescent material into the coating. A sealant material can be positioned between the primer layer and the environment in which the phosphor operates, where the sealant material can have thickness that functions to inhibit or prevent oxygen or moisture from diffusing through the coating and to the surface of the photoluminescent material and adding to the occurrence of degradation reactions. The sealant material can be positioned anywhere between the primer material and the operating environment such as, for example, an outermost thickness adjacent to the operating environment. Furthermore, in some embodiments, an additional one or more thicknesses of one or more other coating materials may be positioned between the sealant layer and the operating environment. On the other hand, the two metal/semiconductor oxides can also form a mixed composition material on the surface of the photoluminescent material. The mixed composition material having two metal/semiconductor oxides mixed together in a certain ratio to form a sealant material. In some embodiments, the mixed composition coating material further comprises a gradient thickness between the photoluminescent material and the outermost surface of the coating, the gradient thickness having a mixture of two metal/semiconductor oxides in a certain (varying) ratio—for example, from the inside to the outside of the coating the molar ratio of one metal/semiconductor oxide keeps increasing while the other keeps decreasing.

One of skill in the art will understand that any inorganic compound suitable for the teachings provided herein can be used. And, it has been found that there are select combinations that provide multi-functional coatings with a variety of advantages, such as an increase in photoluminescence; an increase in brightness; an increase in chemical and physical stability of the photoluminescent material and/or coating under operating conditions that may include: high temperatures and/or humidities; reliability in photoluminescence, brightness, and/or color stability; and the like, as further described herein.

The inorganic coating materials can include a composition comprising a metal, metal compound, metal oxide, or other ceramic, for example, known to one of skill to be at least potentially operable with the teachings provided herein. Examples of coating materials can include, for example, compounds comprising titanium, silicon, aluminum, boron, magnesium, zirconium, zinc, and oxides of the same, alone or in combination. In some embodiments, the coating materials can include titanium dioxide, silicon dioxide, aluminum oxide, boron oxide, magnesium oxide, zirconium oxide, zinc oxide, and the like. In some embodiments, $TiO_2$, $SiO_2$, $Al_2O_3$, $ZrO_2$, $ZnO$, $B_2O_3$, or a combination thereof. In some embodiments, the coatings taught herein can comprise silicon dioxide, titanium dioxide, aluminum oxide, zinc oxide, or boron oxide. And, in some embodiments, the coatings taught herein comprise silicon dioxide, titanium dioxide, aluminum oxide and/or a combination thereof.

In some embodiments, the coating for a photoluminescent material can include an oxide, a nitride, a boride, or other inorganic compound known to one of skill that is at least substantially, chemically inert in moisture at temperatures up to about 500° C. Such compounds should also have an index of refraction and thickness that does not substantially inhibit the photoemission from the photoluminescent material. As such, any such inorganic coating known to one of skill to be applicable as a coating with the methods taught herein, such as inorganic coatings that do not react with water under 500° C., could be applied as a protective layer to a phosphor, in some embodiments. In some embodiments, the teachings are directed to a coated phosphor having a coating that is at least substantially, chemically inert in moisture at temperatures up to about 500° C.

The coatings can be produced in discrete layers, or the coating process can be continuous, transitioning the coating components in a manner that creates a gradient-interface layer. In some embodiments, the primer thickness is a discrete layer, and the sealant thickness is a discrete layer. In some embodiments, the coating further comprises a gradient-interface thickness between the primer thickness and the outermost, sealant thickness, the gradient-interface thickness having a mixture of titanium dioxide and silicon dioxide. In some embodiments, the thickness of the coating can range from about 40 nm to about 500 nm. And, in some embodiments, the primer thickness is at least 20 nm, and the sealant thickness is at least 20 nm. In some embodiments, the coating further comprises a mixed composition layer between the photoluminescent material and the outer surface of the coating. This layer having a mixture of aluminum oxide and silicon dioxide mixed together in a certain ratio (said ratio may vary through the thickness of the layer). In some embodiments, the thickness of the coating can range from about 10 nm to about 500 nm. And, in some embodiments, the mixed composition layer thickness is preferably in the range of 10 nm to 100 nm.

The coated photoluminescent material can be any photoluminescent material that can benefit from the coatings taught herein. In some embodiments, the photoluminescent material comprises a phosphor. In some embodiments, the photoluminescent material is a silicate phosphor, an aluminate phosphor, a nitride phosphor, an oxynitride phosphor, a sulfide phosphor or an oxysulfide phosphor.

In some embodiments, the phosphor is a sulfide phosphor such as, for example, $(Ca, Sr, Ba)(Al, In, Ga)_2S_4$:Eu, $(Ca, Sr)S$:Eu, CaS:Eu, $(Zn, Cd)S$:Eu;Ag. In other embodiments, the phosphor is a nitride phosphor such as, for example, $(Ca,Sr,Ba)_2Si_5N_8$:Eu, $CaAlSiN_3$:Eu, $Ce(Ca, Sr, Ba)Si_7N_{10}$:Eu or $(Ca, Sr, Ba)SiN_2$:Eu. Other exemplary phosphors include $Ba^{2+}$, $Mg^{2+}$ co-doped $Sr_2SiO_4$, $(Y, Gd, Lu, Sc, Sm, Tb, Th, Ir, Sb, Bi)_3(Al, Ga)_5O_{12}$:Ce (with or without Pr), $YSiO_2N$:Ce, $Y_2Si_3O_3N_4$:Ce, $Gd_2Si_3O_3N_4$:Ce, $(Y, Gd, Tb, Lu)_3Al_{5-x}Si_xO_{12-x}$:Ce, $BaMgAl_{10}O_{17}$:Eu (with or without Mn), $SrAl_2O_4$:Eu, $Sr_4Al_4O_{25}$:Eu, $(Ca, Sr, Ba)Si_2N_2O_2$:Eu, $SrSi_2Al_2O_3N_2$:Eu, $(Ca, Sr, Ba)Si_2N_2O_2$:Eu, $(Ca, Sr, Ba)SiN_2$:Eu and $(Ca, Sr, Ba)SiO_4$:Eu. (See, for further details of these phosphors, Winkler et al., U.S. Patent Application Publ. No. 2010/0283076; Lee et al., Applied Surface Science 257, (2011) 8355-8369; both incorporated by reference herein.)

In some embodiments, the phosphor is an aluminum-silicate-based orange-red phosphor with mixed divalent and trivalent cations of formula $(Sr_{1-x-y}M_xT_y)_{3-m}Eu_m(Si_{1-z}Al_z)O_5$ where M is at least one of Ba, Mg and Zn, T is a trivalent metal, $0 \le x \le 0.4$, $0 \le y \le 0.4$, $0 \le z \le 0.2$ and $0.001 \le m \le 0.4$. (See, for further details of these phosphors, Liu et al., U.S. Patent Application Publ. No. 2008/0111472, incorporated by reference herein.)

In some embodiments, the phosphor is a YAG:Ce phosphor of formula $(Y, A)_3(Al, B)_5(O, C)_{12}$:$Ce^{3+}$ where A is selected from the group consisting of Tb, Gd, Sm, La, Sr, Ba, Ca, and where A substitutes for Y in amounts ranging from about 0.1 to 100 percent; B is selected from the group consisting of Si, Ge, B, P and Ga, and where B substitutes for Al in amounts ranging from about 0.1 to 100 percent; and, C is selected from the group consisting of F, Cl, N and S and where C substitutes for O in amounts ranging from about 0.1 to 100 percent. (See, for further details of these phosphors, Tao et al., U.S. Patent Application Publ. No. 2008/0138268, incorporated by reference herein.)

In some embodiments, the phosphor is a silicate-based yellow-green phosphor of formula $A_2SiO_4$:$Eu^{2+}$D where A is Sr, Ca, Ba, Mg, Zn and Cd; and D is a dopant selected from the group consisting of F, Cl, Br, I, P, S and N. (See, for further details of these phosphors, Wang et al., U.S. Pat. No. 7,311,858, incorporated by reference herein.)

In some embodiments, the phosphor is an aluminate-based blue phosphor of formula $(M_{1-x}Eu_x)_{2-z}Mg_zAl_yO_{[2+3/2)y}$, where M is at least one of Ba and Sr, $(0.05<x<0.5; 3 \le y \le 8;$ and $0.8 \le z \le 1<1.2)$ or $(0.2<x<0.5; 3 \le y \le 8;$ and $0.8 \le z \le 1<1.2)$ or $(0.05<x<0.5; 3 \le y \le 12;$ and $0.8 \le z \le 1<1.2)$ or $(0.2<x<0.5; 3 \le y \le 12;$ and $0.8 \le z \le 1<1.2)$ or $(0.05<x<0.5; 3 \le y \le 6;$ and $0.8 \le z \le 1.2)$. (See, for further details of these phosphors, Dong et al., U.S. Pat. No. 7,390,437, incorporated by reference herein.)

In some embodiments, the phosphor is a yellow phosphor of formula $(Gd_{1-x}A_x)(V_{1-y}B_y)(O_{4-z}C_z)$ where A is Bi, Tl, Y, La, Ce, Pr, Nd, Pm, Sm, Eu, Tb, Dy, Ho, Er, Tm, Yb, Lu; B is Ta, Nb, W, and Mo; C is N, F, Br and I; $0<x<0.2$; $0<y<0.1$; and $0<z<0.1$. (See, for further details of these phosphors, Li et al., U.S. Pat. No. 7,399,428, incorporated by reference herein.)

In some embodiments, the phosphor is a yellow phosphor of formula $A[Sr_x(M_1)_{1-x}]_zSiO_4 \cdot (1-a)[Sr_y(M_2)_{1-y}]_uSiO_5$:$Eu^{2+}D$ where $M_1$ and $M_2$ are at least one of a divalent metal such as Ba, Mg, Ca, and Zn; $0.6 \le a \le 0.85$; $0.3 \le x \le 0.6$; $0.8 \le y \le 1$; $1.5 \le z \le 2.5$; and $2.6 \le u \le 3.3$ and Eu and D are between 0.0001 and about 0.5; D is an anion selected form the group consisting of F, Cl, Br, S and N and at least some of D replaces oxygen in the host lattice. (See, for further details of these phosphors, Li et al., U.S. Pat. No. 7,922,937 incorporated by reference herein.)

In some embodiments, the phosphor is a silicate-based green phosphor of formula $(Sr,A_1)_x(Si,A_2)(O,A_3)_{2+x}$:$Eu^{2+}$ where $A_1$ is at least one divalent metal ion such as Mg, Ca, Ba, Zn or a combination of +1 and =3 ions; $A_2$ is a 3+, 4+ or 5+ cation including at least one of B, Al, Ga, C, Ge, P; $A_3$ is a 1−, 2− or 3− anion including F, Cl, and Br; and $1.5 \le x \le 2.5$. (See, for further details of these phosphors, Li et al., U.S. Patent Application Publ. No. 2009/0294731, incorporated by reference herein.)

In some embodiments, the phosphor is a nitride-based red phosphor of formula $M_aM_bB_c(N,D)$:$Eu^{2+}$ where $M_a$ is a divalent metal ion such as Mg, Ca, Sr, Ba; $M_b$ is trivalent metal such as Al, Ga, Bi, Y, La, Sm; $M_c$ is a tetravalent element such as Si, Ge, P1, and B; N is nitrogen; and D is a halogen such as F, Cl, or Br. (See, for further details of these phosphors, Liu et al., U.S. Patent Application Publ. No. 2009/0283721, incorporated by reference herein.)

In some embodiments, the phosphor is a silicate-based orange phosphor of formula $(Sr,A_1)_x(Si,A_2)(O,A_3)_{2+x}$:$Eu^{2+}$ where $A_1$ is at least one divalent metal ion such as Mg, Ca, Ba, Zn or a combination of +1 and =3 ions; $A_2$ is a 3+, 4+ or 5+ cation including at least one of B, Al, Ga, C, Ge, P; $A_3$ is a 1−, 2− or 3− anion including F, Cl, and Br; and $1.5 \le x \le 2.5$. (See, for further details of these phosphors, Cheng et al., U.S. Pat. No. 7,655,156, incorporated by reference herein.)

In some embodiments, the phosphor is a aluminate-based green phosphor of formula $M_{1-x}Eu_xMg_{1-y}Mn_yAl_zO_{[(x+y)+3z/2)}$ where $0.1<x<1.0$; $0.1<y<1.0$; $0.2<x+y<2.0$; and $2 \le z \le 14$. (See, for further details of these phosphors, Wang et al., U.S. Pat. No. 7,755,276, incorporated by reference herein.)

In some embodiments, the phosphors include a rare earth halide as a raw material source of not only the rare earth activator for the phosphor but also the halogen itself. While not wishing to be bound by any particular theory or mechanism of action, it is believed that the halogen may play a dual role in enhancing the properties of these phosphors by (i) reducing the oxygen content and (ii) causing an increase in photoluminescent intensity and spectral emission. The silicon dioxide coating provides an increase in the reliability of the phosphors.

In any of the embodiments taught herein, the effect of a variation in a stoichiometric ratio of components can be substantial or insubstantial. In some embodiments, for example, the term "about" can be used to describe a deviation in a relative component stoichiometric amount in an increment of 0.01, 0.001, 0.0001, depending on the component and the phosphor, where the deviation results in an insubstantial change in a targeted performance parameter of the phosphor. An "insubstantial change in a targeted performance parameter" can be used to refer to, for example, a change in a measure of brightness stability, color stability, or a combination thereof, between phosphors having the deviation between the phosphors. A change in CIE delta-x or CIE delta-y, for example, can be considered "insubstantial" in most cases, where the change is less than 0.005 on the index scale when taken at 1000 hrs, 85° C. and 85% humidity at 20 mA testing conditions. In some embodiments, a change in CIE can be considered substantial when it exceeds 0.005, 0.007, or 0.01 on the CIE index scale. A change in brightness can be considered insubstantial, in some embodiments, if the brightness drops by less than 10%, and in some embodiments, by less than 5%.

As such, a nitride phosphor can be coated with a plurality of metal/semiconductor oxides to produce an improved coated phosphor having enhanced reliability and, in some embodiments, also an enhanced performance. The coated nitride phosphor can comprise a nitride phosphor having a surface; and, a coating having at least two metal/semiconductor oxides. The two metal/semiconductor oxides can include a primer material having a primer thickness consisting of titanium dioxide on the surface of the photoluminescent material, and a sealant material between the primer material and environment, the sealant material having a sealant thickness consisting of silicon dioxide. The sealant material can be an outermost thickness that is adjacent to the operating environment. The titanium dioxide can at least inhibit a leaching of components from the photoluminescent material, and the silicon dioxide can at least inhibit a diffusion of water or oxygen into the photoluminescent material.

As such, a nitride phosphor can be coated with a plurality of metal/semiconductor oxides to produce an improved coated phosphor having enhanced reliability and, in some embodiments, also an enhanced performance. The coated nitride phosphor can comprise a nitride phosphor having a surface; and, a coating over the surface having at least two metal/semiconductor oxides. The two metal/semiconductor oxides can form a mixed composition layer comprising aluminum oxide and silicon oxide mixed together in a certain ratio on the surface of the photoluminescent material. The mixed composition layer acts as a sealant material between the photoluminescent material and environment. The sealant material can be an outermost thickness that is adjacent to the operating environment. The mixture of aluminum oxide and silicon oxide can at least inhibit a leaching of components from the photoluminescent material, and can at least inhibit a diffusion of water or oxygen into the photoluminescent material.

Any nitride-based phosphor can be coated with a coating comprising silicon dioxide as taught herein.

In some embodiments, a phosphor can have the formula M-A-B—(N,D):Z, where M, A, and B are three cationic metals and/or semimetals with divalent, trivalent, and tetravalent valences, respectively. N is nitrogen (a trivalent element), and D is a monovalent halogen that along with the nitrogen contributes to the anionic charge balance. In some embodiments, a phosphor can be referred to as a halogen-containing nitride. The element Z can serve as an activator in the host crystal, providing the photoluminescent centers, and Z may be a rare earth or transition metal element.

In some embodiments, the phosphor can be a nitride-based red phosphor. The phosphor may be described in a slightly different format, for example, to emphasize the approximate ratios of the constituent elements. Such a formula can take the form $M_m M_a M_b (N,D)_n : Z_z$, where (m+z):a:b:n can generally exemplify the ratio of about 1:1:1:3, although deviations from these integer values are contemplated. Examples of phosphors that can be used with the teachings herein include, but are not limited to, those taught in U.S. Patent Application Publ. Nos. 2009/0283721 and 2010/0308712, both incorporated by reference herein for details of these phosphors.

In some embodiments, the nitride phosphor can have the formula $M_m M_a M_b (N,D)_n : Z_z$; wherein, $M_m$ is M; $M_a$ is A; $M_b$ is B; $(N,D)_n$ is (N,D); and, $Z_z$ is Z. The stoichiometry of (m+z):a:b:n in these embodiments can be about 1:1:1:3.

In some embodiments, the nitride phosphor can have the formula $M_m M_a M_b D_{3w} N_{[(2/3)m+z+a+(4/3)b-w]} Z_z$; wherein, $M_m$ is M and is selected from the group consisting of Be, Mg, Ca, Sr, Ba, Zn, Cd, and Hg; $M_a$ is A and is selected from the group consisting of B, Al, Ga, In, Y, Sc, P, As, La, Sm, Sb, and Bi; $M_b$ is B selected from the group consisting of C, Si, Ge, Sn, Ni, Hf, Mo, W, Cr, Pb, Ti, and Zr; $D_{3w} N_{[(2/3)m+z+a+(4/3)b-w]}$ is (N,D), and D is selected from the group consisting of F, Cl, Br, and I; and, $Z_z$ is Z; and is selected from the group consisting of Eu, Ce, Mn, Tb, and Sm. The stoichiometry can be for example, $0.01 \leq m \leq 1.5$; $0.01 \leq a \leq 1.5$; $0.01 \leq b \leq 1.5$; $0.0001 \leq w \leq 0.6000$, and $0.0001 \leq z \leq 0.5000$.

Z is an activator comprising at least one or more of the rare earth elements and/or transition metal elements, and include Eu, Ce, Mn, Tb, and Sm. In some embodiments, the activator Z is europium. In some embodiments, the activator is divalent, and substitutes for the divalent metal $M_m$ in the crystal. The relative amounts of the activator and the divalent metal $M_m$ may be described by the molar relationship z/(m+z), which falls within the range of about 0.0001 to about 0.5. Keeping the amount of the activator within this range may substantially avoid the so-called quenching effect manifested by a decrease in emission intensity caused by an excessive concentration of the activator. The desired amount of the activator may change with the particular choice of activator. The activator Z can substitute for the divalent metal $M_m$ in the host crystal, in some embodiments. Moreover, the host material of the phosphor can contain substantially no oxygen (or at least, less than about 2 percent by weight).

In some embodiments, the nitride phosphor can have the formula $Ca_{1-x}AlSiN_3Eu_x:D$; wherein, x ranges from 0.0001 to 0.500 in increments of 0.0001 or 0.001, and D comprises fluorine, chlorine, bromine, or iodine. And, in some embodiments, D can be chlorine.

In some embodiments, the nitride phosphor can have the formula $CaAlSi(N_{1-x},D_x)_3:Eu^{2+}$; wherein, x ranges from 0.0001 to 0.500 in increments of 0.0001 or 0.001, and D comprises fluorine, chlorine, bromine, or iodine. And, in some embodiments, D can be chlorine. In some embodiments, the nitride phosphor has the formula $Ca_{0.993}AlSiN_3Eu_{0.007}Cl_{0.008}$.

It has been discovered that phosphors containing strontium have desired properties that, when coated using the teachings herein, can be particularly well-preserved. In some embodiments, the phosphors can have the formula $Ca_{0.2}Sr_{0.79}AlSiN_3Eu_{0.01}(F,Cl,Br)_{0.04+x}$, and the europium source can be, for example, $EuF_3$, $EuCl_3$ or $EuBr_3$. In some embodiments, the phosphors can have the formula $Ca_{0.2}Sr_{0.79}AlSiN_3Eu_{0.01}(F,Cl,Br)_x$, and the europium source can be $Eu_2O_3$, such that it provides no halogen. The phosphors in this family have been seen to emit red at a wavelength range of about 630 nm.

In some embodiments, the phosphors can be $Ca_{0.16}Sr_{0.82}AlSiN_3Eu_{0.02}(F,Cl)_{0.04+x}$ or $Ca_{0.16}Sr_{0.82}AlSiN_3Eu_{0.02}(F,Cl)_x$, and the composition may contain F if the europium source is $EuF_3$; or Cl if the europium source is $EuCl_3$; and, no halogen when the europium source is the oxide of europium ($Eu_2O_3$). The phosphors in this family have been seen to emit red at a wavelength of about 640 nm. The oxygen content of the 630 nm group of phosphors was about 1 weight percent, whereas that of the 640 nm group was about 1.35 weight percent.

The phosphors can change in composition and performance when the chlorine content, x, supplied by $NH_4Cl$ is increased above various halogen baseline levels. In some embodiments, the phosphors include $Ca_{0.2}Sr_{0.79}AlSiN_3Eu_{0.01}:F_{0.04}Cl_x$ when the europium source is $EuF_3$; $Ca_{0.2}Sr_{0.79}AlSiN_3Eu_{0.01}:Cl_{0.04+x}$ when the europium source is $EuCl_3$; and $Ca_{0.2}Sr_{0.79}AlSiN_3Eu_{0.01}:Cl_x$ when the europium source is $Eu_2O_3$.

In some embodiments, the nitride phosphor can have the formula $Ca_{0.2}Sr_{0.8-x}AlSiN_3Eu_x$, x ranging from about 0.005 to about 0.015 in increments of 0.001, and the formula optionally further comprising fluorine, chlorine, bromine, or iodine. In some embodiments, the nitride phosphor has the formula $Ca_{0.2}Sr_{0.795}AlSiN_3Eu_{0.005}Cl_{0.05}$, $Ca_{0.2}Sr_{0.797}AlSiN_3Eu_{0.003}Cl_{0.05}$, $Ca_{0.2}Sr_{0.798}AlSiN_3Eu_{0.002}:Cl_{0.05}$, $Ca_{0.2}Sr_{0.797}AlSiN_3Eu_{0.003}:Cl_{0.05}$, $Ca_{0.2}Sr_{0.796}AlSiN_3Eu_{0.004}:Cl_{0.05}$, $Ca_{0.2}Sr_{0.794}AlSiN_3Eu_{0.006}:Cl_{0.05}$, $Ca_{0.2}Sr_{0.793}AlSiN_3Eu_{0.007}:Cl_{0.05}$, $Ca_{0.2}Sr_{0.792}AlSiN_3Eu_{0.008}:Cl_{0.05}$, $Ca_{0.2}Sr_{0.791}AlSiN_3Eu_{0.009}:Cl_{0.05}$, $Ca_{0.2}Sr_{0.797}AlSiN_3Eu_{0.003}:Cl_{0.05}$, $Ca_{0.2}Sr_{0.796}AlSiN_3Eu_{0.004}:Cl_{0.05}$ or $Ca_{0.2}Sr_{0.7925}AlSiN_3Eu_{0.0075}:Cl_{0.05}$. In some embodiments, x ranges from about 0.0020 to about 0.0045.

In some embodiments, the photoluminescent material can be a coated, nitride-based red phosphor having the formula $Ca_{0.2}Sr_{0.795}AlSiN_3Eu_{0.005}Cl_{0.05}$, $Ca_{0.2}Sr_{0.797}AlSiN_3Eu_{0.003}Cl_{0.05}$, or $Ca_{0.993}AlSiN_3Eu_{0.007}Cl_{0.008}$. The coating can have a primer material thickness, comprising $TiO_2$ for example, on a surface of the phosphor, the thickness ranging from about 5 nm to about 400 nm, selectable in 5 nm increments. And, a sealant material thickness, comprising $SiO_2$ for example, of at least 20 nm and ranging from about 20 nm to about 200 nm selectable in 5 nm increments, can be positioned between the thickness of primer material and the operating environment, such as an outermost layer, for example, that is adjacent to the operating environment. In these embodiments, the intensity of photoluminescence from the photoluminescent material in an uncoated form can be the same, or substantially the same, as the intensity of photoluminescence from the photoluminescent material having the coating. Moreover, the thickness of the coating can be uniform, varying by less than about 2%, and the thickness of the primer material and sealant material can likewise be uniform. The thickness of a silicon dioxide layer can range, for example, from about 5 nm to about 100 nm, or from about 15 nm to about 20 nm in some embodiments.

In some embodiments, the photoluminescent material can be a coated, nitride-based red phosphor having the formula $Ca_{0.2}Sr_{0.795}AlSiN_3Eu_{0.005}Cl_{0.05}$, $Ca_{0.2}Sr_{0.797}AlSiN_3Eu_{0.003}Cl_{0.05}$, or $Ca_{0.993}AlSiN_3Eu_{0.007}Cl_{0.008}$. The coating can be a mixed composition material, comprising $Al_2O_3$ and $SiO_2$ for example, mixed together in a certain ratio on the surface of the phosphor. The thickness ranging from about 5 nm to about 500 nm, selectable in 5 nm increments, preferably in the range of 10 nm to 100 nm. The mixed composition layer acts as a sealant and is positioned between the phosphor material and the operating environment. In these embodiments, the intensity of photoluminescence from the photoluminescent material in an uncoated form can be the same, or substantially the same, as the intensity of photoluminescence from the photoluminescent material having the coating.

In some embodiments, the phosphors have the general formula $Ca_{0.98-x}Sr_xAlSiN_3Eu_{0.02}$. Calcium and strontium are both present, with the exceptions of the endpoints of the range of x. It has been seen that, as the strontium content "x" is increased from 0 to 1, the wavelength of the peak emission first increases slightly, meaning that the emission has the longest wavelength of about 660 nm at x=0.2, and then decreases gradually to about 637 nm at x=1. It has also been seen that the photoluminescence is generally about constant between about x=0 to about x=0.8, but then decreases substantially as the strontium content is increased from about x=0.8 to about x=0.9. Moreover, it's been seen that the emissions vary between about 658 nm to about 638 nm from x=0 to about x=0.82, respectively, and the x=0.82 strontium content samples are brighter as well when doped with halogen.

In some embodiments, the phosphor has the formula $Ca_{0.2}Sr_{0.74}AlSiM_{0.05}N_3Eu_{0.01}$, where M can be Ca, Sr, or Ba, respectively. An experiment compared a control phosphor, using M=0, to phosphors that vary M between Ca, Sr, and Ba. The europium source was $EuF_3$, and alkaline earth fluorides of Ca, Sr, and Ba were used to compare performances. It was discovered that (i) the peak emission wavelength shifts to longer wavelengths with the addition of the 5% alkaline earth metal; and, (ii) the order of the wavelength increase was Ca with the highest increase, followed by Sr, and finally Ba.

As can be seen, any of a variety of nitride phosphors can be used with the teachings provided herein. In some embodiments, the phosphor is a nitride-based red phosphor. In some embodiments, the phosphor can be $Ca_{1-x}AlSiN_3Eu_x$, where x can vary from about 0.005 to about 0.05. In some embodiments the phosphor can be $Ca_{0.03}AlSiM_{0.05}N_3Eu_{0.02}:F$, where M is Mg, Ca, Sr, and Ba. In some embodiments, the phosphor can be $Ca_{0.98}AlSiN_3Eu_{0.02}:F$, $Ca_{0.98}AlSiN_3Mg_{0.05}Eu_{0.02}:F$, $Ca_{0.98}AlSiN_3Ca_{0.05}Eu_{0.02}:F$, $Ca_{0.98}AlSiN_3Sr_{0.05}Eu_{0.02}:F$, and $Ca_{0.98}AlSiN_3Ba_{0.05}Eu_{0.02}:F$, and $Ca_{0.97}AlSiN_3Eu_{0.03}:F$, and $Ca_{0.97}AlSiN_3Eu_{0.03}F_x$, or the variation $Ca_{0.98}AlSiN_3Eu_0.02:F_x$, wherein x ranges from 0 to 0.15 in increments of 0.01. For example, x can be 0.04 or 0.15 in some embodiments.

In some embodiments, the phosphors can include, but are not limited to, $Ca_{0.2}Sr_{0.8}AlSiN_3Eu_{0.01}$, $Ca_{0.158}Sr_{0.815}AlSiN_3Eu_{0.023}$, or $Ca_{0.2}Sr_{0.79}AlSiN_3Eu_{0.01}:F$. And, in some embodiments, particularly novel phosphors can be selected from the group consisting of $Ca_{0.2}Sr_{0.795}AlSiN_3Eu_{0.005}:Cl_{0.05}$, $Ca_{0.2}Sr_{0.797}AlSiN_3Eu_{0.003}:Cl_{0.05}$, or $Ca_{0.993}AlSiN_3Eu_{0.007}:Cl_{0.008}$, and variations thereof.

Fluorine doping has been used to provide high photoluminescence intensity. In some embodiments, the phosphors can be $Ca_{0.2}Sr_{0.79}AlSiN_3Eu_{0.01}$ (emitting at about 630 nm), $Ca_{0.158}Sr_{0.815}AlSiN_3Eu_{0.023}$ (emitting at about 640 nm), and $Ca_{0.157}Sr_{0.808}AlSiN_3Eu_{0.035}$ (emitting at about 645 nm), where $EuF_3$ was used as the source of europium.

In further embodiments the phosphors may include nitride-based phosphor with a composition represented by the general formula $M'_yM''_2A_{5-x}D_xE_8:RE$. Here, M' is at least one of a 1+ cation, a 2+ cation, and a 3+ cation, and M'' is at least one of Mg, Ca, Sr, Ba, and Zn. A is at least one of Si and Ge. The element D replaces the A component substitutionally, where D is elected from the group consisting of column IIIB elements of the periodic table. In one embodiment, D is at least one of B, Al, and Ga. To charge compensate for the substitution of D for A, a modifier cation M' is added to the phosphor. M' is at least one of $Li^{1+}$, $Na^{1+}$, $K^{1+}$, $Sc^{3+}$, $Ca^{2+}$, and $Y^{3+}$, and this modifier cation is inserted into the phosphor interstitially, and not substitutionally. E is at least one of a 3− anion, a 2− anion, and a 1− anion, and may be at least one of $O^{2-}$, $N^{3-}$, $F^{1-}$, $Cl^{1-}$, $Br^{1-}$, and $I^{1-}$. The rare earth RE is at least one of Eu, Ce, Tb, Pr, and Mn; and x is $0.01 \leq x < 4$, and y times the valence of M' is equal to x. See, for further details of these phosphors, U.S. Provisional Application No. 61/673,191, incorporated by reference herein.

Coating a Photoluminescent Material

Degradation reactions occurring on photoluminescent materials can at least be inhibited using the coatings taught herein. Phosphors, for example, can be relatively more or less susceptible to degradation reactions. The red nitride phosphors, for example, $(Sr, Ca)AlSiN_3$:Eu are relatively stable in water and air at room temperature. This can make them more desirable for some uses than alkaline earth metal orthosilicate phosphors which, for example, are salts consisting of strong basic cations and weak acid anions that easily hydrolyze in water or react with water to form weak acid to show strong basic properties. Although the red nitride phosphors are much more stable, they still react with water or oxygen at high temperatures. A possible reason for this is that the Sr (Ca)—N bond can be replaced in the presence of water or oxygen with Sr (Ca)—O bonds which may be a more stable bond at the higher temperatures. As such, the use of inorganics as coatings on phosphors can be especially useful where the inorganic coatings do not react with water under 500° C.—silicon dioxide, aluminum oxide and the combination of these two are examples of such an inorganic coating.

The coated photoluminescent materials taught herein may possess superior stability to heat and moisture. The materials generally have superior stability, for example, to moisture and heat when compared to an uncoated photoluminescent material of the same composition. The superior stability of the coated photoluminescent material creates an improvement in the stability of the photoluminescence performance of the material, for example, in a light-emitting device (LED).

The coated material includes a photoluminescent material and a combination of inorganic materials, such as metal/semiconductor oxides, on a surface of the photoluminescent material. The thickness of the materials, alone or in combination, can, in some embodiments, range from about 5 nm to about 500 nm, from about 7 nm to about 450 nm, from about 10 nm to about 400 nm, from about 12 nm to about 450 nm, from about 15 nm to about 375 nm, from about 17 nm to about 350 nm, from about 20 nm to about 400 nm, from about 25 nm to about 500 nm, from about 5 nm to about 100 nm, from about 5 nm to about 75 nm, from about 5 nm to about 50 nm, from about 10 nm to about 50 nm, from about 5 nm to about 40 nm, from about 5 nm to about 30 nm, from about 5 nm to about 25 nm, from about 10 nm to about 20 nm, or any range therein. In some embodiments, the thickness of the coating can be about 5 nm, about 10 nm, about 20 nm, about 30 nm, about 40 nm, about 60 nm, about 80 nm, about 100 nm, about 120 nm, about 140 nm, about 160 nm, about 180 nm, about 200 nm, about 220 nm, about 240 nm, about 260 nm, about 280 nm, about 300 nm, about 320 nm, about 340 nm, about 360 nm, about 380 nm, about 400 nm, about 500 nm or any thickness therein in about 5 nm increments.

The coatings taught herein can be designed to have little-to-no effect on the light generation of the photoluminescent material. For example, an intensity and chromaticity of photoluminescence from the photoluminescent material in an uncoated form can be the same, or substantially the same, as the intensity of photoluminescence from the photoluminescent material having the coatings taught herein.

In some embodiments, the reliability of a performance parameter of the photoluminescent coated material can be greater than that of an uncoated photoluminescent material of the same composition, where the performance reliability can be compared between materials, for example, using a measure of brightness stability, color stability, or a combination thereof, between light-emitting devices comprising the different photoluminescent materials under comparison, the light-emitting devices otherwise being the same. In some embodiments, the photoluminescence, brightness stability or color stability is greater than other coated photoluminescent materials and, in some embodiments, greater than the uncoated material. The term "stability" can be used, for example, to refer to a resistance to a change or deterioration of a performance parameter over a period of time, such as the intensity of an output or consistency of an output of a light-emitting device the period of time. In some embodiments, the period of time can be, for example, 500 hrs, 600 hrs, 700 hrs, 800 hrs, 900 hrs, 1000 hrs, 1250 hrs, 1500 hrs, 1750 hrs, 2000 hrs, 3000 hrs, 4000 hrs, 5000 hrs, or 10,000 hrs under a set of operating or testing conditions used to compare the reliability of performance of the performance parameters within or between light-emitting devices.

The coatings can be deposited as uniform, or substantially uniform, thicknesses. Uniformity can be expressed using any measure known to one of skill, such as a statistical measure of data obtained from measurements on a coating taught herein. A material thickness can be considered "uniform," for example, where a variance in the uniformity of the thickness is considered to pose little-to-no effect on the ability of the material to protect the photoluminescent material as intended. A thickness can be considered "substantially uniform" where a variance in the uniformity of the thickness is considered to pose less than a substantial effect on the ability of the material to protect the photoluminescent material as intended, such that there is only a minor effect on a performance parameter, or performance reliability, and a user of the device would believe that the material thickness is enhancing the reliability of the device at least substantially as intended.

The term "substantial," in some embodiments, can be used to indicate a difference between what was sought and what was realized. In some embodiments, the difference can be more than 10%, 20%, 30%, or 35%, or any amount in-between, and the amount of the difference that may be considered insubstantial can depend on the measure under consideration. A change can be substantial, for example, where a performance characteristic was not met at least to a minimal extent sought. Likewise, the term "about," in some embodiments, can be used to indicate an amount or variable, where differences in measures of the amount or the variable can be considered insubstantial where a difference creates less than a substantial change in a related performance characteristic.

The uniformity of a coating can be measured and compared using a percent variation from the average thickness of the coating material that has been applied to the surface of the photoluminescent material. The percent variation in thickness can range, for example, from about 1% to about 33%, and any 1% increment therein, where in some embodiments, the minimum thickness is not lower than about 10 nm. In some embodiments, the thickness\varies by less than 2%. In some embodiments, the thickness varies by about 2%. In some embodiments, the thickness varies by about 2.0 to about 2.8%, or any 0.2% increment therebetween. In some embodiments, the thickness varies by less than 3%. In some embodiments, the thickness of varies by less than 4%. In some embodiments, the thickness varies by less than 5%. In some embodiments, the thickness varies by less than 10%. In some embodiments, the thickness varies by about 1.0 to about 10.0%, or any 0.5% increment therebetween. In some embodiments, the thickness varies by less than 20%. In some embodiments, the thickness varies by less than 30%. It should be appreciated that, where a percent variation exceeds an acceptable amount, the coating can also fall below an acceptable thickness, providing the photoluminescent material with a less-than-desirable barrier from moisture, for example.

An acceptable amount of variation will depend on the average thickness of the coating. In some embodiments, the acceptable amount of variation is that which results in a minimum thickness in the coating of greater than 80 nm. As such, the term "uniformity" can be used to refer to a variance in thickness measured using any method known to one of skill in the art, for example, electron microscopy. In some embodiments, the variance in thickness can be +/−1 nm, +/−2 nm, +/−3 nm, +/−4 nm, +/−5 nm, +/−10 nm, +/−15 nm, +/−20 nm, +/−25 nm, +/−30 nm, +/−35 nm, +/−40 nm, +/−45 nm, +/−50 nm, +/−60 nm, +/−70 nm, +/−80 nm, +/−90 nm, or +/−100 nm. In some embodiments, the variance is less than 30 nm, 20 nm, 10 nm, 5 nm, 3 nm, 2 nm, or 1 nm. In some embodiments, the variance can be +/−5%, +/−10%, +/−15%, +/−20%, +/−25%, +/−30%, or +/−35%. In some embodiments, the variance is less than 30%, 20%, 10%, 5%, 3%, 2%, or 1%.

In some embodiments, the size of the coated material is between about 2 μm and about 50 μm. In some embodiments, the size of the coated material is between about 5 μm and about 20 μm. The size of the coated material can be determined using any method known to one of skill. In some embodiments, particle size can be measured using a mean diameter, an average diameter, a maximum diameter, or a standard mesh known to one of skill. For example, a standard U.S. mesh of 500 will allow particles of up to 25 μm to pass through, whereas a standard U.S. mesh of 635 will allow particles of up to 20 μm to pass through.

In some embodiments, the method can include depositing a coating material for a time effective to deposit a uniform thickness of at least about 10 nm to about 50 nm on a photoluminescent material in a single coating cycle. In some embodiments, the method includes depositing a coating material on a surface of a photoluminescent material, where the silicon dioxide, aluminum oxide and the combination of them can be generated from a precursor of the material in a liquid phase. In some embodiments, the method includes forming a mixture of the precursors and a solvent, and gradually adding water to the mixture and heating the mixture at a temperature for a period of time to control (i) a rate of formation of the coating from the precursor and (ii) a rate of deposition of the coating material on the surface of the photoluminescent material during the time effective to deposit a uniform thickness. In some embodiments, the method includes forming a mixture of a photoluminescent material and the precursors in a solvent, and adjusting the pH of the mixture, heating the mixture at a certain temperature in the range from 35° C. to 100° C., mixing the mixture for a period of time in the range from 1 hour to 4 days at the desired temperature to allow for a deposition of coating material on a surface of the photoluminescent material; the temperature controls the rate of deposition of the coating material on the surface of the photoluminescent material during the time required to deposit a uniform thickness. In some embodiments, the solvent can comprise water; an alcohol, such as methanol, ethanol, propanol, isopropanol, butanol, pentanol, and hexanol; acetone; methyl ethyl ketone; other hydrocarbons; or mixtures thereof.

In some embodiments, a method for making a coated photoluminescent material, where the coating may be $SiO_2$, $TiO_2$ or $TiO_2/SiO_2$, can include the following steps: adding a photoluminescent material to a solvent to form a first mixture; adjusting the pH of the first mixture to prepare for a hydrolysis of a precursor of the coating material; and/or adding the precursor(s) to the first mixture to form a second mixture, where the amount of the precursor(s) added can be such that there is less than about 20% by weight of the coating material as compared to the weight of the photoluminescent material; water is added to the second mixture to promote hydrolysis of the precursor(s), where the hydrolysis rate is controlled by water addition rate and temperature; washing the coated photoluminescent material; purifying the coated photoluminescent material; drying the coated photoluminescent material; and calcining the coated photoluminescent material.

In other embodiments, a method for making mixed composition coating $Al_2O_3/SiO_2$ on a photoluminescent material can use a similar procedure to that given above for $TiO_2/SiO_2$, see Example 10. It can also include the following steps as shown in example 12: adding a photoluminescent material and oxide precursors to a solvent to form a first mixture; adjusting the pH of the mixture to prepare for hydrolysis of precursors of the coating material; mixing the mixture for a period of time at a certain temperature in the range from 35° C. to 100° C. to allow for a deposition of coating material on a surface of the photoluminescent material; washing the coated photoluminescent material; purifying the coated photoluminescent material; drying the coated photoluminescent material; and calcining the coated photoluminescent material.

It should be appreciated that any number of additional steps can be added to the process. For example, a coating process can include additional reaction steps, curing steps, drying steps, heat treating steps, and the like. For example, the process can include adding a mixture of water and solvent to form a third "curing" mixture; heating and/or reacting the third mixture for a second period of time; and, perhaps adding additional steps for a third period of time. In some embodiments, for example, the concentration of the photoluminescent material can be between about 0.0001 g/mL and about 10.0 g/mL.

In some embodiments, the precursor can be combined with a solvent to produce a mixture of a solvent and precursor that is then treated through a metered addition of the coating material. For example, to a 1 L flask with stir bar, heating mantle and reflux condenser, ethanol and a red nitride phosphor can be added in sequence to form a mixture, or a suspension of phosphor in the solvent. The percentage of phosphor to ethanol can range, for example, from about 0.001% to about 5.0%. Then, the mixture of ammonia water and ethanol can be added to the suspension. A water:silicon molar ratio (Rm) can range, for example, from about 5 to about 100. The mixture can be heated to a temperature in the range of about 65° C. to about 70° C. Silicon dioxide can be produced from an organic precursor such as, for example, tetraethoxysilane (TEOS). The mixture of TEOS:EtOH can be added dropwise at the above temperature. When the addition is complete, the suspension can be stirred further for about 0.5 to about 10 hours. The resultant mixture can be allowed to cool to room temperature and then filtered through a Buchner funnel. The solid material produced can be dried at a temperature in the range of about 80° C. to about 250° C. for a time of in the range of about 0.5 hours to about 48 hours in a vacuum oven, for example. The product can then be fired at, for example, a temperature of about 300° C. to 600° C. for a time of about 0.5 hours to about 10 hours.

In some embodiments, the precursors can be combined with a solvent to produce a mixture of a solvent and the pH value was adjusted for the mixture. Urea is added to release $NH_3$ slowly during the reaction when the mixture was heated at a desired temperature for a period of time. For example, to a 1 L flask equipped with a stirring blade, a heating mantle and a reflux condenser, a red nitride phosphor, aluminum precursor, silicon precursor, urea, and water can be added in sequence to form a mixture, or a suspension of phosphor in the solvent. The percentage of phosphor to water can range, for example, from about 0.001% to about 5.0%. The mixture is heated at a temperature ranging from 35° C. to 100° C. for a period of time ranging from 1.0 hour to 4 days. The resultant mixture can be allowed to cool to room temperature and then filtered through a Buchner funnel. The solid material produced can be dried at a temperature in the range of about 80° C. to about 250° C. for a time of about 0.5 hours to about 48 hours in a vacuum or drying oven, for example. The product can then be fired at, for example, a temperature of about 300° C. to 600° C. for a time of about 0.5 hours to about 10 hours.

It should be appreciated that the rate of deposition of the coating material on the surface can be controlled, to the level of an atomic layer deposition in some embodiments, using the teachings provided herein. The rate of deposition can be used in a selection of reaction time. One of skill in the art will appreciate that the selection of reaction time will depend, at least in part, on the process design, which can include the selection of precursor, reagent concentration, reagent addition rate, reaction temperature, and desired coating thickness. These process conditions determine the rate of deposition of the coating material on the surface of the photoluminescent material. In some embodiments, the coating material is deposited at a rate of between about 1 nm and about 100 nm per hour. In some embodiments, the coating material is deposited on the photoluminescent material at a rate of between about 5 nm and about 20 nm per hour. In some embodiments, the coating material is deposited on the photoluminescent material at a rate of between about 3 nm and about 18 nm per hour. In some embodiments, the coating material is deposited on the photoluminescent material at a rate of between about 6 nm and about 15 nm per hour. In some embodiments, the coating material is deposited on the photoluminescent material at a rate of between about 5 nm and about 7 nm per hour. In some embodiments, a second layer of silicon dioxide is deposited on the photoluminescent material.

As described herein, the concentration can be controlled through a metered addition of reactants. For example, the precursor can be diluted in a solvent and water is added at a controlled rate to control hydrolysis of the precursor. In some embodiments, the precursor can be TEOS dissolved in ethanol, and water can be added gradually through a metered addition to control the rate of hydrolysis of the precursor. In another example, a first mixture of the photoluminescent material and a solvent can be adjusted to a desired pH in preparation for a hydrolysis of the precursor, where the precursor is then to be added to the first mixture with the desired pH using a metered addition to control the rate of hydrolysis of the precursor.

It should be appreciated that the deposition of the coating material onto the phosphor can be done using liquid phase of gas phase processes. One of skill in the art will appreciate that any of a number of precursors can be used such as, for example, organic precursors, organometallic precursors, or inorganic salts.

Examples of such silicon dioxide precursors include, but are not limited to, silane ($SiH_4$), $SiH_2Cl_2$ (DCS), and tetraethoxysilane (TEOS). In some embodiments, the silicon precursor can be selected from the group consisting of silane, dimethylsilane, trimethylsilane, tetramethylsilane, diethylsilane, tetramethylorthosilicate (TMOS), tetraethoxysilane TEOS, tetra-n-propoxysilane (TPOS), methyltrimethoxysilane, diisobutyldimethoxysilane, octamethyltrisiloxane (OMTS), octamethylcyclotetrasiloxane (OMCTS), tetramethyldimethyldimethoxydisilane, tetramethylcyclotetrasiloxane (TOMCATS), DMDMOS, DEMS, methyl triethoxysilane (MTES), phenyldimethylsilane, phenylsilane, or any subgroup having any one or any combination thereof. One of skill in the art will appreciate that a precursor can be any precursor which can generate $SiO_2$ under basic conditions by reacting with water.

Examples of titanium dioxide precursors include, but are not limited to, titanium ethoxide ($Ti(EtO)_4$), titanium propoxide ($Ti(PrO)_4$), titanium isopropoxide ($Ti(i-PrO)_4$), titanium n-butoxide ($Ti(n-BuO)_4$), titanium iso-butoxide ($Ti(i-BuO)_4$, titanium tert-butoxide ($Ti(t-BuO)_4$), Tetrakis (diethylamino)titanium $Ti[(CH_3CH_2)_2N]_4$, $Ti(AcAc)_4$, $Ti(CH_3)_4$, $Ti(C_2H_5)_4$ or combinations thereof. In some embodiments, the precursor is an inorganic salt. In other embodiments, the inorganic salt is titanium oxide ($TiO_2$), titanium chloride ($TiCl_4$), titanium fluoride ($TiF_4$), titanium nitrate ($Ti(NO_3)_4$), titanium bromide ($TiBr_4$), titanium iodide ($TiI_4$) or titanium sulfate ($TiOSO_4$).

Examples of aluminum oxide precursors include, but are not limited to, aluminum nitrate [$Al(NO_3)_3$] and its hydrates, aluminum chloride ($AlCl_3$), aluminum bromide ($AlBr_3$), aluminum iodide ($AlI_3$), aluminum sulfate [$Al_2(SO_4)_3 \cdot xH_2O$], aluminum iso-propoxide [$Al-(iPrO)_3$], aluminum tri-n-butoxide [$Al-(n-BuO)_3$], aluminum tri-sec-butoxide [$Al-(sec-BuO)_3$], aluminum tri-tert-butoxide [$Al-(t-BuO)_3$], or aluminum acetylacetonate [$Al(AcAc)_3$). Examples of zinc oxide precursors include, but are not limited to, zinc chloride ($ZnCl_2$), zinc nitrate [$Zn(NO_3)_2$], zinc diethoxide [$Zn(EtO)_2$], zinc-acetylacetonate [$Zn(AcAc)_2$], and zinc acetate [$Zn(CH_3COO)_2$]. The above precursors are merely examples, and one of skill in the art will be able to locate and select any of a variety of metal oxide precursors for use with the teachings set-forth herein.

The metered addition of a reactant can be achieved using any method known to one of skill in the art. In some embodiments, the precursor can be added dropwise to a mixture containing conditions that are hydrolytic to the precursor. In some embodiments, the precursor can be continuously injected with a fine needle. In some embodiments, a hydrolytic agent, such as water or an organic solvent containing water, can be added dropwise to a mixture of a precursor and a solvent. For example, a method can include forming a mixture of the precursor and a solvent, and gradually adding water to the mixture to control (i) a rate of formation of the oxides from the precursor and (ii) a rate of deposition of the oxides on the surface of the photoluminescent material during the time required to deposit the uniform layer.

In some embodiments, the precursor can be added at a rate of between about 0.0001 mL/min to 200 mL/min. In some embodiments, the precursor can be added at a rate of between about 2 mL/min to 30 mL/min. In some embodiments, the precursor can be added at a rate of between about 6 mL/min to 20 mL/min. In some embodiments, the precursor can be added at a rate of between about 5 mL/min to 60 mL/min.

Control of the rate of deposition provides control of the reaction time for depositing a desired thickness of a silicon dioxide layer on a surface of a photoluminescent material. Reaction times can range, for example, from 0.1 hrs to 10 days, from 1.0 hr to 7 days, from 2 hrs to 5 days, from 1.0 hr to 4 days, from 0.5 hrs to 3 days, from 0.5 hrs to 2 days, from 0.5 hrs to 1 day, from 1.0 hr to 18 hrs, from 0.5 hrs to 12 hrs, from 0.5 hrs to 8 hrs, from 1.0 hrs to 6 hrs, from 0.5 hrs to 4 hrs, from 0.5 hrs to 2 hrs, or any range therein.

In some embodiments, a reaction mixture can be heated to a temperature that ranges from about 30° C. to the boiling point of the solvent +/−10° C. In some embodiments, the reaction mixture can be heated to a temperature of between about 40° C. and about 80° C. It should be appreciated that the terms "react," "reacting," and "reaction" can be used in some embodiments to refer to, for example, hydrolyzing a precursor to form an oxide, depositing a layer of the an oxide/oxides on a surface of a photoluminescent material, and the like, where a change in bonding between molecular structures can occur during that step in the process.

In some embodiments, the coated photoluminescent material can be purified. For example, the coated photoluminescent material can be purified by washing with a solvent, followed by a filtration. In some embodiments, the coated photoluminescent material can be purified by centrifugation, sedimentation and decanting. Any method of purification known to one of skill can be used.

In some embodiments, the coated photoluminescent material can be dried at a temperature of between about 60° C. and about 250° C. In some embodiments, the coated photoluminescent material can be dried at a temperature of between about 85° C. and about 200° C. And, in some embodiments, the drying can include vacuum-drying, freeze-drying, or critical point drying. In some embodiments, the coated photoluminescent material can be calcined at a temperature between about 200° C. and about 600° C.

Several methods for making the coated photoluminescent material are provided herein. The photoluminescent material is added to a solvent to form a first mixture. The precursor(s) is(are) added at a controlled rate to the first mixture to form a second mixture, where the amount of the precursor added is less than about 10% by weight of the photoluminescent material. The second mixture is heated for a period of time and then reacted for a second period of time. The coated photoluminescent material is purified, dried and then calcined. In some embodiments, the second mixture is heated at a temperature of between about 40° C. and about 80° C. and for a period of time between about 0.1 hours and about 10 days. In some embodiments, the photoluminescent material, oxide coating precursors and urea are added to a flask in a solvent to form a mixture. The pH value is adjusted to close to neutral (6 to 8) for the mixture. Urea is added as an ammonia release reagent to change the pH of the solution slowly at a first temperature. The mixture is then heated at a second temperature for a period of time. The coated photoluminescent material is purified, dried and then calcined. In some embodiments, the second mixture is heated at a temperature of between about 35° C. and 100° C. and for a period of time between about 1 hour and about 4 days, preferably 10 hours to 30 hours.

The method of making a coating taught herein can comprise depositing (i) a thickness of a primer metal oxide on a surface of a photoluminescent material and (ii) a thickness of a sealant metal oxide providing an outermost surface for the photoluminescent material. The primer metal oxide can be generated from a precursor of the primer metal oxide in a liquid phase. In some embodiments, the method of making a coating taught herein can comprise depositing two metal oxides together on a photoluminescent material. The two metal oxides mixed together with a varying metal ratio from inside to outside of the coating to form a mixed composition layer to block components of the phosphor material from diffusing out and/or preventing oxygen and moisture from diffusing into the phosphor material.

The depositing of the thickness of the primer metal oxide can occur for a time effective to deposit the thickness of the primer metal oxide to a thickness of at least about 20 nm on the surface of the photoluminescent material in a single coating cycle, and the primer metal oxide is deposited on the surface at a rate of between about 1 nm and about 100 nm per hour. And, the depositing of the thickness of the sealant metal oxide occurs for a time effective to deposit the thickness of the sealant metal oxide to a thickness of at least about 20 nm to provide the outermost surface of the photoluminescent material in a single coating cycle. The sealant metal oxide can be deposited on the surface, for example, at a rate of between about 1 nm and about 100 nm per hour.

In some embodiments, the method can further comprise forming a gradient-interface thickness between the primer thickness and the outermost, sealant thickness, the gradient-interface thickness having a mixture of the primer metal oxide and the sealant metal oxide.

In some embodiments, the method can further comprise forming a mixed composition thickness between the photoluminescent material and the outermost surface of the coating. The mixed composition thickness having a mixture of the two metal oxides mixed together to form a mixed composition sealant layer.

The coatings provided herein can include a primer thickness, a sealant thickness, and a gradient-interface or a mixed composition thickness. In fact, there can be additional layers, and a gradient-interface can be formed between those layers. The gradient-interface comprises a combination of coating materials having a composition and thickness that is determined by the coating process parameters used to produce the coating. For example, a first coating material can be deposited at a first rate, and before the depositing is completed, a second coating material begins its deposition in combination with the first coating material at a second rate. The first rate can be ramped-down as quickly or as slowly as desired after the onset of the deposition of the second coating material. Likewise, the onset, or ramping-up, of the rate of addition of the second coating material can be as fast or as slow as desired. In fact, a ramp-up or ramp-down can be gradual, immediate, or a cycling of desired rates to get a desired gradient-interface. Moreover, the first coating material and the second coating material can be deposited without a gradient-interface by forming discrete layers. In these embodiments, a first coating material forms a first layer in a first coating process, and a second coating material forms a second layer in a second coating process to form the second layer discrete from the first layer. And, in some embodiments, the depositing can include forming the primer thickness as a discrete layer, and forming the sealant thickness as a discrete layer. Furthermore, in some embodiments, the first coating material and a second coating material can be deposited together to form a mixed composition layer of mixed together materials in a certain ratio on the surface of the photoluminescent material.

In some embodiments, the depositing can comprise forming a mixture of the precursor and a solvent; and, gradually adding water to the mixture and heating the mixture to a first temperature (for example, 40-45° C.) and holding the mixture at said first temperature for a period of time to control (i) a rate of formation of the primer metal oxide or sealant metal oxide from the precursor, and (ii) a rate of deposition of the primer metal oxide or sealant metal oxide. In some embodiments, the depositing can comprise adding a photoluminescent material to a solvent to form a first mixture; adjusting the pH of the first mixture to prepare for a hydrolysis of a precursor of the primer metal oxide or sealant metal oxide; adding the precursor of the primer metal oxide or sealant metal oxide to the first mixture to form a second mixture, where the precursor can be added at a controlled rate to the first mixture, and the amount of the precursor added can be such that there is less than about 20% by weight of the primer metal oxide or sealant metal oxide as compared to the weight of the photoluminescent material; mixing the second mixture and heating the second mixture to a second temperature (for example, 50-55° C.) and holding the second mixture at said second temperature for a period of time to allow for a deposition of the primer metal oxide on a surface of the photoluminescent material or a sealant metal oxide as an outermost sealant thickness; washing the coated photoluminescent material; purifying the coated photoluminescent material; drying the coated photoluminescent material; and, calcining the coated photoluminescent material.

In some embodiments, a coated photoluminescent material is produced using a method taught herein, and an intensity of photoluminescence from the photoluminescent material in an uncoated form can be the same, or substantially the same, as the photoluminescent material having the coating. In some embodiments, the photoluminescence and/or brightness of the photoluminescent material surprisingly increases, producing an enhancement in performance. In some embodiments, an enhancement in performance can be accompanied by an increase in reliability, providing an unexpected improvement in both performance and reliability from the phosphor material.

The teachings provided herein can be used to improve the performance and/or reliability in a light emitting device. The light-emitting device can comprise a solid state light emitter; and, a coated photoluminescent material as taught herein. In some embodiments, the light-emitting device comprises a silicate phosphor, a nitride phosphor, or an aluminate phosphor.

Without intending to be limited to any theory or mechanism of action, the following examples are provided to further illustrate the teachings presented herein. It should be appreciated that there are several variations contemplated within the ordinary skill in the art, and that the examples are not intended to be construed as providing limitations to the claims.

Example 1

Coating a Silicate Yellow Phosphor with a Coating Including $TiO_2$ and $SiO_2$

To a glass reactor with heating mantle and stirring set up under an evacuation hood, isopropyl alcohol (IPA, 750 mL) was added. Then, a silicate yellow phosphor (Yellow 1-$(Sr_{2-y-z}Ba_xMg_yEu_z)SiO_4Cl_{0.12}$) (50 g) was added with stirring to form a suspension. To this suspension, titanium n-butoxide (3.40 mL) was added by syringe. After this addition, the suspension was stirred for 0.5 hours at room temperature. The mixture of de-ionic water (water purified by a resin ion exchange system for removal of metal ions) and isopropyl alcohol (7.5 mL: 15 mL) was then added dropwise to the suspension. After this addition, the mixture of TEOS and isopropyl alcohol (2.26 g: 5 mL) was added dropwise to the suspension. The resultant suspension was heated to 40° C. and kept at temperature for 0.5 hours. It was cooled to room temperature and stirred for a further 20 hours at room temperature. The suspension was heated to 60° C. for 1.5 hours. It was then stirred for 5 hours further at room temperature. The stirring assembly was removed. The mixture stayed under the evacuation hood for a further 10 minutes. The top layer of the solution was decanted and more IPA was added and filtered through the Büchner funnel. The solid in the Buchner funnel was washed twice with IPA. The solid in the funnel was dried in a vacuum oven at 110° C. for 1.0 hour. After drying, the coated phosphor was fired in a box furnace at 350° C. for 1.0 hour. The preferred thickness for the combination coating is in the range of 20 nm to 100 nm.

Example 2

Comparing the Performances of Uncoated and Coated Silicate Yellow Phosphors, the Coatings Including $TiO_2$ and $SiO_2$ Alone and in Combination Performance was compared with regard to relative photoluminescence and brightness. Photoluminescence was measured between uncoated and coated yellow phosphors created using the process of Example 1. Powdered phosphor was put into a shallow dish and tampered down to make a flat surface. The phosphor was then excited by an external light source of a blue light-emitting diode (LED). An emission spectrum from the uncoated and coated yellow phosphor materials was measured using a spectrometer.

Figure 5A:
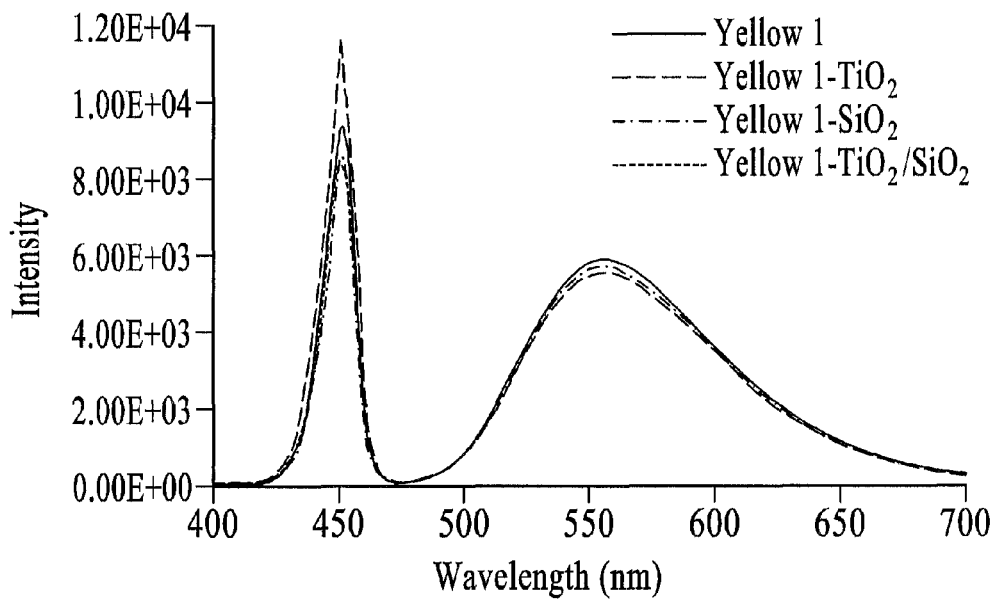
FIGS. 5A and 5B show the photoluminescence emission spectrum of two different yellow phosphors, comparing the uncoated and coated yellow phosphors, according to some embodiments of the present invention.
Figure 5B:
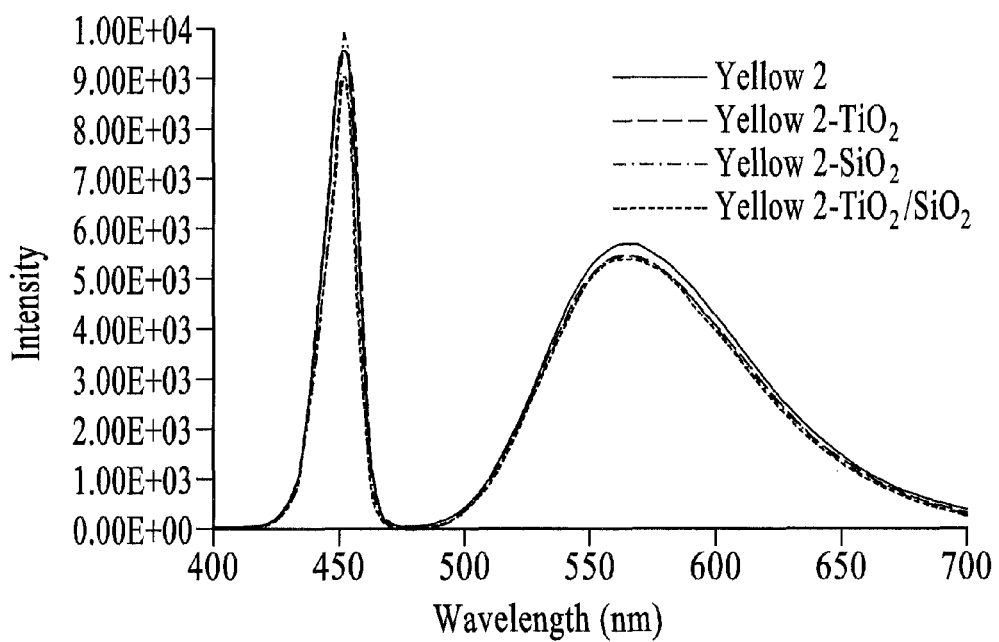

FIGS. 5A and 5B show the photoluminescence emission spectrum of two different yellow phosphors—Yellow 1 and Yellow 2—comparing the uncoated and coated yellow phosphors, according to some embodiments. FIGS. 5A and 5B show that both $TiO_2$ and $SiO_2$ coatings cause a loss of photoluminescence from each phosphor after applying either the $TiO_2$ or $SiO_2$ as a coating layer. However, the multilayer coating having a primer layer of $TiO_2$ and a sealant layer of $SiO_2$ does not appear to create any loss in photoluminescence—the plot for the multilayer coating overlays the plot for uncoated phosphor in the figures.

Table 1 shows the luminescence results depicted in FIGS. 5A and 5B. Table 1 also shows that the CIE does not change significantly when coating the yellow phosphor with either of the coating materials, alone or in the combination of materials.

TABLE 1

| Sample | Emission (nm) | PL (%) | CIE x | CIE y |
| --- | --- | --- | --- | --- |
| Yellow 1 | 555.83 | 100 | 0.4265 | 0.5534 |
| Yellow 1-$TiO_2$ | 555.91 | 94.4 | 0.4261 | 0.5535 |
| Yellow 1-$SiO_2$ | 555.76 | 97.0 | 0.4261 | 0.5536 |
| Yellow 1-$TiO_2/SiO_2$ | 555.90 | 100 | 0.4266 | 0.5533 |
| Yellow 2 | 561.49 | 100 | 0.4461 | 0.5380 |
| Yellow 2-$TiO_2$ | 561.51 | 95.0 | 0.4454 | 0.5387 |
| Yellow 2-$SiO_2$ | 561.54 | 95.8 | 0.4460 | 0.5382 |
| Yellow 2-$TiO_2/SiO_2$ | 561.54 | 97.3 | 0.4459 | 0.5383 |

Brightness was measured to compare the performances between the uncoated and coated phosphors. Powdered yellow phosphor was mixed with a light-transmitting binder, typically silicone, at an effective ratio to create a gel for the brightness measurements, where an effective ratio was about 9% silicone in this study. The gel for an uncoated phosphor was put into a blue LED chip, and the CIE was adjusted to about 0.3000 to serve as a standard for brightness. The brightness for the standard was then recorded at the fixed CIE. Gels for each of the coated phosphors were then prepared and tested against the standard to determine if there was a brightness change, during which the CIE for each of the gels in the blue LED chip were adjusted to the fixed CIE of about 0.3000 to compare the brightness levels between the uncoated and coated phosphors.

Table 2 shows a brightness comparison between the uncoated and coated yellow phosphors. It can be seen that the standard was 100% brightness. Again, the combination coating having $TiO_2$ as a primer layer and $SiO_2$ as a sealant layer outperformed the individual coating materials.

TABLE 2

| Sample | CIE x | CIE y | % in silicone | Brightness |
|---|---|---|---|---|
| Yellow 1 | 0.2957 | 0.3000 | 9.00 | 100.0% |
| Yellow 1-TiO$_2$ | 0.2948 | 0.3001 | 9.00 | 97.9% |
| Yellow 1-SiO$_2$ | 0.2933 | 0.3001 | 9.00 | 97.1% |
| Yellow 1-TiO$_2$/SiO$_2$ | 0.2917 | 0.3001 | 9.00 | 98.9% |
| Yellow 2 | 0.3097 | 0.3000 | 9.00 | 100.0% |
| Yellow 2-TiO$_2$ | 0.3091 | 0.3001 | 9.00 | 97.1% |
| Yellow 2-SiO$_2$ | 0.3080 | 0.3001 | 9.00 | 97.9% |
| Yellow 2-TiO$_2$/SiO$_2$ | 0.3060 | 0.3002 | 9.00 | 98.0% |

Example 3

Testing for Water Uptake at Room Temperature

A water absorption test was performed to determine the ability of the uncoated and coated phosphors to take-up water at room temperature. Each of the samples was dried in an oven at 250° C. for 2 hours and then allowed to cool in a dry dessicator to room temperature. The dried samples were then weighed to an accuracy of 0.0001 mg. The samples were then put into an environment of 100% humidity using a dessicator having an ammonium chloride solution for 3 days (72 hours). The samples were then re-weighed for weight gain and the weight increase was compared between the uncoated and coated samples.

Table 3 shows the results of the water absorption test at room temperature. It can be seen that, at room temperature, the TiO$_2$ coating absorbed much more moisture than the SiO$_2$ coated phosphor or the combination coating having the TiO$_2$ primer layer and SiO$_2$ sealant layer. The SiO$_2$ coating and the combination coating blocked absorption of water when compared to the uncoated phosphor, whereas the TiO$_2$ absorbed about 100× more moisture.

TABLE 3

| Name | Yellow 1 | Yellow 1-SiO$_2$ | Yellow 1-TiO$_2$ | Yellow 1-TiO$_2$/SiO$_2$ |
|---|---|---|---|---|
| Weight Change (%) | 0.23 | 0.12 | 2.63 | 0.18 |

| Name | Yellow 2 | Yellow 2-SiO$_2$ | Yellow 2-TiO$_2$ | Yellow 2-TiO$_2$/SiO$_2$ |
|---|---|---|---|---|
| Weight Change (%) | 0.14 | 0.21 | 3.61 | 0.15 |

Example 4

Reliability Testing of Yellow Phosphors

Powdered yellow phosphor was mixed with a light-transmitting binder, such as silicone, at an effective ratio to form a gel. The mixed gel was put into a blue LED chip and cured. The operational current for the LED was 150 mA at 3.5V for each LED. The packaged device was placed in an oven at a temperature of 85° C. and 85% humidity and operated continuously. The device was removed at various time intervals from the oven and emission spectra were measured by excitation with blue light. Color change and brightness were measured.

Figure 6:
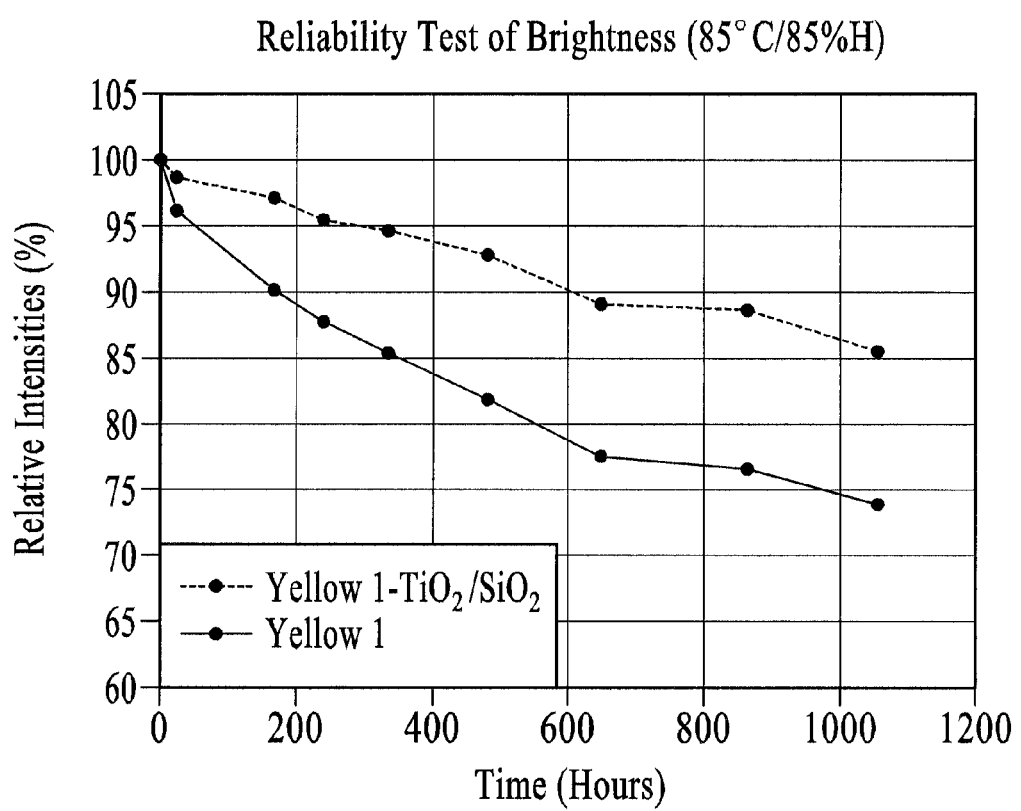
FIG. 6 shows the relative brightness intensities at time intervals of up to about 1100 hrs for coated and uncoated yellow silicate phosphor, according to some embodiments.

FIG. 6 shows the relative brightness intensities at time intervals of up to about 1100 hrs for a coated and uncoated yellow silicate phosphor, according to some embodiments. As shown in FIG. 6, a high level of brightness stability was observed for the light-emitting device having a phosphor with the combination coating of a TiO$_2$ primer layer and SiO$_2$ sealant layer when compared to the uncoated phosphor.

Figure 7A:
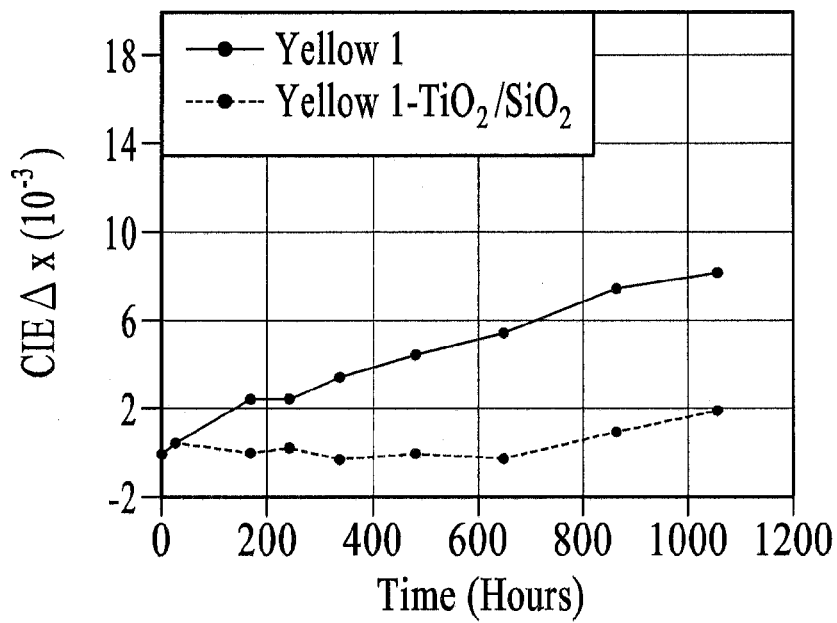
FIGS. 7A and 7B show the relative chromaticity shift (CIE delta-x and CIE delta-y) at time intervals of up to 1100 hrs for coated and uncoated yellow silicate phosphor, according to some embodiments of the present invention.
Figure 7B:
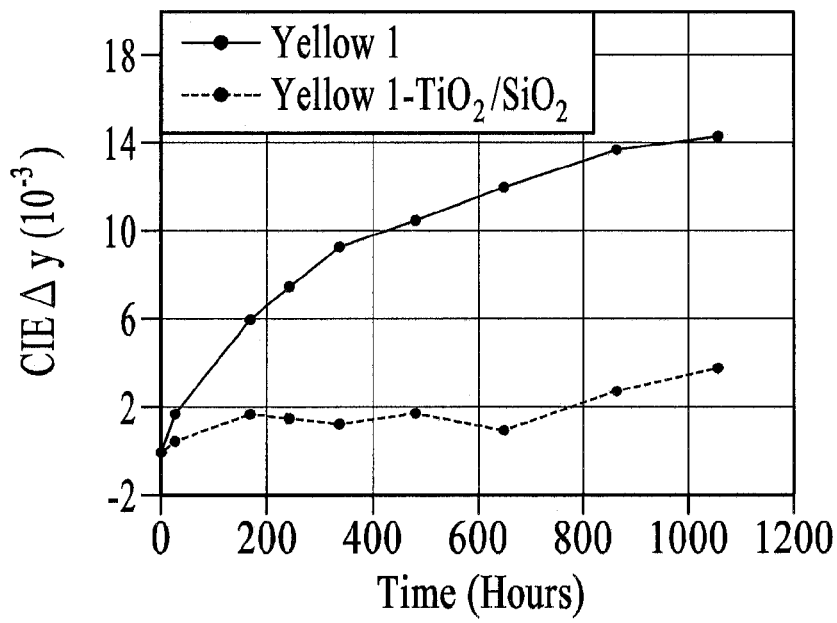

FIGS. 7A and 7B show the relative chromaticity shift (CIE delta-x and CIE delta-y) at time intervals of up to about 1100 hrs for a yellow silicate phosphor, according to some embodiments. As shown in FIGS. 7A and 7B, a high color stability was observed for the light-emitting device having a phosphor with the combination coating of a TiO$_2$ primer layer and SiO$_2$ sealant layer when compared to the uncoated phosphor.

Example 5

Coating a Silicate Orange Phosphor with a Coating Including TiO$_2$ and SiO$_2$

To a glass reactor with heating mantle and stirring set up under an evacuation hood, isopropyl alcohol (IPA, 750 mL) was added. Then orange phosphor (50 g) (Orange 1—(Sr$_{2.94}$Ba$_{0.06}$Eu$_{0.06}$)SiO$_5$F$_{0.18}$) was added while stirring to form a suspension. To this suspension, titanium n-butoxide (3.40 mL) was then added by syringe. After this addition, the suspension was then stirred for 0.5 hours at room temperature. The mixture of de-ionic water and isopropyl alcohol (7.5 mL: 15 mL) was added dropwise to this suspension. After this addition, the mixture of TEOS and isopropyl alcohol (2.26 g: 5 mL) was then added dropwise to above suspension. The resultant suspension was heated to 40° C. and then held at temperature for 0.5 hours. The suspension was then cooled to room temperature and stirred for a further 20 hours at room temperature. The suspension was then heated to 60~65° C. and held at temperature for 2.0 hours. The suspension was then stirred for 5 hours further at room temperature. The stirring assembly was removed. The mixture was kept under the evacuation hood for 10 minutes further. The top layer of the solution was decanted and more IPA was added and filtered through a Büchner funnel. The solid in the funnel was washed twice with IPA. The solid in the funnel was dried in a vacuum oven at 110° C. for 1.0 hour. After drying, the coated phosphor was fired in a box furnace at 350° C. for 1.0 hour.

Example 6

Comparing the Performances of an Uncoated and Coated Silicate Orange Phosphor, the Coating Including TiO$_2$ and SiO$_2$ in Combination Performance was compared with regard to relative photoluminescence and CIE. Photoluminescence was measured between an uncoated and coated silicate orange phosphor created using the process of Example 5. Powdered phosphor was put into a shallow dish and tampered down to make a flat surface. The phosphor was then excited by an external light source of a blue light-emitting diode (LED). An emission spectrum from the uncoated and coated silicate orange phosphor material was measured using a spectrometer.

Figure 8:
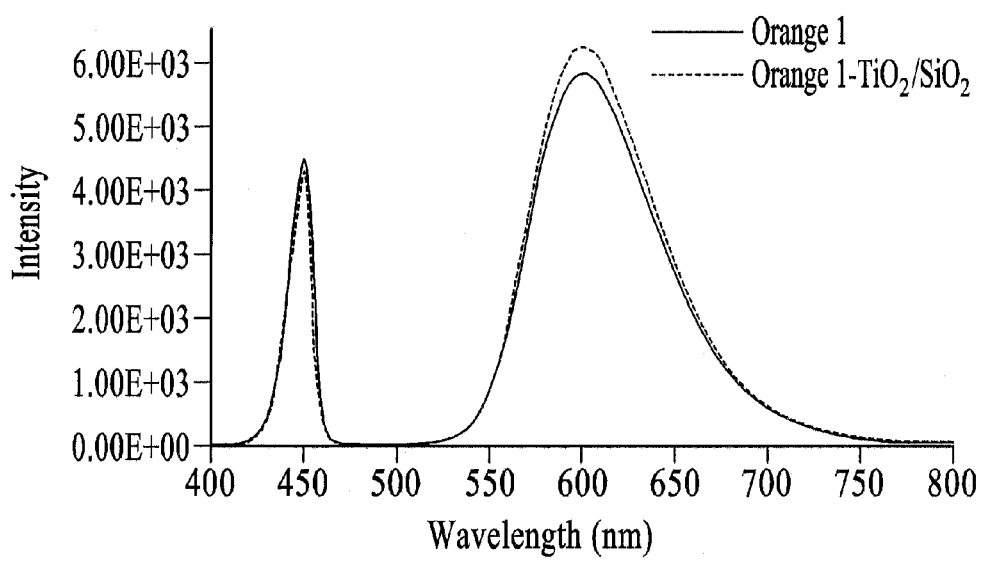
FIG. 8 shows the photoluminescence emission spectra of a silicate orange phosphor, comparing the uncoated and coated silicate orange phosphor, according to some embodiments of the present invention.

FIG. 8 shows the photoluminescence emission spectra of a silicate orange phosphor, comparing the uncoated and coated silicate orange phosphor, according to some embodiments of the present invention. FIG. 8 shows that the combination coating having a primer layer of TiO$_2$ and a sealant layer of SiO$_2$ does not appear to create any loss in photoluminescence. Actually, and surprisingly, there appears to be a significant increase in photoluminescence.

Table 4 again shows the photoluminescence results depicted in FIG. 8, showing again that photoluminescence actually increased from the coated phosphor. Table 4 also shows that the CIE does not change significantly when coating the silicate orange phosphor.

TABLE 4

| Sample | Emission (nm) | PL (%) | CIE x | CIE y |
|---|---|---|---|---|
| Orange 1 | 601.13 | 100 | 0.5847 | 0.4136 |
| Orange 1-TiO$_2$/SiO$_2$ | 601.42 | 107 | 0.5869 | 0.4116 |

Example 7

Coating a Nitride Red Phosphor with a Coating Including TiO$_2$ and SiO$_2$

To a glass reactor with heating mantle and stirring set up under an evacuation hood, isopropyl alcohol (IPA, 750 mL) was added. Then, a nitride red phosphor (Red 1—(Ca$_{0.2}$Sr$_{0.795}$Eu$_{0.005}$)AlSiN$_3$(Cl,Br)$_x$) (50 g) was added with stirring to form a suspension. To this suspension, titanium n-butoxide (3.40 mL) was added by syringe. After this addition, the suspension was stirred 0.5 hours at room temperature. The mixture of de-ionic water and isopropyl alcohol (7.5 mL: 15 mL) was added dropwise to above suspension. After this addition, the mixture of TEOS and isopropyl alcohol (2.26 g: 5 mL) was added dropwise to the above suspension. The resultant suspension was heated to 40° C. and kept at this temperature for 0.5 hours. It was cooled to room temperature and stirred for a further 20 hours at room temperature. The suspension was heated to 65° C. for 2.0 hours. It was stirred for 5 hours further at room temperature. The stirring assembly was removed. The mixture stayed under the evacuation hood for a further 10 minutes. The top layer of the solution was decanted and more IPA was added and filter through a Büchner funnel. The solid in the funnel was washed twice with IPA. The solid in the funnel was dried in a vacuum oven at 110° C. for 1.0 hours. After drying, the coated phosphor was fired in a box furnace at 350° C. for 1.0 hour.

Example 8

Coating a Nitride Red Phosphor with a Coating with SiO$_2$ Alone

To a 1 L flask with stir bar, heating mantle and reflux condenser set up under an evacuation hood, ethanol (200 mL) and red nitride phosphor (10 g) were added in sequence to form a mixture, or a suspension, of the red nitride phosphor in the ethanol. Then, a mixture of ammonia, water (3.2 g:14 g=ammonia (29%): Di-H$_2$O) and ethanol (20 mL) was added to the suspension. The mixture was heated to 65° C.-70° C. TEOS was used as a precursor for the SiO$_2$. A mixture of TEOS:EtOH (4.8 g:4.8 g) was added dropwise at 65° C.-70° C. to the suspension. The rate of addition was about 0.5% by weight of the SiO$_2$ per minute as measured against the weight of the phosphor. When the addition was complete, the suspension was stirred for a further 2.0 hours. The resultant mixture was cooled to room temperature. The mixture was filtered through a Buchner funnel. The solid was dried at 110° C. for 1 hour in a vacuum oven. The solid was then fired at 350° C. for 1 hour.

Example 9

Comparing the Performances of Uncoated and Coated Nitride Red Phosphors, the Coatings Including TiO$_2$ and SiO$_2$ in Combination and SiO$_2$ Alone Performance was compared with regard to relative photoluminescence and brightness. Photoluminescence was measured between uncoated and coated nitride red phosphors created using the process of Example 7. Powdered phosphor was put into a shallow dish and tampered down to make a flat surface. The phosphor was then excited by an external light source of a blue light-emitting diode (LED). An emission spectrum from the uncoated and coated nitride red phosphor materials was measured using a spectrometer.

Figure 9:
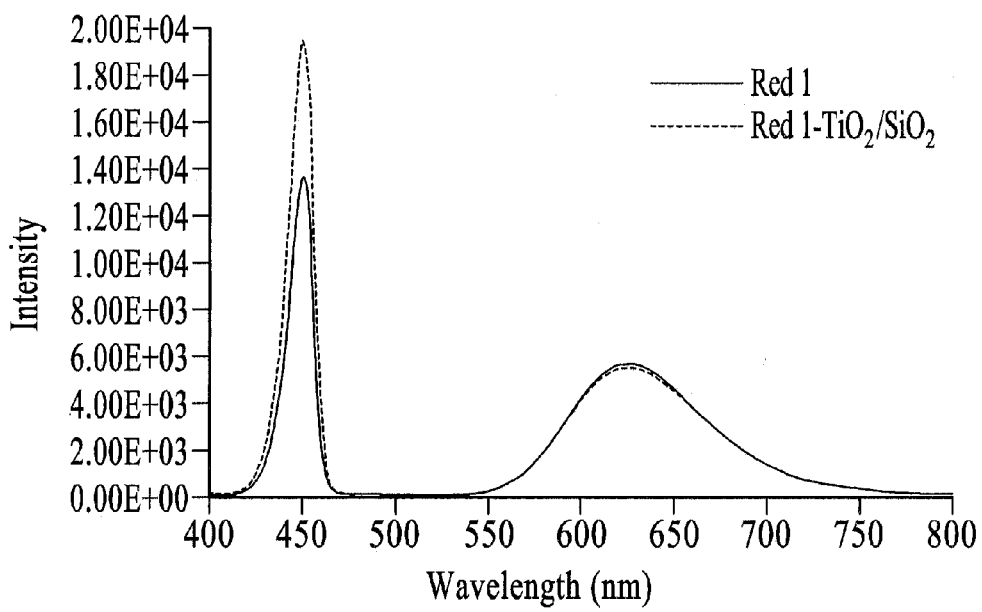
FIG. 9; shows the photoluminescence emission spectra of a nitride red phosphor (Red 1), comparing the uncoated and coated nitride red phosphor, according to some embodiments of the present invention.

FIG. 9 shows the photoluminescence emission spectra of a nitride red phosphor, comparing the uncoated and coated nitride red phosphor, according to some embodiments of the present invention. FIG. 9 shows that the combination coating having a primer layer of TiO$_2$ and a sealant layer of SiO$_2$ does not appear to create any loss in photoluminescence—the two plots being overlaid for a majority of the wavelength range.

Table 5 shows a brightness and photoluminescence comparison between three different uncoated phosphors, where the reference phosphor is a nitride red phosphor emitting at 630 nm, and the Red 1 and Red 2 phosphors—same phosphor from different batches generally described by (Ca$_{0.2}$Sr$_{0.795}$Eu$_{0.005}$)AlSiN$_3$(Cl,Br)$_x$—are an enhanced version of that nitride red phosphor also emitting at about 630 nm. Uncoated and coated versions of the enhanced nitride red phosphors are compared, one having the combination coating and the other having only the SiO$_2$ coating. It can be seen that the reference phosphor represented 100% brightness and was used as a baseline to compare the performance of the uncoated and coated enhanced phosphors. Again, the combination coating having TiO$_2$ as a primer layer and SiO$_2$ as a sealant layer outperformed the uncoated enhanced phosphor in brightness. The enhanced phosphor with the SiO$_2$ coating also outperformed the uncoated enhanced phosphor. Moreover, it was surprisingly discovered that, in each of the coated enhanced phosphors, the brightness increased substantially over the uncoated enhanced phosphor, and the combination coating showed the highest increase.

TABLE 5

| Sample | PL | CIE x | CIE y | % in silicone | Brightness |
|---|---|---|---|---|---|
| Red 1 | 1.51 | 0.3926 | 0.2001 | 6.00 | 110.6% |
| Red 1-TiO$_2$/SiO$_2$ | 1.52 | 0.3906 | 0.2001 | 6.00 | 112.5% |
| Red 2 | 1.55 | 0.3952 | 0.2001 | 6.00 | 106.6% |
| Red 2-SiO$_2$ | 1.62 | 0.3953 | 0.2001 | 6.00 | 107.9% |
| Reference | 1.46 | 0.3960 | 0.2001 | 5.00 | 100.0% |

Example 10

Coating a Nitride Red Phosphor with a Coating Including Al$_2$O$_3$ and SiO$_2$

To a glass reactor with heating mantle and stirring set up under an evacuation hood, isopropyl alcohol (IPA, 800 mL) was added. Then a nitride red 3—(Ca$_{0.2}$Sr$_{0.795}$Eu$_{0.005}$)AlSiN$_3$(Cl,Br)$_x$—phosphor (50 g) was added with stirring to form a suspension. Aluminum isopropoxide (3.5 g) and isopropyl alcohol (IPA, 75 mL) were added to a dry beaker. The mixture was then put into an ultrasonic bath and sonicated for 30 minutes to make a well dispersed solution. To the phosphor suspension, the well dispersed aluminum isopropoxide solution was then added. The suspension was stirred for 0.5 hours at room temperature. A mixture of de-ionic water and isopropyl alcohol (15 mL: 30 mL) was then added dropwise to the suspension. After this addition, the mixture of TEOS and isopropyl alcohol (7.5 g: 7.5 mL) was added dropwise to the suspension. The resultant suspension was heated to 40° C. and kept at temperature for 0.5 hours. The suspension was cooled to room temperature and stirred for a further 20 hours at room temperature. The suspension was heated to 60° C. and kept at this temperature for 2.0 hours. The suspension was then stirred for 16 hours further at room temperature. A mixture of de-ionic water and isopropyl alcohol (5.0 mL:5.0 mL) was then added to the suspension. The suspension was heated to 60° C. and kept at temperature for 2.0 hours. The suspension was stirred for 2 hours further at room temperature. The stirring assembly was removed. The mixture was settled under the evacuation hood for 30-60 minutes. The top layer solution was decanted and more IPA was added to wash the mixture and the mixture was then filtered through the Büchner funnel. The solid in the funnel was dried in an oven at 130° C. for 1.5 hours. After drying, the coated phosphor was fired in a box furnace at 350° C. for 1.0 hour. The thickness of the mixed composition coating is typically 10 nm to 50 nm and preferably 15 nm to 30 nm.

Example 11

Comparing the Performances of Uncoated and Coated Nitride Red Phosphors, the Coatings Including $Al_2O_3$ and $SiO_2$ Performance was compared with regard to relative photoluminescence and brightness. Photoluminescence was measured between uncoated and coated nitride red phosphors created using the process of Example 10. Powdered phosphor was put into a shallow dish and tampered down to make a flat surface. The phosphor was then excited by an external light source of a blue light-emitting diode (LED). An emission spectrum from the uncoated and coated nitride red phosphor materials was measured using a spectrometer.

Figure 10:
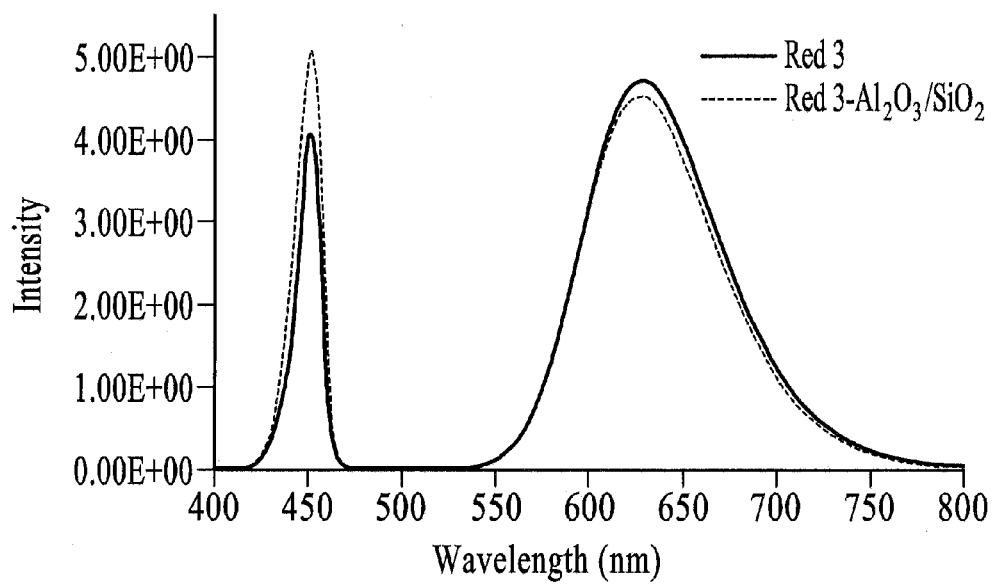
FIG. 10 shows the photoluminescence emission spectra of a nitride red phosphor (Red 3), comparing the uncoated and coated nitride red phosphor, according to some embodiments of the present invention.

FIG. 10 shows the photoluminescence emission spectra of a nitride red phosphor, comparing the uncoated and coated nitride red phosphor, according to some embodiments of the present invention. FIG. 10 shows that the combination coating having a mixed composition layer of $Al_2O_3$ and $SiO_2$ does not appear to create a significant loss in photoluminescence.

Table 6 shows a brightness and photoluminescence comparison between uncoated and coated phosphors, where the uncoated phosphor is a nitride red phosphor emitting at 630 nm. It can be seen that the uncoated phosphor represented 100% brightness and was used as a baseline to compare the performance of coated enhanced phosphors. The combination coating having the $Al_2O_3$ and $SiO_2$ mixed composition layer has 98.9% in brightness compared to uncoated version.

TABLE 6

| Sample | Emission (nm) | PL (%) | CIE x | CIE y | Brightness |
|---|---|---|---|---|---|
| Red 3 | 629.47 | 100 | 0.6430 | 0.3565 | 100.0% |
| Red 3-$Al_2O_3$/$SiO_2$ | 628.45 | 96.2 | 0.6411 | 0.3584 | 98.9% |

Example 12

Coating a Nitride Red Phosphor with a Coating Including $Al_2O_3$ and $SiO_2$

To a glass reactor with heating mantle and stirring, de-ionic water (780 mL) was added. Then a nitride red 4 phosphor (50 g) $((Ca_{0.2}Sr_{0.795}Eu_{0.005})AlSiN_3(Cl,Br)_x)$, urea (4.5 g) and aluminum nitrate $(Al(NO_3)_3 \cdot 9H_2O$, 3.0 g) were added in sequence with stirring. Tetramethyl orthosilicate (TMOS, 3.0 g) was added to the phosphor suspension followed by 20 mL of de-ionic water. After stirring for 10 minutes, the pH was adjusted to be in the range of 6 to 7 using 0.5 M ammonia ($NH_4OH$) solution. The mixture was heated to 80° C. and stirred while maintaining the temperature at 80° C. for 16 hours using a temperature controller. The mixture was cooled to room temperature and the pH value of the solution was found to be around 8.0. The mixture was settled in an evacuation hood for 30 to 60 minutes. The supernatant was removed by decanting. Fresh de-ionic water was added to the mixture and the mixture was filtered through a Büchner funnel. The solid in the funnel was rinsed with a small amount of de-ionic water then ethanol. The solid was dried in an oven at 130° C. for 2.0 hours. After drying, the coated phosphor was fired in a box furnace at 350° C. for 1.0 hour. The thickness of the mixed composition coating is typically 10 nm to 50 nm and preferably 15 nm to 30 nm.

Example 13

Comparing the Performances of Uncoated and Coated Nitride Red Phosphors, the Coatings Including $Al_2O_3$ and $SiO_2$ Performance was compared with regard to relative photoluminescence and brightness. Photoluminescence was measured between uncoated and coated nitride red phosphors created using the process of Example 12. Powdered phosphor was put into a shallow dish and tampered down to make a flat surface. The phosphor was then excited by an external light source of a blue light-emitting diode (LED). An emission spectrum from the uncoated and coated nitride red phosphor materials was measured using a spectrometer.

Figure 11:
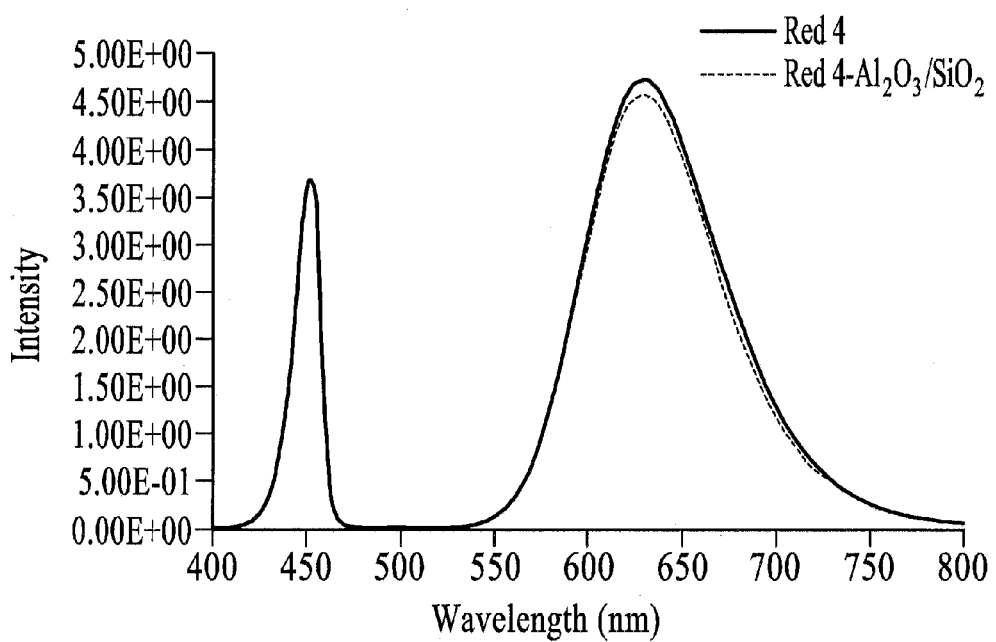
FIG. 11 shows the photoluminescence emission spectra of a nitride red phosphor (Red 4), comparing the uncoated and coated nitride red phosphor, according to some embodiments of the present invention.

FIG. 11 shows the photoluminescence emission spectra of a nitride red phosphor, comparing the uncoated and coated nitride red phosphor, according to some embodiments of the present invention. FIG. 11 shows that the combination coating having a mixed composition layer of $Al_2O_3$ and $SiO_2$ does not appear to create any significant loss in photoluminescence.

Table 7 shows a brightness and photoluminescence comparison between uncoated and coated phosphors, where the uncoated phosphor is a nitride red phosphor emitting at 630 nm. It can be seen that the uncoated phosphor represented 100% brightness and was used as a baseline to compare the performance of coated enhanced phosphors. The combination coating having the $Al_2O_3$ and $SiO_2$ mixed composition layer has 100.6% in brightness compared to the uncoated version.

TABLE 7

| Sample | Emission (nm) | PL (%) | CIE x | CIE y | Brightness |
|---|---|---|---|---|---|
| Red 4 | 629.78 | 100 | 0.6438 | 0.3557 | 100.0% |
| Red 4-$Al_2O_3$/$SiO_2$ | 628.94 | 96.9 | 0.6423 | 0.3572 | 100.6% |

Example 14

Figure 12:
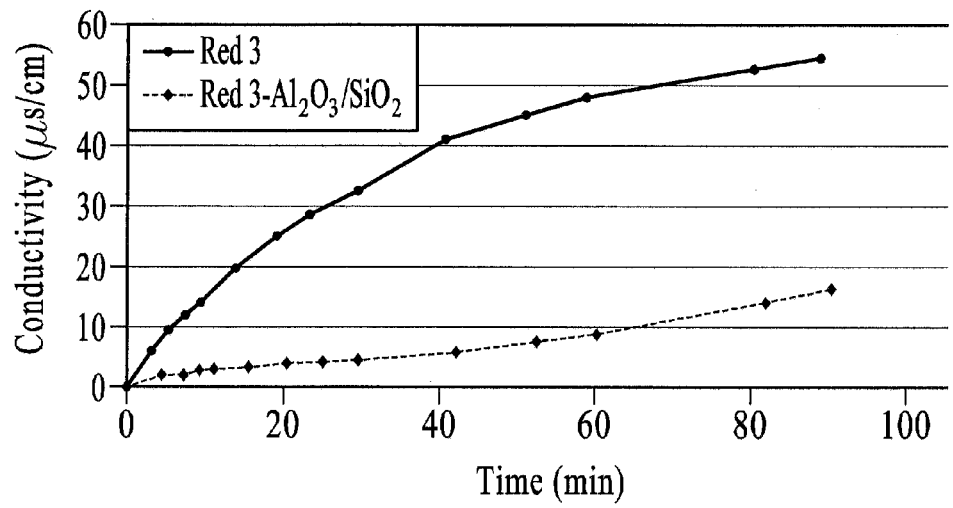
FIG. 12 show the relative conductivity shift at time intervals of up to 90 minutes for coated and uncoated nitride red phosphor (Red 3), according to some embodiments of the present invention.
Figure 13:
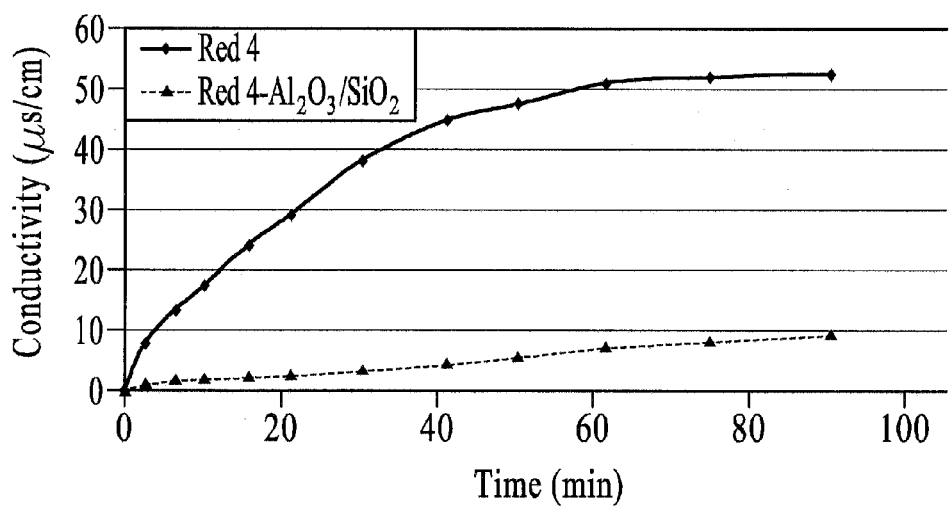
FIG. 13 show the relative conductivity shift at time intervals of up to 90 minutes for coated and uncoated nitride red phosphor (Red 4), according to some embodiments of the present invention.

Conductivity Measurement of Uncoated and Coated Nitride Red Phosphors, the Coatings Including $Al_2O_3$ and $SiO_2$ A conductivity testing probe (OAKLON waterproof PH/Con 300, Deluxe pH/Conductivity meter) was used to measure conductivity of the coated and uncoated phosphor. The conductivity cell constant is 1.0 $cm^{-1}$ and the ratio of phosphor:de-ionic water is about 1:300. The conductivity probe was calibrated with a standard solution (447 µS/cm). To a 50 mL testing tube with a screw cap and a stir bar, de-ionic water (30 mL) was added. The tube was put into a water bath which has a water level higher than that of the fluid inside the tube. The water bath was heated to boiling and kept boiling during testing. When the temperature inside the tube and water bath reached equilibrium, a red nitride phosphor (0.100 g) was added to the tube and a timer was started. The conductivity probe was inserted into the tube to get a conductivity value. Temperature, time and conductivity were recorded at different time intervals to get a curve of conductivity against time as shown in FIGS. 12 and 13.

The conductivity test was performed to show the ion concentration leaked into the solution for both coated and uncoated phosphor. The solution with coated material has a much lower conductivity value than the solution with uncoated phosphor, 16.5 µS/cm for coated compared with 54.7 µS/cm for uncoated in FIG. 12 and 9.4 µS/cm for coated compared with 53.0 µS/cm for uncoated in FIG. 13, which indicate that the coating layer can shield the photoluminescent material from leaking out into the solution.

Example 15

Using Electron Microscopy to Examine Coatings on Phosphors

Any electron microscope procedure known by one of skill to be suitable can be used to examine the coatings on phosphors. SEM was used to compare the appearance of two different uncoated silicate yellow phosphors that were coated as described herein using $SiO_2$, $TiO_2$, and a combination of a $TiO_2$ primer layer with a $SiO_2$ sealant layer.

Figure 14A:
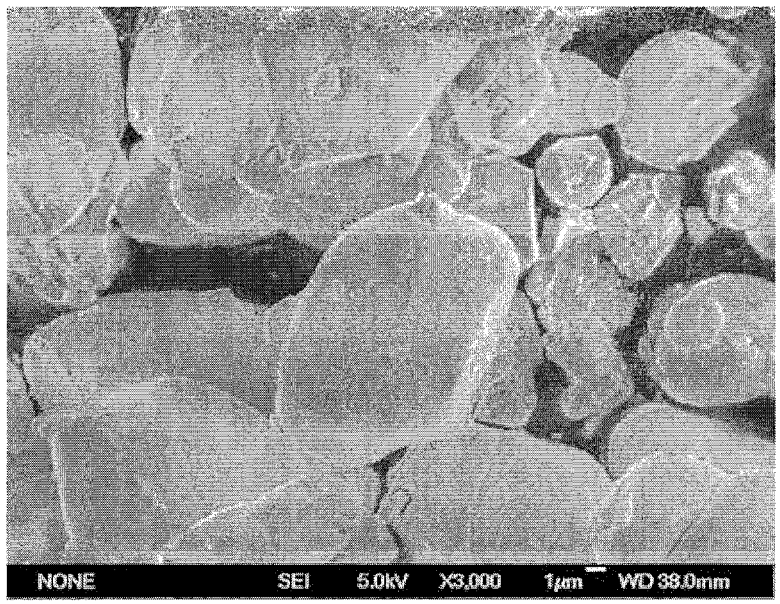
FIGS. 14A-14D illustrate SEM image comparisons of the appearance of a first uncoated silicate yellow phosphor with the same phosphor coated as described herein using $SiO_2$, $TiO_2$, and a combination of a $TiO_2$ primer with an $SiO_2$ sealant, according to some embodiments of the present invention.
Figure 14B:
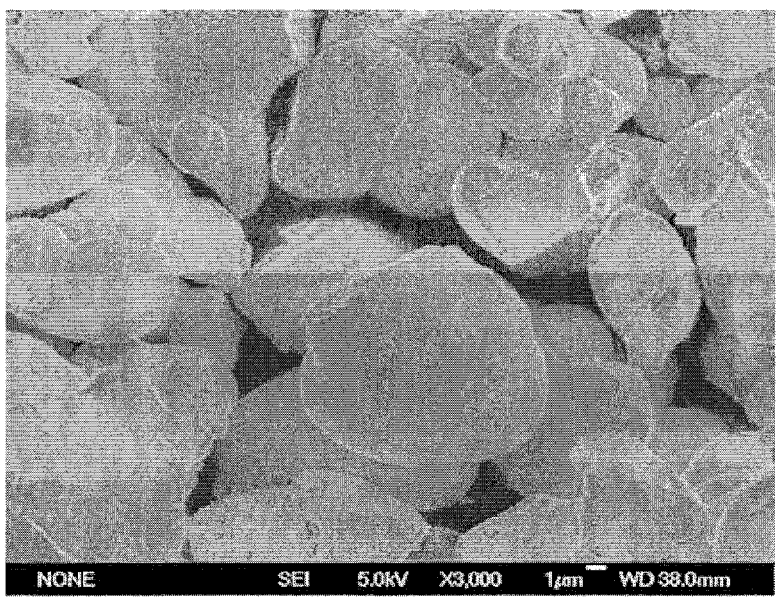
Figure 14C:
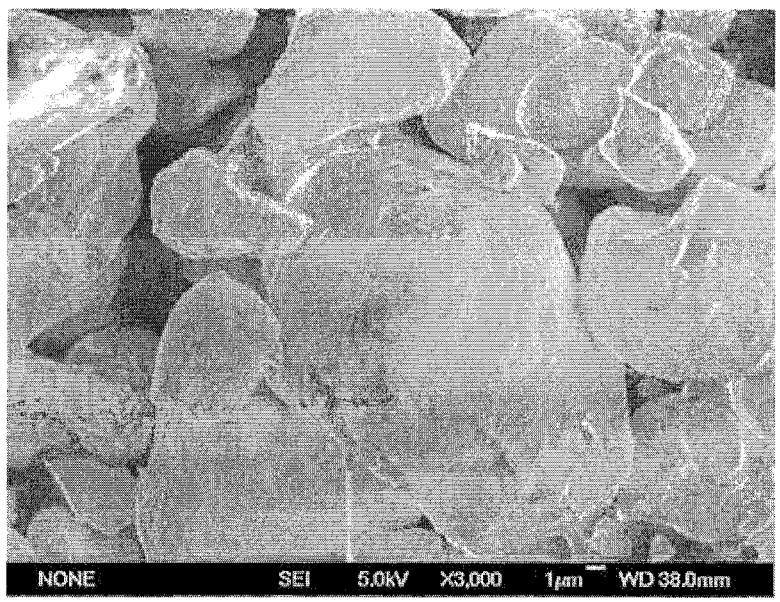
Figure 14D:
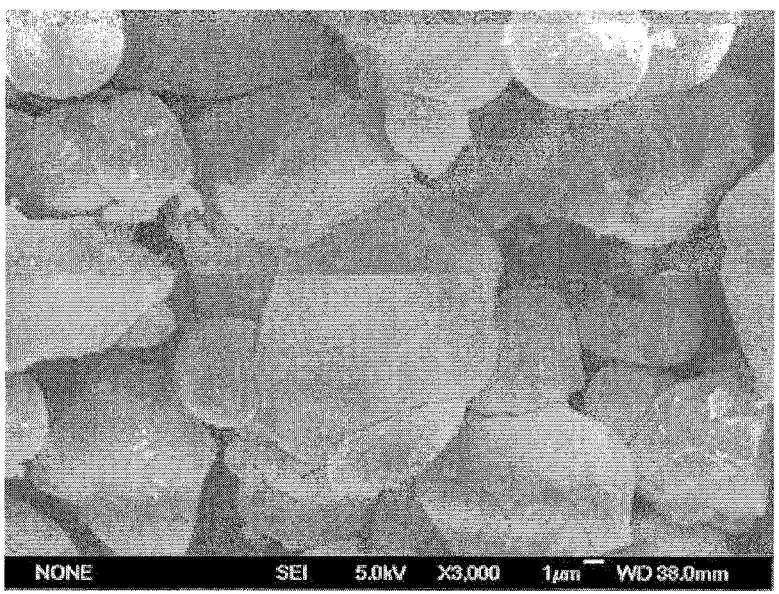

FIGS. 14A-14D illustrate SEM image comparisons of the appearance of a first uncoated silicate yellow phosphor that was coated as described herein using $SiO_2$, $TiO_2$, and a combination of a $TiO_2$ primer thickness with an $SiO_2$ sealant thickness, according to some embodiments. FIG. 14A shows the uncoated phosphor. FIG. 14B shows a combination coating having a thickness of $TiO_2$ applied to the surface of the phosphor, as taught herein as a primer thickness to prevent or inhibit leaching of phosphor chemicals into the coating, and $SiO_2$ as a sealant thickness to inhibit or prevent the entry of moisture or oxygen into the coating from the environment. FIG. 14C shows the phosphor having a $TiO_2$ coating applied directly to the surface of the phosphor. FIG. 14D shows the phosphor having only an $SiO_2$ coating applied directly to the surface of the phosphor.

Figure 15A:
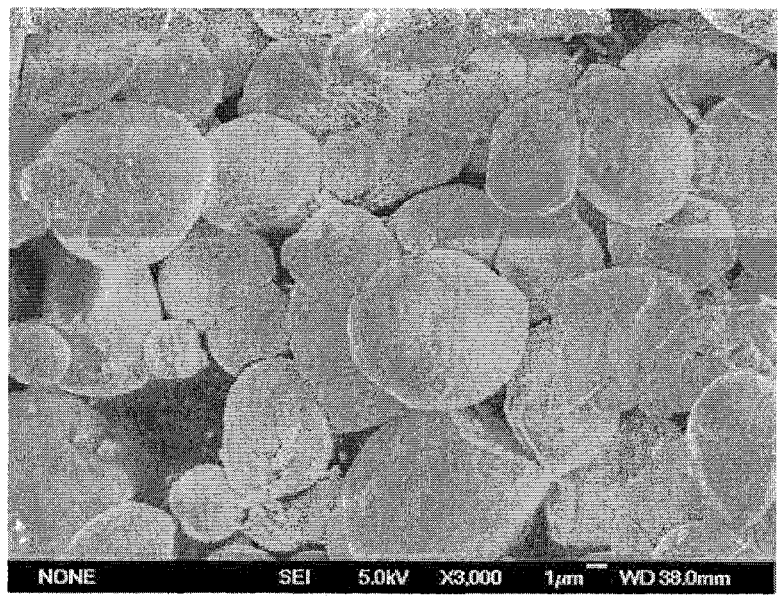
FIGS. 15A-15D illustrate SEM image comparisons of the appearance of a second uncoated silicate yellow phosphor with the same phosphor coated as described herein using $SiO_2$, $TiO_2$, and a combination of a $TiO_2$ primer with an $SiO_2$ sealant, according to some embodiments of the present invention.
Figure 15B:
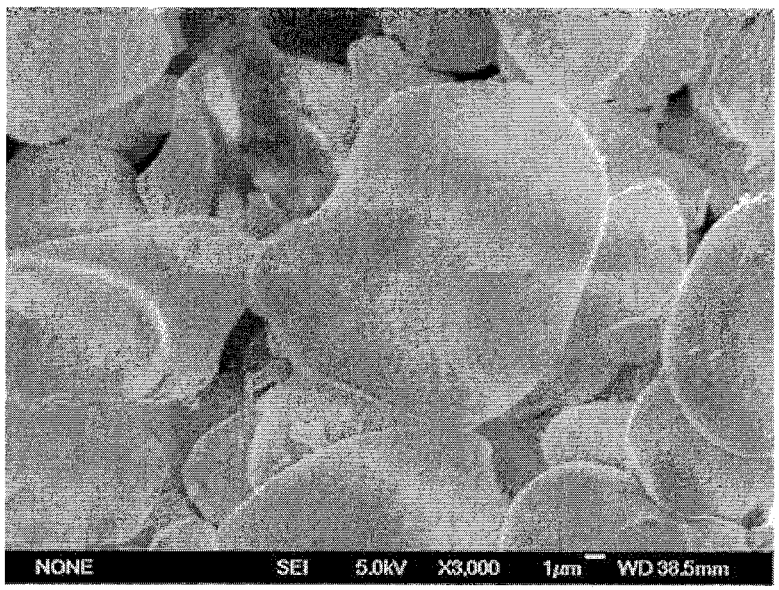
Figure 15C:
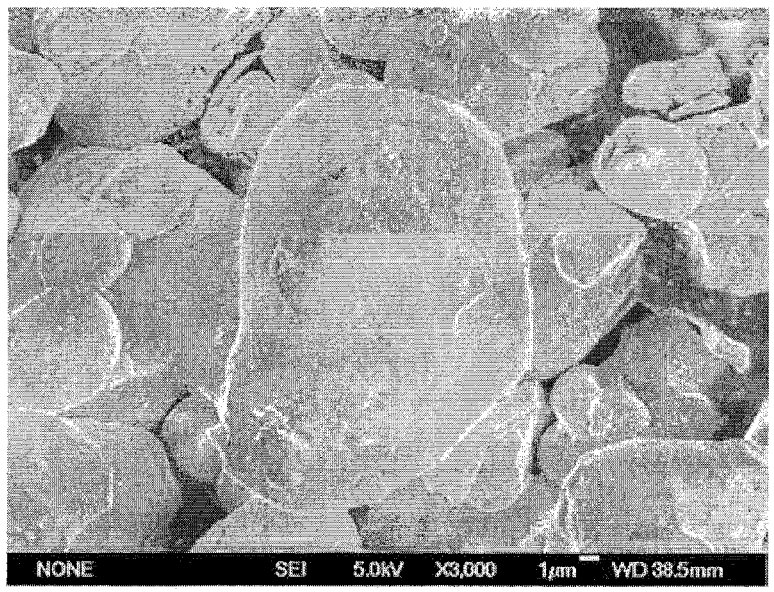
Figure 15D:
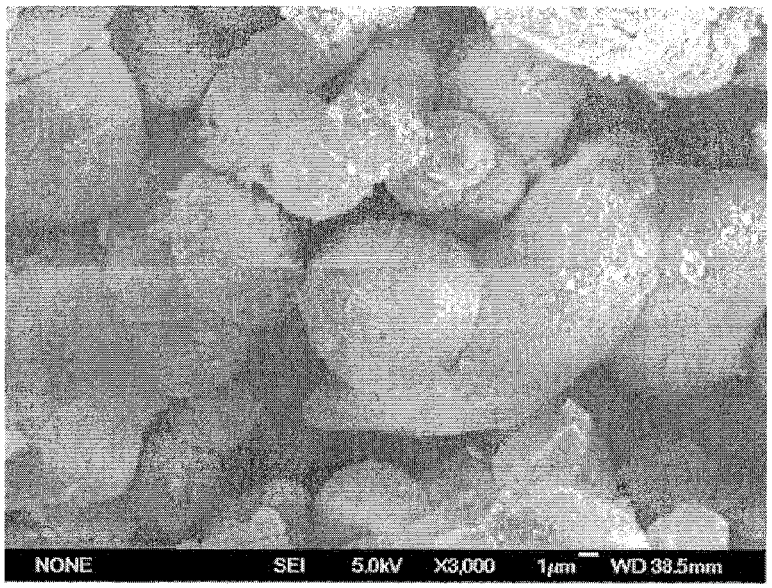

FIGS. 15A-15D illustrate SEM image comparisons of the appearance of a second uncoated silicate yellow phosphor that was coated as described herein using $SiO_2$, $TiO_2$, and a combination of a $TiO_2$ primer thickness with an $SiO_2$ sealant thickness, according to some embodiments. FIG. 15A shows the uncoated phosphor. FIG. 15B shows a combination coating having a thickness of $TiO_2$ applied to the surface of the phosphor, as taught herein as a primer thickness to prevent or inhibit leaching of phosphor chemicals into the coating, and $SiO_2$ as a sealant thickness to inhibit or prevent the entry of moisture or oxygen into the coating from the environment. FIG. 15C shows the phosphor having a $TiO_2$ coating applied directly to the surface of the phosphor. FIG. 15D shows the phosphor having only an $SiO_2$ coating applied directly to the surface of the phosphor.

In each of FIGS. 14B and 15B, there is a gradient-interface containing a mixture of $TiO_2$ and $SiO_2$ as the rate of addition of $TiO_2$ was ramped down in the formation of the primer layer, and the rate of addition of $SiO_2$ was ramped-up in the formation of the sealant layer. As can be seen in both sets of FIGS. 14A-14D and FIGS. 15A-115D, when compared to the uncoated phosphor, the combination coating and the $SiO_2$ coating each appear comparatively clean and without excess agglomeration of surface coating materials. The phosphor coated with the $TiO_2$, on the other hand, appears to show appreciable agglomeration. While not intending to be bound by any theory or mechanism of action, the data above regarding water absorption, and the like, in combination with this SEM data further suggests that a higher coating quality having a lower water content can be produce by applying the $TiO_2$ first as a primer thickness to inhibit or prevent the phosphor chemicals from leaching into the coating, followed by a thickness of $SiO_2$ as a sealant layer to inhibit or prevent moisture or oxygen from entering the coating from the environment.

Moreover, TEM can be used further, for example, to measure the thickness and uniformity of a coating. A TEM-ready sample can be prepared from a phosphor sample using the in situ FIB lift-out technique on an FEI Dual Beam 830 FIB/SEM. The area of the particle to be cross sectioned can be first capped with protective layers of Iridium and platinum. These layers can be used to protect the coating surface during the FIB milling process. The TEM-ready samples can be imaged with a FEI Tecnai TF-20 FEG/TEM operated at 200 kV in bright-field (BF) TEM mode and high resolution (HR) mode. Measurements can be taken to determine the thickness and uniformity of thickness, where the thickness can range from, for example, about 20 nm to about 500 nm, in some embodiments.

Figure 16:
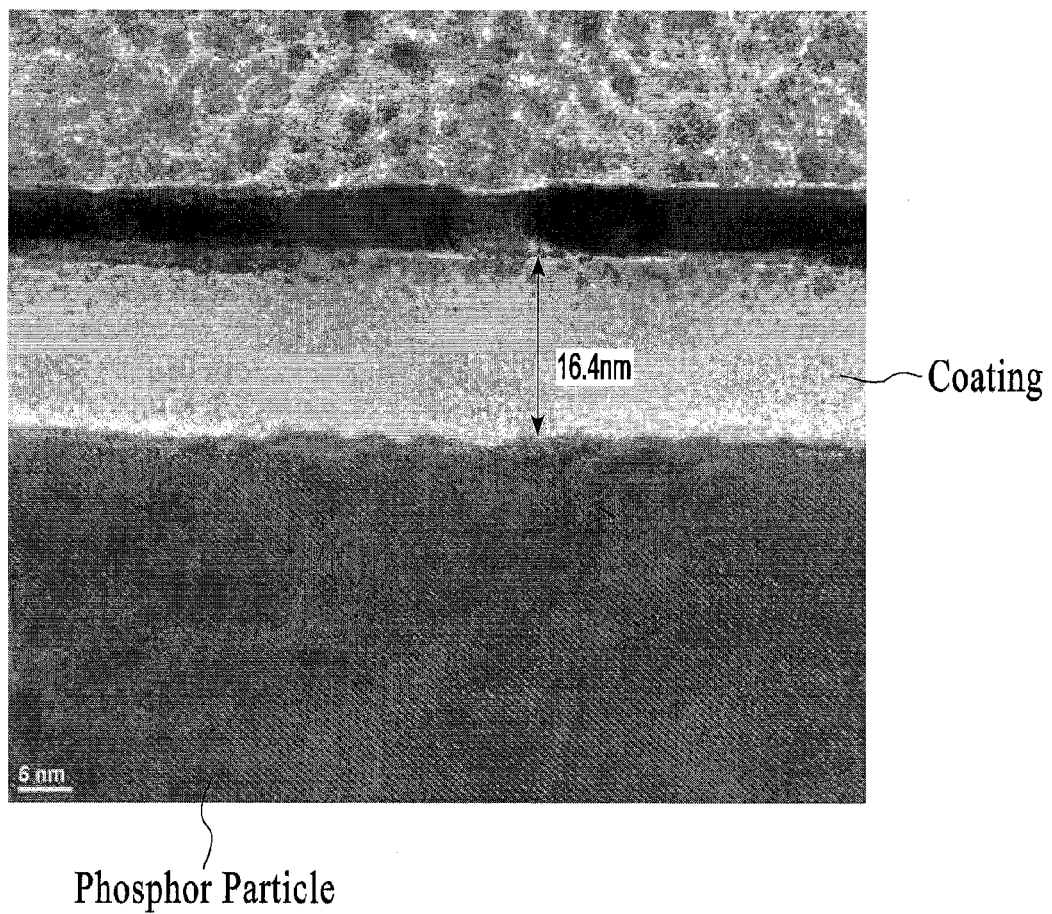
FIG. 16 is a TEM image of a coated phosphor particle, according to some embodiments of the present invention.
Figure 17:
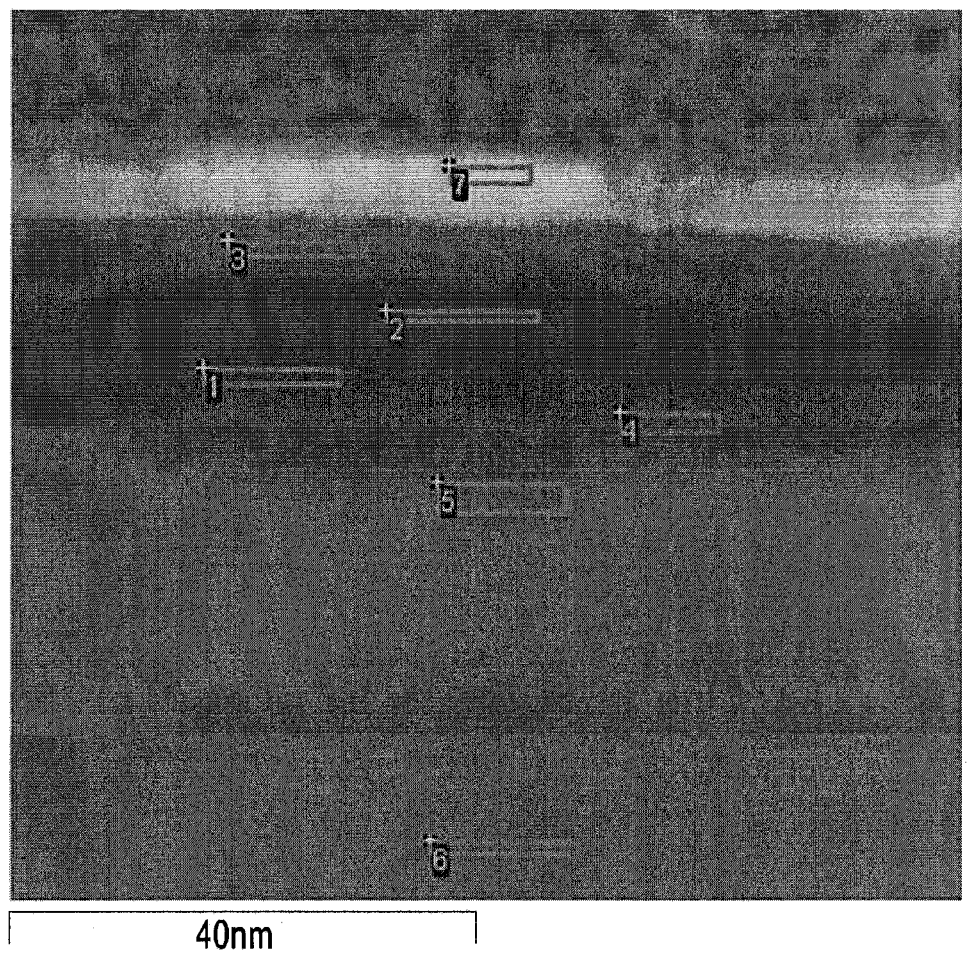
FIG. 17 is a TEM image of the coated phosphor particle of FIG. 16, with EDS sites overlaid.

The TEM image of Red 3-$Al_2O_3$/$SiO_2$ is shown in FIG. 16. It shows a very uniform coating on the photoluminescent material surface. The average thickness of the coating is about 16 nm. EDS analysis of the coating layer was conducted as shown in FIG. 17. The results are shown in Table 8. From inside to outside of the coating layer, 1 to 2 to 3 in FIG. 17, the aluminum and silicon molar ratio (Al/Si) is 9.8/24.2, 7.3/26.7 and 6.7/7.2. These two metal/semiconductor oxides formed a mixed composition layer covering the surface of the photoluminescent material. At the interface between the coating layer and the phosphor surface, the Al/Si ratio is 10.8/12.7 as shown in point 4 in FIG. 17. Inside the phosphor (points 5 and 6 in FIG. 17), EDS showed the ratio of Al/Si is close to 1.0 which is consistent with the stoichiometric formula of the phosphor. This also indicates that EDS on a TEM image is an accurate tool to get coating layer composition.

Example 16

Coating Configurations

One of skill will appreciate that the coatings can be applied using any of a variety of coating process steps. A primer layer, for example, can be deposited discretely, such that it is applied as a process separate from the application of a subsequent layer such as, for example, a sealant layer. And, in some embodiments, a primer material can be applied in a process that is combined with the application of a second thickness that can be a different material, such as a sealant material. The result can be a gradient-interface between the primer material and the subsequent material, such as a sealant material. The relative thicknesses and degree of interfacing between the primer material and sealant material can be controlled through application rate and duration of each material in the process. Furthermore, in other embodiments, a primer material can be applied in a process that is combined with the application of a second material, such as a sealant material.

The result can be a deposited mixture of primer material and the subsequent material, such as a sealant material. The composition of the resulting coating can be varied to some extent through its thickness—the composition being determined by pH and temperature among other factors.

Figure 18A:
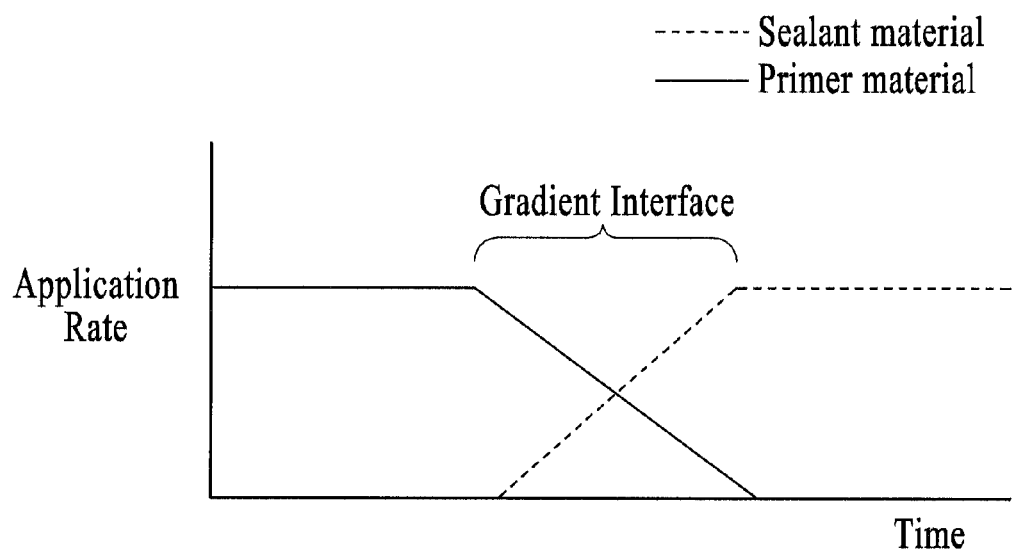
FIGS. 18A & 18B illustrate gradient interfaces for coating layers on phosphor particles, according to some embodiments of the present invention.
Figure 18B:
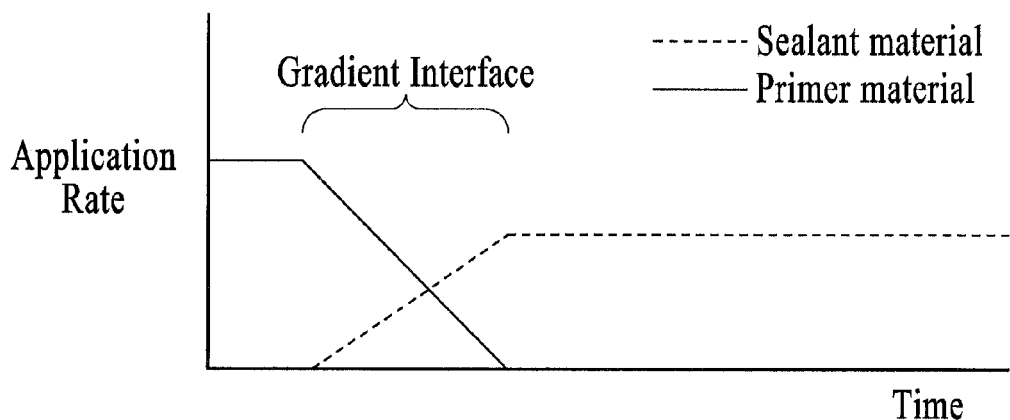
Figure 19:
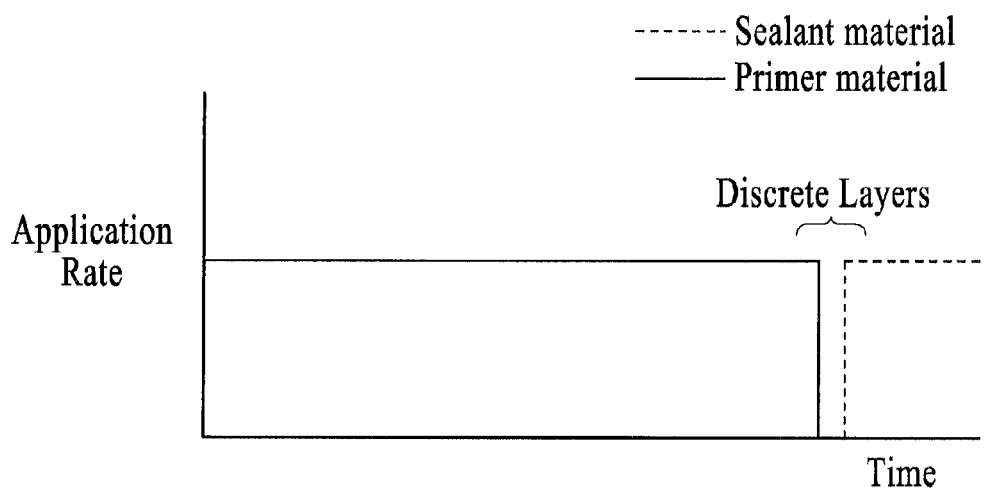
FIG. 19 illustrates discrete layers for coating layers on phosphor particles, according to some embodiments of the present invention.
Figure 20:
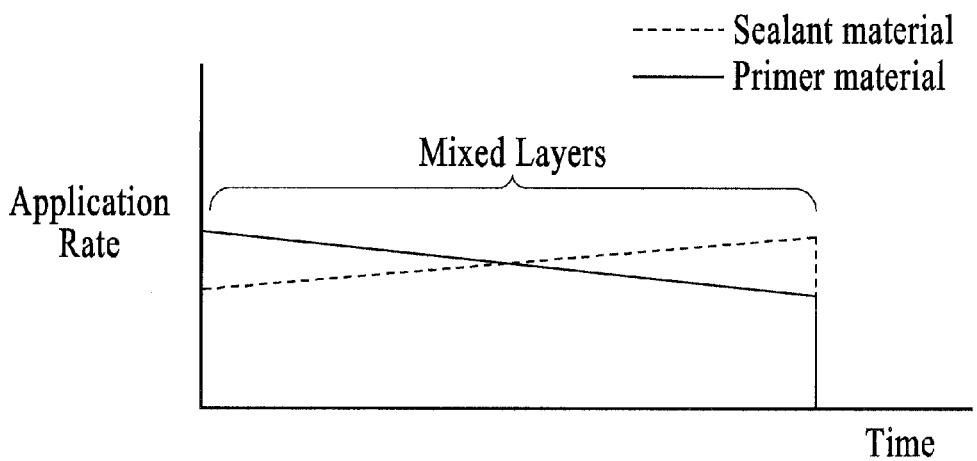
FIG. 20 illustrates mixed composition layers for coating layers on phosphor particles, according to some embodiments of the present invention.

FIGS. 18A-18B illustrate gradient interfaces, FIG. 19 illustrates discrete layers, and FIG. 20 illustrates a mixed composition layer, according to some embodiments of the present invention. FIG. 18A shows how a primer material can be applied at approximately the same rate as a sealant material, for example, where the rate at which the application of the primer material decreases from a steady rate of application during the transition is about the same as the rate at which the rate of the sealant material increases to a steady rate of application during the transition. The result may be an application of primer and sealant thicknesses that are about the same. FIG. 18B shows how the rates of application may be designed differently, where a primer material can be applied at a higher rate for a shorter time, and the sealant can be applied at a lower rate for a longer time, where the relative thicknesses will depend on the relative application rates and duration. FIG. 19 shows the application of discrete layers, where a discrete primer layer may be designed to have a thickness that exceeds that of a discrete sealant layer. FIG. 20 shows the application of a mixed composition layer where the primer and sealant materials are being deposited simultaneously, and the rates of application are shown to vary differently for the two materials with the result that the composition of the coating will vary through its thickness. The relative rates of application and change in rate of application for the sealant and primer may be controlled to some extent by the deposition conditions, including pH and temperature.

Any number of layers can be used to create a combination coating, in some embodiments. For example, a total thickness of about 300 nm may be obtained using a structure of about 150 nm $TiO_2$ as a primer material, and about 150 nm $SiO_2$ as a sealant material. Such a combination coating can also have a gradient interface or be formed in discrete layers as described above. Likewise, a material can be applied as a series of applications to obtain a desired thickness. For example, a combination coating of about 300 nm thickness can include 3 separate applications of $TiO_2$ having thicknesses of about 50 nm each, followed by 3 application of $SiO_2$ having thicknesses of about 50 nm each.

Example 17

FTIR Studies Show that a Multifunctional Coating Comprising a $TiO_2$ Primer Thickness and a $SiO_2$ Sealant Thickness can be Used to Inhibit or Prevent Leaching of Chemicals into the Coating from the Phosphor and Inhibit the Passage of Water Through the Coating to Improve Performance and/or Reliability of Coated Phosphors This example uses FTIR spectroscopy to illustrate the extent of reaction of water with the surface of two different phosphor materials having various coating materials and structures, and subject to a variety of environmental conditions. The study shows that a neutral primer material can be used to inhibit or prevent leaching of chemical from the phosphor by inhibiting or preventing the potential for a reaction between the alkaline-earth-based phosphor chemicals and the primer material. Combining this feature with a $SiO_2$ barrier layer to inhibit entry of water into the coating from the environment, provides a surprisingly effective coating combination for photoluminescent materials.

The FTIR procedure included using the water uptake procedure of Example 3 to compare the water uptake in samples subject to 100% humidity for 3 days to samples that have been freshly made and not yet subject to ambient moisture, samples that have been packaged for 3 months and not yet subject to ambient moisture, and samples subject to various natural ambient humidities. The samples were mixed with 50% by weight KBr to make pellets for the FTIR testing. The mixed composition materials were pressed in a cylindrical die at 4000 psi to make thin pellets, which appeared like semi-transparent disks. The pressed sample disks were placed in a Nicolet 6700 FTIR Spectrometer and scanned from 500 $cm^{-1}$ to 4000 $cm^{-1}$.

When the water reacts at the surface of the phosphor, a carbonate compound is formed, and FTIR was used to detect the extent of the reaction of water at the surface of the phosphor to determine the amount of water reaching the surface through the coating.

Figure 21A:
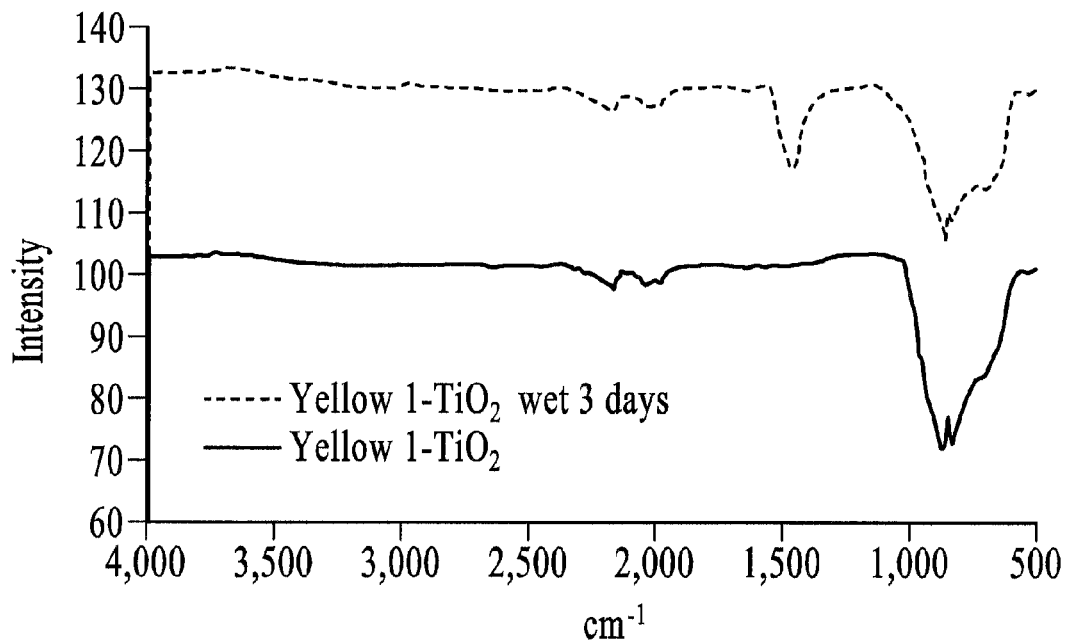
FIGS. 21A & 21B show the formation of carbonates at the surface of a first yellow silicate phosphor due to water passing through a $TiO_2$ coating material under various conditions, and the color change in emission that occurs from the degradation reaction, according to some embodiments of the present invention.
Figure 21B:
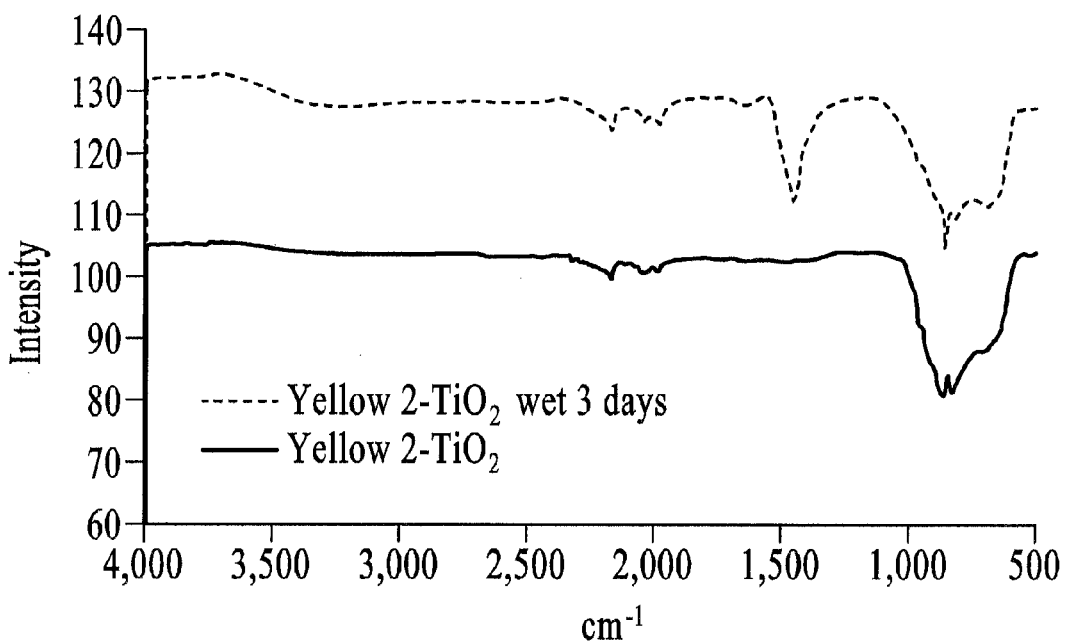

FIGS. 21A and 21B show a comparison of carbonate formation between the first and second yellow silicate phosphor coated with only $TiO_2$, when taken immediately after manufacturing and when taken under 100% humidity conditions for 3 days, according to some embodiments. It is clearly seen that there is a sizeable carbonate peak indicating that degradation reactions are occurring at the surface of the yellow silicate phosphor materials.

Figure 22A:
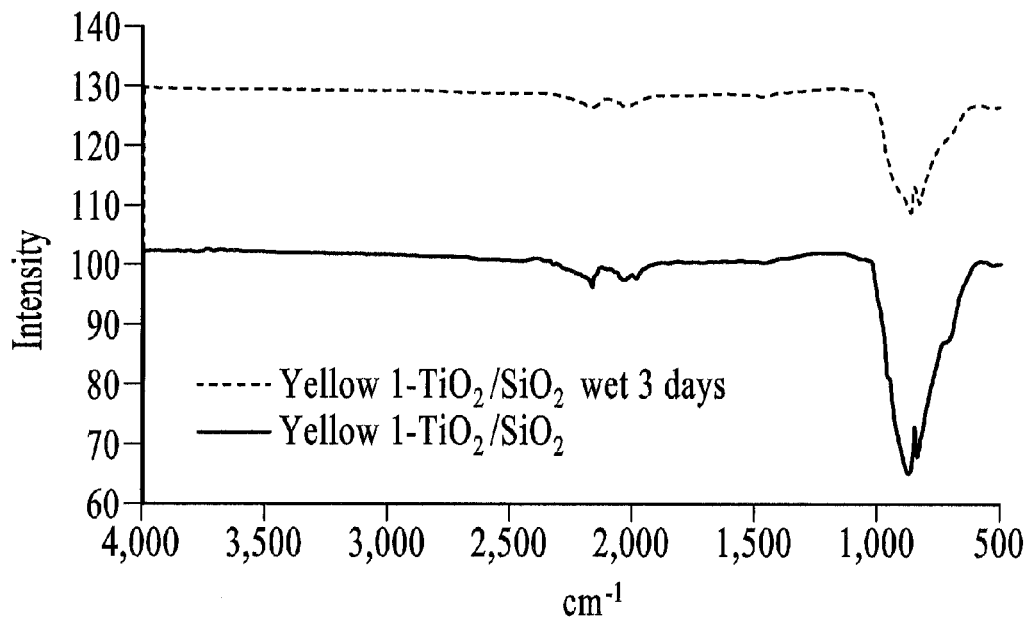
FIGS. 22A & 22B show a comparison of carbonate formation between the first and second yellow silicate phosphor coated with only $TiO_2$, when taken immediately after manufacturing and when taken under 100% humidity conditions for 3 days, according to some embodiments of the present invention.
Figure 22B:
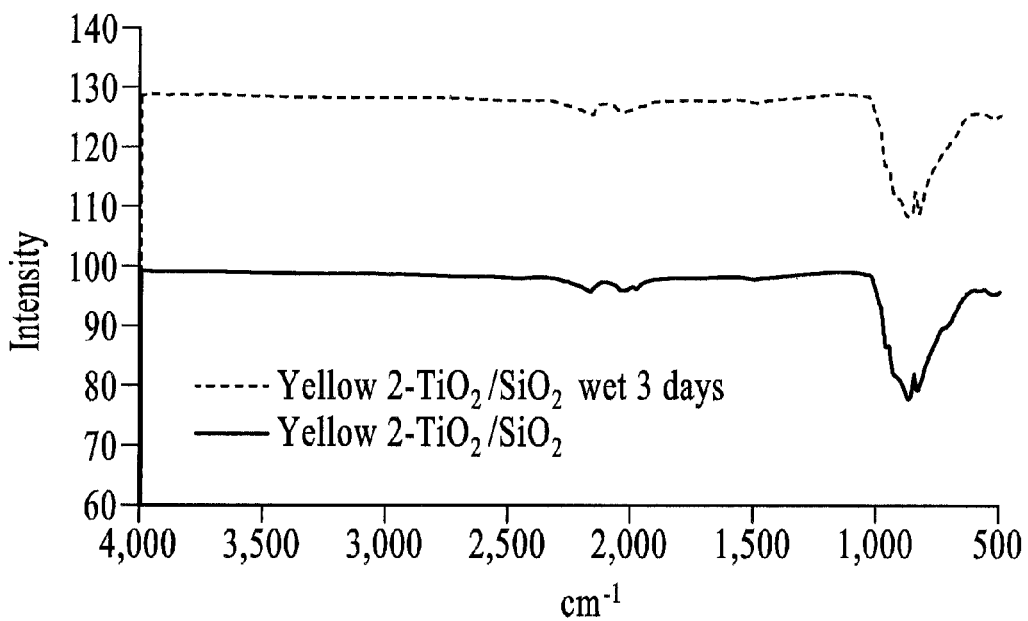

FIGS. 22A and 22B show a comparison of carbonate formation between the first and second yellow silicate phosphor coated with a $TiO_2$ primer thickness and an $SiO_2$ sealant thickness, when taken immediately after manufacturing and when taken under 100% humidity conditions for 3 days, according to some embodiments. Surprisingly, there is no significant carbonate peak, which indicates that little-to-no degradation reactions are occurring at all on the surface of the yellow silicate phosphor materials. As such, the combination coating provides a substantial improvement over state-of-the-art phosphor coatings.

As can be seen from the results, the coatings taught herein can be designed to reduce the reaction of phosphor chemicals with water that must pass through the coating to get to the phosphor surface. The coatings taught herein have been shown to do two things: (i) reduce the leaching of chemicals from the phosphor to the surface of the phosphor by depositing either a basic or neutral coating as a primer material on the surface of the phosphor; and (ii) reduce entry of moisture from the ambient environment by depositing a less porous coating as a sealant material as a layer positioned between the primer coat and the ambient environment, which can be an outermost thickness adjacent to the environmental conditions. This example shows that a neutral primer material, such as $TiO_2$ or $Al_2O_3$, can be used to inhibit or prevent leaching of chemicals from the phosphor by inhibiting or preventing the potential of a reaction between the alkaline earth phosphor chemicals and the primer material. Combining this feature with a $SiO_2$ sealant layer to inhibit entry of water into the coating from the environment, provides a surprisingly effective coating combination for photoluminescent materials.

Although coatings comprising combinations of materials have been described herein and found to have advantageous properties, coatings comprising $SiO_2$ alone may also provide a significant advantage over the prior art. A description of $SiO_2$ coated phosphor particles is provided as follows. Many of the teachings for the combination coatings provided above also apply to $SiO_2$ coatings—for example, $SiO_2$ coatings may be applied to the same range of phosphor materials, in a wide range of thicknesses and uniformities as described above for the coatings comprising combinations of materials.

Example 18

Figure 23A:
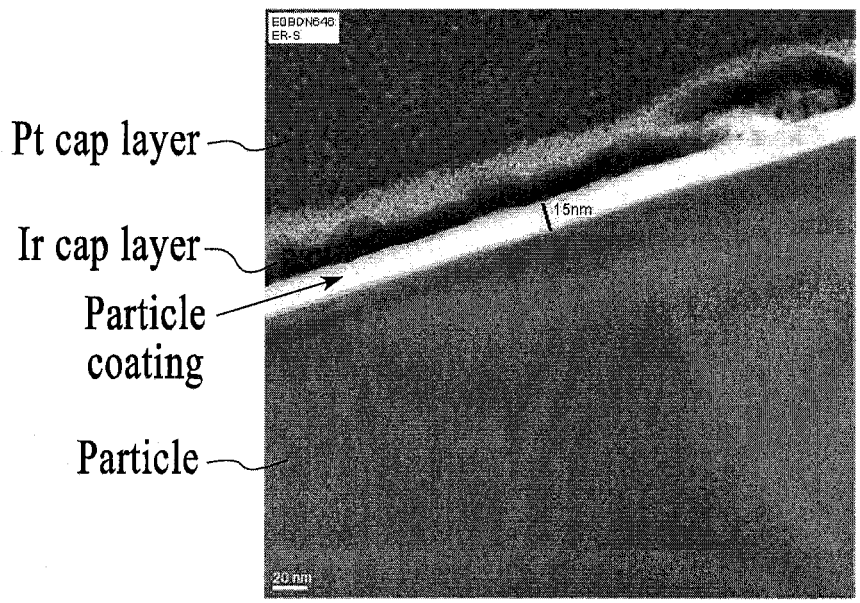
FIGS. 23A & 23B show TEM micrographs of a uniform silicon oxide coating having a thickness of about 15 nm to about 20 nm on a red nitride phosphor, according to some embodiments of the present invention.
Figure 23B:
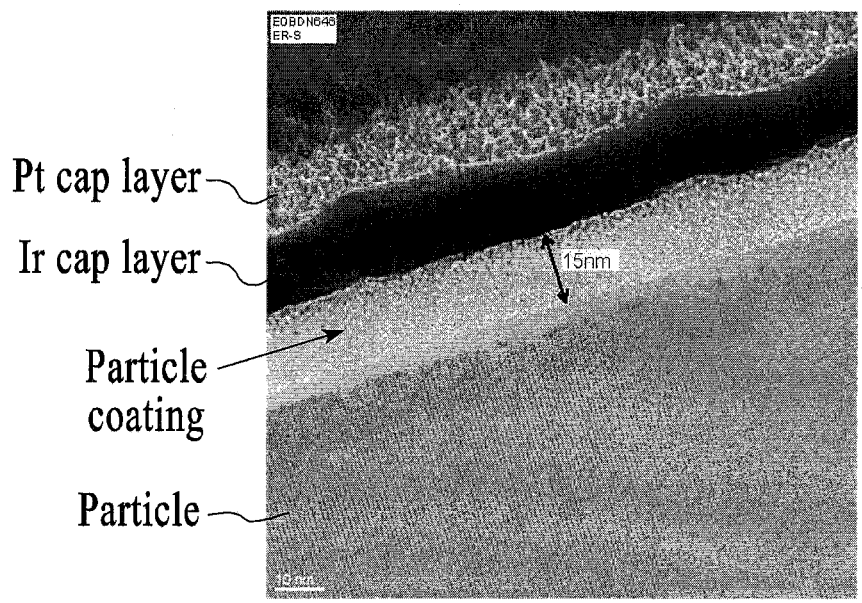

Using Electron Microscopy to Examine an $SiO_2$ Coating on a Nitride Red Phosphor FIGS. 23A & 23B show a uniform silicon dioxide coating, prepared using the method of example 8 above, having a thickness of about 15 nm to about 20 nm on a red nitride phosphor ($Ca_{0.2}Sr_{0.795}AlSiN_3Eu_{0.005}:Cl_{0.05}$), according to some embodiments of the present invention. A TEM-ready sample was prepared using the in situ FIB lift out technique on an FEI Dual Beam 830 FIB/SEM. The area of the particle to be cross sectioned was first capped with protective layers of iridium and platinum. These layers protect the coating surface during the FIB milling process. The TEM-ready samples were imaged with a FEI Tecnai TF-20 FEG/TEM operated at 200 kV in bright-field (BF) TEM mode and high resolution (HR) mode. Measurements were taken to determine the thickness and the uniformity of thickness.

The reliability of performance of the coated nitride red phosphors ($Ca_{0.2}Sr_{0.795}AlSiN_3Eu_{0.005}:Cl_{0.05}$), prepared using the method of example 8 above, was compared among (i) an uncoated red nitride phosphor, (ii) a red nitride phosphor coated with $SiO_2$ as described herein, calcined at 350° C. for 1.0 hour; (iii) a red nitride phosphor of coated with $SiO_2$ as described herein, calcined at 600° C. for 0.5 hour; and (iv) a red nitride phosphor of coated with $TiO_2$, following the methods described in U.S. patent application Ser. No. 13/273,166, incorporated by reference herein, and calcined at 350° C. for 1.0 hour.

In order to create a device for testing, each coated red nitride phosphor was mixed with a light transmitting binder. The mixed gel was put into an LED chip and cured. The packaged device was placed in an oven at 85° C. and 85% humidity and operated continuously. At different time intervals, the device was removed from the oven and emission spectra were measured by excitation with blue light. The data were collected to calculate color change and brightness. Table 8 shows that there was no substantial loss in intensity from either of the coatings as compared to the uncoated control phosphor.

TABLE 8

| Sample | Brightness* | % | PL* | % |
|---|---|---|---|---|
| Uncoated Red Nitride | 3.208 | 100 | 1253 | 100 |
| $SiO_2$ Coated Red Nitride | 3.249 | 101 | 1245 | 99.4 |
| $TiO_2$ Coated Red Nitride | 3.203 | 99.8 | 1255 | 100 |

*Initial brightness and PL (photoluminescence) were taken at 0 hrs at 85° C. and 85% humidity in the reliability test.

Figure 24:
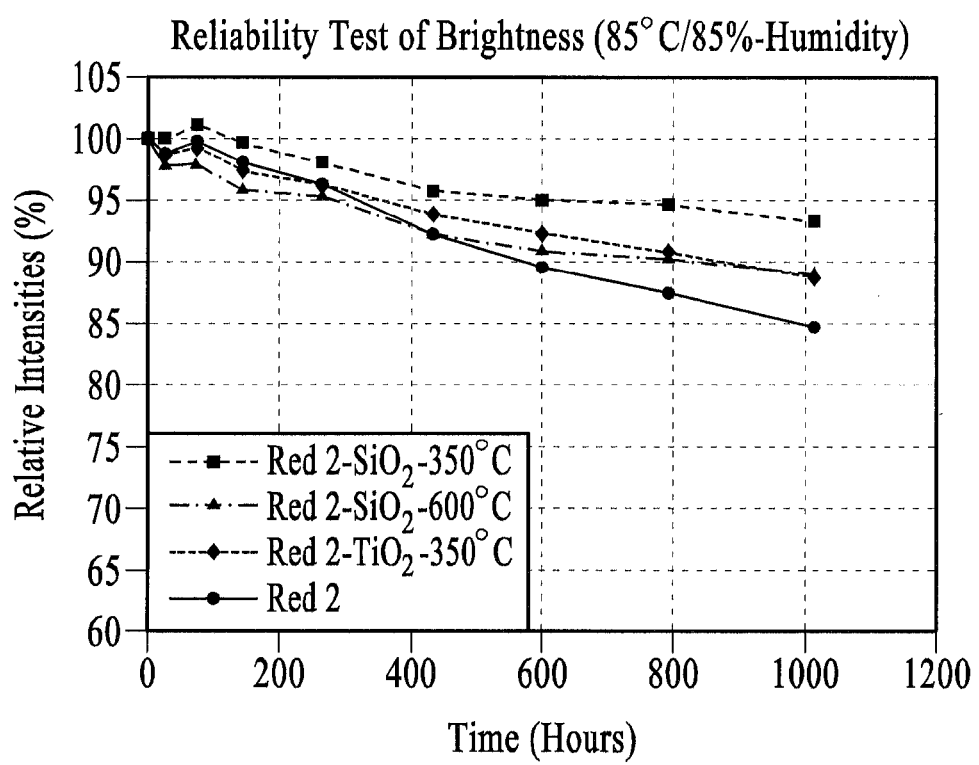
FIG. 24 shows a comparison of brightness intensities between coated and uncoated red nitride phosphors (Red 2), coated with $TiO_2$ and $SiO_2$ for comparison, according to some embodiments of the present invention.

FIG. 24 shows a comparison of brightness intensities between coated and uncoated red nitride phosphors, coated with $TiO_2$ and $SiO_2$ for comparison, according to some embodiments. As shown in FIG. 24, the reliability for the red nitride phosphor coated with $SiO_2$ as described herein, and calcined at 350° C., outperformed the other phosphors in the comparison. It should be noted, however, that the reliability for the red nitride phosphor coated with $SiO_2$ as described herein, and calcined at 600° C. showed decreased brightness compared to the one calcined at 350° C. The uncoated phosphor, as expected, had the worst reliability. Interestingly, the calcining of the coated phosphor had a substantial effect on the reliability of the phosphor.

Figure 25A:
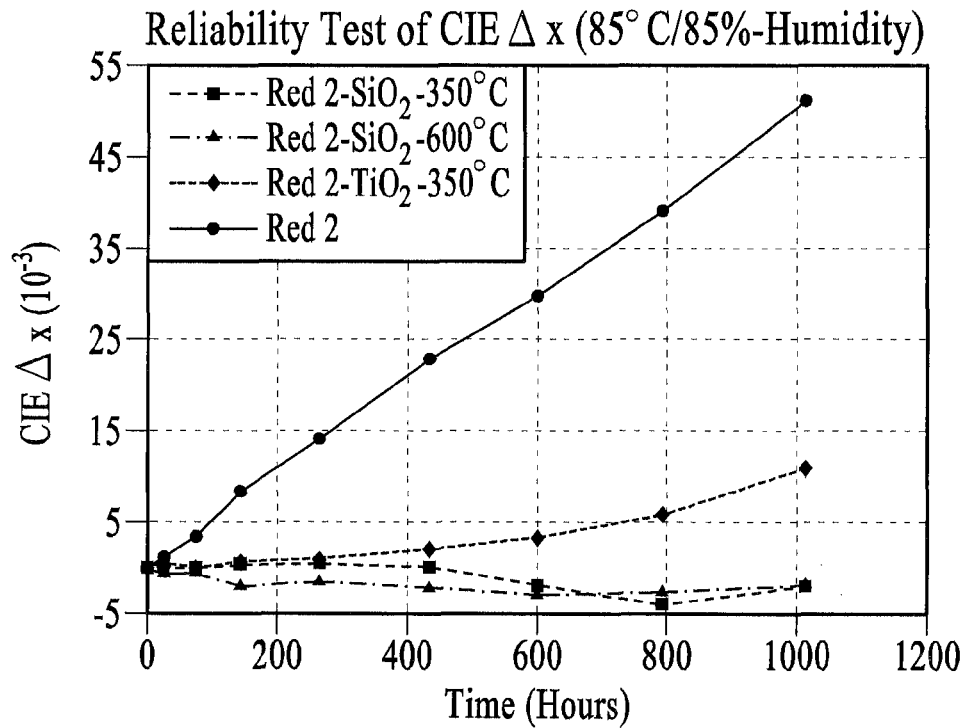
FIGS. 25A & 25B show the relative chromaticity shift (CIE delta-x & CIE delta-y) at time intervals exceeding 1000 hrs for a nitride phosphor uncoated, coated with $TiO_2$, and coated with $SiO_2$ at two different calcining temperatures, according to some embodiments of the present invention.
Figure 25B:
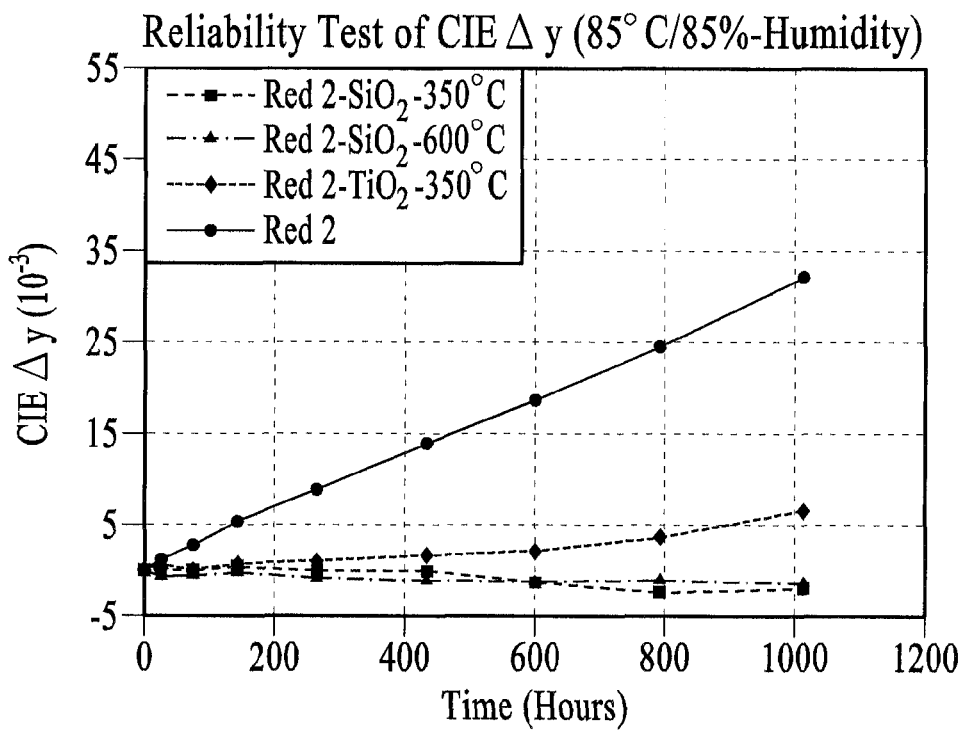

FIG. 25A shows the relative chromaticity shift (CIE delta-x) at time intervals exceeding 1000 hrs for a nitride red phosphor uncoated, coated with $TiO_2$, and coated with $SiO_2$ at two different calcining temperatures, according to some embodiments. As shown in FIG. 25A, the highest color stability was observed for the light-emitting device having the silicon dioxide coated phosphor, regardless of calcining temperature, when compared to the titanium coated phosphor and the uncoated phosphor. FIG. 25B shows the relative chromaticity shift (CIE delta-y) at time intervals exceeding 1000 hrs for a nitride phosphor uncoated, coated with $TiO_2$, and coated with $SiO_2$ at two different calcining temperatures, according to some embodiments. As shown in FIG. 25B, the highest color stability was observed for the light-emitting device having the silicon dioxide coated phosphor, regardless of calcining temperature, when compared to the titanium oxide coated phosphor and the uncoated phosphor.

It should be noted that there are alternative ways of implementing the teaching herein. Accordingly, the present embodiments are to be considered as illustrative and not restrictive, and the invention is not to be limited to the details given herein, but may be modified within the scope and equivalents of the appended claims. Variations on the phosphor or coating material composition, in particular variations that affect the index of refraction of the coating material or the emission of the phosphor, can affect the coating thickness that is desired. For example, for the $SiO_2$ coated phosphors taught herein, sometimes the coating thickness can range from about 10 nm to about 50 nm, or perhaps even be limited to a range of 15 nm to about 20 nm, to provide photoluminescent materials that possess a superior stability to heat and moisture while retaining a desired performance parameter. Sometimes, the coating material can be applied using any method known to one of skill, and sometimes a particular photoluminescent material can be applied using a particular liquid phase deposition process that includes an organometallic or organic precursor. As can be seen from the teachings herein, the deposition rate can be controlled. For example, the deposition rate can be controlled by the precursor concentration, addition rate of the precursor and/or the temperature of the process. By analogy with gas phase atomic layer deposition (ALD), embodiments taught herein can be considered to encompass a liquid atomic layer growth method that enables a controlled deposition for thinner coatings having a high uniformity of morphology and/or thickness. And, in some embodiments, the controlled deposition allows for thicker coatings to be deposited on a photoluminescent material. And, although particularly surprising results have been shown using the coatings and substrates taught herein, it is contemplated that beneficial results may also be obtainable using the coatings and methods taught herein on any of a variety of photoluminescent materials.

Example 19

X-Ray Diffraction Spectra for Red Nitride Phosphors

Figure 26:
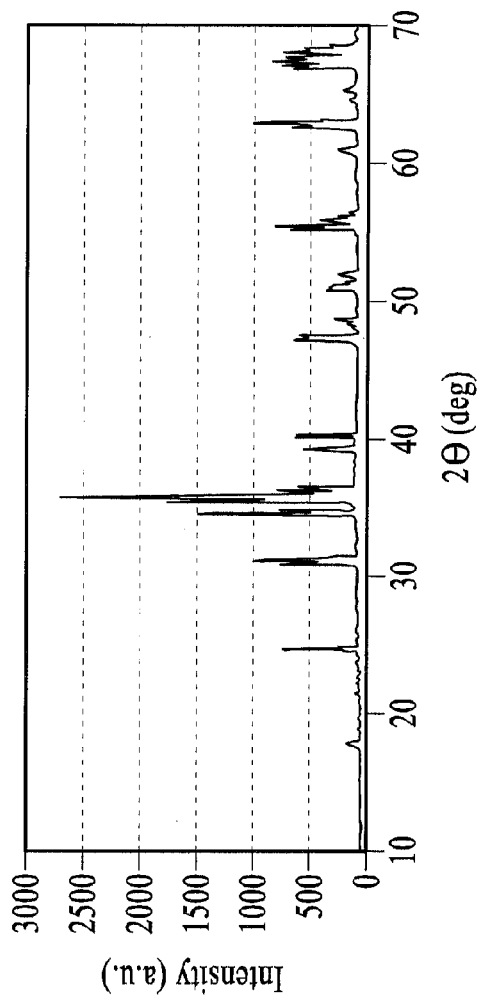
FIG. 26 shows XRD data for the phosphor $Ca_{0.2}Sr_{0.797}AlSiN_3Eu_{0.003}{:}Cl_{0.05}$, according to some embodiments of the present invention.
Figure 27:
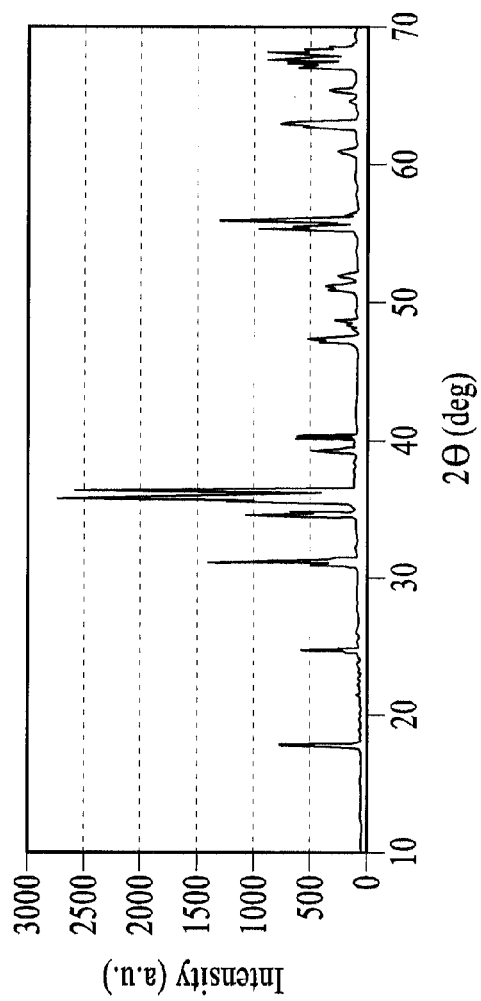
FIG. 27 shows XRD data for the phosphor $Ca_{0.2}Sr_{0.795}AlSiN_3Eu_{0.005}{:}Cl_{0.05}$, according to some embodiments of the present invention.
Figure 28:
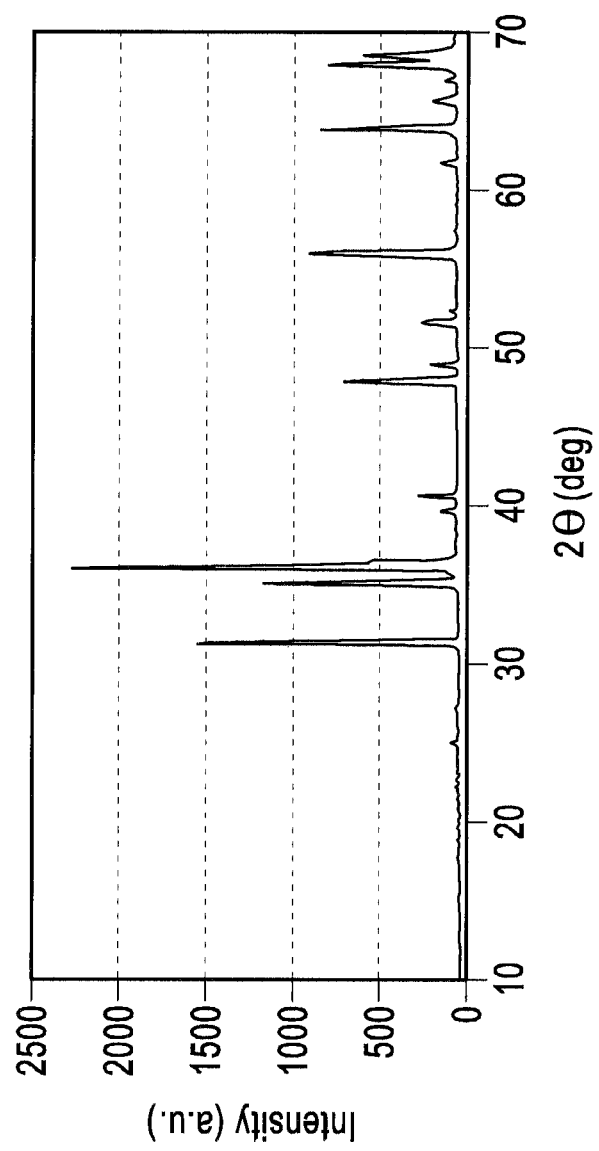
FIG. 28 shows XRD data for the phosphor $Ca_{0.993}AlSiN_3Eu_{0.007}{:}Cl_{0.008}$, according to some embodiments of the present invention.

The following phosphors were produced using the teachings set-forth in example 20, herein. $Ca_{0.2}Sr_{0.795}AlSiN_3Eu_{0.005}:Cl_{0.05}$, $Ca_{0.2}Sr_{0.797}AlSiN_3Eu_{0.003}:Cl_{0.05}$ and $Ca_{0.993}AlSiN_3Eu_{0.007}:Cl_{0.008}$. X-ray spectroscopy was used to analyze the compositions. The diffraction spectra in FIGS. 26-28 show intensity plotted against diffraction angle 2-theta—the angle between the incident x-ray beam and reflected beams. FIG. 26 shows the XRD data for the phosphor $Ca_{0.2}Sr_{0.797}AlSiN_3Eu_{0.003}:Cl_{0.05}$. FIG. 27 shows the XRD data for the phosphor $Ca_{0.2}Sr_{0.795}AlSiN_3Eu_{0.005}:Cl_{0.05}$. FIG. 28 shows the XRD data for the phosphor $Ca_{0.993}AlSiN_3Eu_{0.007}:Cl_{0.008}$.

Example 20

Red Nitride Phosphor Fabrication

Phosphors with the formula $M_mM_aM_bD_{3w}N_{[(2/3)m+z+a+(4/3)b-w]}Z_z$, said formula having been described in more detail above, have been fabricated as described herein. One of skill in the art will appreciate that there are several methods of producing nitride-based phosphors, which may potentially be used to create a nitride-based phosphor for the coated phosphors described herein. A first phosphor synthesis processes is described herein using the compound $CaAlSi(N,F)_3:Eu^{2+}$ as an example. The raw materials are weighed and mixed according to the stoichiometric ratios needed to produce the desired phosphor. Nitrides of the elements $M_m$, $M_a$, and $M_b$ are commercially available as raw materials. Halides of the divalent metal $M_m$, and various ammonium halide fluxes, are also commercially available. Raw material sources of europium include its oxide, but this is a viable option primarily when a halogen containing flux is also used. The mixing may be performed using any general mixing method of which typical ones are mortar or ball mill.

In a specific example, the particular raw materials are $Ca_3N_2$, $AlN$, $Si_3N_4$, and $EuF_2$. In this example, the europium fluoride is being used specifically as a replacement for the traditionally used europium oxide, to utilize the benefits of a reduced oxygen content. One embodiment further reduces the oxygen content by weighing and mixing the raw materials in a glove box under an inert atmosphere, which may comprise nitrogen or argon.

The raw materials are thoroughly blended, and the mixture then heated in an inert atmosphere to a temperature of about 1400° C. to 2000° C. In one embodiment, a heating rate of about 10° C. per minute is used, and maintained at this temperature for about 2 to about 10 hours. The product of this sintering reaction is cooled to room temperature, and pulverized using any number of means known in the art, such as a mortar, ball mill, and the like, to make a powder with the desired composition.

Similar production methods may be used for phosphors where $M_m$, $M_a$, and $M_b$ are other than Ca, Al, and Si, respectively. In this case, compounding amounts of the constituent raw materials may vary.

It has been shown that by using europium halide instead of europium oxide, the oxygen content in the phosphor product may be reduced to less than 2 percent by weight. In a specific example, substituting the halide for the oxide resulted in an oxygen reduction of from about 4.2 percent to about 0.9 percent. In one study performed by the present inventors, the residual 0.9 percent was attributed to the act of weighing and mixing the raw materials in air, rather than in an inert atmosphere.

Calcium nitride or strontium nitride are examples of materials that can be used with the teachings herein. The strontium nitride starting material can be synthesized by nitriding strontium metal under a nitrogen atmosphere at a temperature of about 600° C. to about 850° C. for about 5-12 hours. The resulting strontium nitride is pulverized in a glove box within an inert atmosphere, such as a nitrogen atmosphere. The chemical reaction used to prepare the Sr nitride starting material may be represented by the following equation:

$$3Sr+N_2 \rightarrow Sr_3N_2$$

Calcium nitride may be either obtained commercially or specially prepared. To prepare Ca nitride, a similar procedure may be used as that described above to prepare strontium nitride: calcium metal is nitrided under a nitrogen atmosphere at temperature of about 600° C. to about 950° C. for about 5-12 hours. Note that the upper temperature of the heating step is slightly higher in the calcium case than it was for the strontium case. The calcium nitride that is obtained from that step is pulverized in a glove box under an inert atmosphere such as a nitrogen atmosphere. The chemical reaction may be represented by the following equation:

$$3Ca+N_2 \rightarrow Ca_3N_2$$

Without intending to be bound by any theory or mechanism of action, $Ca_3N_2$ decomposes in air to give ammonia and calcium hydroxide:

$$Ca_3N_2+6H_2O \rightarrow 3Ca(OH)_2+2NH_3,$$

and ammonia has been observed escaping from the raw material mixture when the starting materials were mixed in air. The surface of the mixture gradually becomes white when the raw materials are kept in air for a period of time, even if only a few minutes. Thus, it is beneficial to innovate procedures in which oxygen is deliberately excluded and/or removed from the reaction system.

To exclude oxygen, the raw materials $Sr_3N_2$, $Ca_3N_2$, $AlN$, $Si_3N_4$, and/or $EuF_2$ are sealed within an inert atmosphere, such as nitrogen and/or argon, and maintained in such a state using a glove box. The raw materials are then weighed within the inert atmosphere, usually in a glove box, and then mixed using ordinary methods known in the art, including mixing with either a mortar or ball mill. The resulting mixture is placed in a crucible, which is then transferred to a tube furnace connected directly to the glove box. This is so that exposure of the mixed raw materials to an inert atmosphere is maintained. In the tube furnace, the mixed raw materials are heated to a temperature of about 1400° C.-2000° C. using a heating rate of about 10° C. per minute, and maintained at that temperature for a time anywhere from about 2 to 10 hours. The sintered product is cooled to room temperature, and pulverized using known methods, including mortar, ball mill, and the like, to produce a powder with the desired composition. Red nitride phosphors can be produced having oxygen contents of less than about 1 percent by weight.

As described herein, halogens can be incorporated into the phosphor composition at varying amounts to brighten the emission of the phosphor. The phosphors $Ca_{0.97}AlSiN_3Eu_{0.03}Cl_{0.15}$ and $Ca_{0.97}AlSiN_3Eu_{0.03}F_{0.15}$ were produced to have an oxygen content of less than about 2 weight percent, and are brighter than their non-halogen containing counterparts. Examples of halogen sources for the phosphors taught herein include, but are not limited to, MgF, CaF, SrF, BaF, AlF, GaF, BF, InF, and $(NH_4)_2SiF_6$. The europium may be supplied by either of the two fluorides $EuF_2$ and $EuF_3$. The use of halides of the divalent, trivalent, and tetravalent metals is not the only way to supply the halogen to the phosphor, whereas an alternative method is to use a flux such as $NH_4F$ or LiF. Specifically, compounds of the divalent metal $M_m$ appropriate as raw materials in the syntheses described herein include nitrides, oxides, and halides, e.g., $M_{m3}N_2$, $M_mO$, $M_mD_2$, where again D comprises F, Cl, Br, I, or a combination thereof. Analogous raw material compounds of the trivalent metal $M_a$ are $M_aN$, $M_{a2}O_3$, and $M_aD_3$. The tetravalent metal starting compounds include $M_{b3}N_4$, and $(NH_4)_2M_bF_6$. Compounds of the halide anion D include $NH_4D$ and $A_eD$, where $A_e$ is an alkaline metal such as Li, Na, and $MD_2$, and $M_e$ is an alkaline earth metal such as Mg, Ca, etc. Although an oxide of europium, $Eu_2O_3$ can be used as the source of the europium activator, the oxygen in this compound has been found to have a deleterious effect on the photoluminescent properties of the phosphor. In some embodiments, a europium source that does not contain oxygen can be used, such as the substantially pure Eu metal, which is expensive and difficult to implement, or a Eu halide, such as $EuF_3$ or $EuCl_3$. The use of $EuF_3$, for example, increases the emission efficiency of the phosphor, and the emission wavelength of the phosphor shifts to a longer wavelength. In some embodiments, the creation of a phosphor includes a use of a europium compound $EuD_3$, where D is F, Cl, Br, I, or a combination thereof, and not $Eu_2O_3$.

As can be seen, any of a variety of nitride phosphors can be used with the teachings provided herein. In some embodiments, the phosphor is a nitride-based red phosphor. In some embodiments, the phosphor can be $Ca_{1-x}AlSiN_3Eu_x$, where x can vary from about 0.005 to about 0.05. In some embodiments the phosphor can be $Ca_{0.93}AlSiM_{0.05}N_3Eu_{0.02}{:}F$, where M is Mg, Ca, Sr, and Ba. In some embodiments, the phosphor can be $Ca_{0.98}AlSiN_3Eu_{0.02}{:}F$, $Ca_{0.98}AlSiN_3Mg_{0.05}Eu_{0.02}{:}F$, $Ca_{0.98}AlSiN_3Ca_{0.05}Eu_{0.02}{:}F$, $Ca_{0.98}AlSiN_3Sr_{0.05}Eu_{0.02}{:}F$, and $Ca_{0.98}AlSiN_3Ba_{0.05}Eu_{0.02}{:}F$, and $Ca_{0.97}AlSiN_3Eu_{0.03}{:}F$, and $Ca_{0.97}AlSiN_3Eu_{0.03}F_x$, or the variation $Ca_{0.98}AlSiN_3Eu_0.02{:}F_x$, wherein x ranges from 0 to 0.15 in increments of 0.01. For example, x can be 0.04 or 0.15 in some embodiments.

In some embodiments, the phosphors can include, but are not limited to, $Ca_{0.2}Sr_{0.8}AlSiN_3Eu_{0.01}$, $Ca_{0.158}Sr_{0.815}AlSiN_3Eu_{0.023}$, or $Ca_{0.2}Sr_{0.79}AlSiN_3Eu_{0.01}{:}F$. And, in some embodiments, particularly novel phosphors can be selected from the group consisting of $Ca_{0.2}Sr_{0.795}AlSiN_3Eu_{0.005}{:}Cl_{0.05}$, $Ca_{0.2}Sr_{0.797}AlSiN_3Eu_{0.003}{:}Cl_{0.05}$, or $Ca_{0.993}AlSiN_3Eu_{0.007}{:}Cl_{0.008}$, and variations thereof.

In some embodiments, the phosphors are synthesized under high pressure of inert gas, such as, for example, nitrogen in a high pressure furnace. In some embodiments, the pressure of inert gas in a high pressure furnace is about 10 bars. In other embodiments, the pressure of inert gas in a high pressure furnace is between about 2 bars and about 15 bars. In still other embodiments, the pressure of inert gas in a high pressure furnace is between about 5 bars and about 12 bars. While not being wished to be bound by theory, high pressure synthesis of the nitride phosphors may result in higher yield, less processing time (i.e., milling time is reduced) with improved quality (e.g., smaller particle size, higher Eu content) and reliability.

A specific example is provided for forming the phosphor $Ca_{0.2}Sr_{0.795}AlSiN_3Eu_{0.005}{:}Cl_{0.05}$. $Ca_3N_2$, $Sr_3N_2$, AlN, $Si_3N_4$, $EuCl_3$ and $NH_4Cl$ are used as the raw materials. Here $EuCl_3$ is used instead of $Eu_2O_3$ to prevent release the oxygen from $Eu_2O_3$ into the system. The raw materials are weighed in a glove box under an inert atmosphere and the mixing is performed under an inert atmosphere of the nitrogen.

8.792 g $Ca_3N_2$, 68.515 g $Sr_3N_2$, 36.45 g AlN, 41.656 g $Si_3N_4$, 1.61 g $EuCl_3$ and 2.376 g $NH_4Cl$ are weighed in a glove box under an inert atmosphere and the mixing is performed either in the glove box or by an ordinary ball mill under an inert atmosphere of the nitrogen or the like. The mixed raw materials are put into a Mo crucible in the glove box and the crucible is pushed into a high temperature furnace. The mixed raw materials in the crucible are heated to 1700° C. by a heating rate of 10° C./min under an inert atmosphere of nitrogen, retained and fired at 1700° C. for 7 hours. After the sintering is completed, the raw materials are cooled down to the room temperature, and thereafter pulverized using a pulverizing means such as a mortar, ball mill, or the like. The milled phosphors are washed by distilled water, dried, and then sieved by 38 um screen. The whole procedure is not affected by air and moisture completely. The resulting phosphor $Ca_{0.2}Sr_{0.795}AlSiN_3Eu_{0.005}{:}Cl_{0.05}$ is characterized in the table below.

TABLE 9

| Performance | Wavelength (nm) | PL | CIE x | CIE y | D50v (um) |
|---|---|---|---|---|---|
| Data | 629 | 1.53 | 0.638 | 0.361 | 15.5 |

A specific example is provided for forming the phosphor $Ca_{0.993}AlSiN_3Eu_{0.007}Cl_{0.008}$. $Ca_3N_2$, AlN, $Si_3N_4$, and $EuCl_3$ are used as the raw materials. Here $EuCl_3$ is used instead of $Eu_2O_3$ to prevent release the oxygen from $Eu_2O_3$ into the system. The raw materials are weighed in a glove box under an inert atmosphere and the mixing is performed under an inert atmosphere of the nitrogen.

43.42 g $Ca_3N_2$, 76.22 g AlN, 193.54 g $Si_3N_4$, and 12.9 g $EuCl_3$ are weighed in a glove box under an inert atmosphere and the mixing is performed either in the glove box or by an ordinary ball mill under an inert atmosphere of the nitrogen or the like. The mixed raw materials are put into a Mo crucible in the glove box and the crucible is pushed into a high temperature furnace. The mixed raw materials in the crucible are heated to 1750° C. by a heating rate of 10° C./min under an inert atmosphere of nitrogen, and retained and fired at 1750° C. for about 7 hours. After the sintering is completed, the raw materials are cooled down to the room temperature, and thereafter pulverized using a pulverizing means such as a mortar, ball mill, or the like. The milled phosphors are washed by DI water, dried, and then sieved by 38 um screen. The whole procedure is not affected by air and moisture completely. The resulting phosphor $Ca_{0.993}AlSiN_3Eu_{0.007}Cl_{0.008}$ is characterized in the table below.

TABLE 10

| Performance | Wavelength (nm) | PL | CIE x | CIE y | D50v (um) |
|---|---|---|---|---|---|
| Data | 600 | 1.27 | 0.553 | 0.445 | 5.56 |

In some embodiments, the nitride phosphor can have the formula $CaSr_{0.8-x}AlSiN_3{:}Eu_x{:}D$ wherein, x ranges from about 0.001 to about 0.009 in increments of about 0.001 and D comprises fluorine, chlorine, bromine, or iodine. In other embodiments, the nitride phosphor can have the formula $CaSr_{0.8-x}AlSiN_3{:}Eu_x{:}D$ wherein x ranges from about 0.001 to about 0.009 provided that x is not 0.005 in increments of about 0.001 and D comprises fluorine, chlorine, bromine, or iodine.

In some embodiments, the phosphor has the formula $Ca_{0.2}Sr_{0.798}AlSiN_3Eu_{0.002}{:}Cl_{0.05}$, $Ca_{0.2}Sr_{0.797}AlSiN_3Eu_{0.003}{:}Cl_{0.05}$, $Ca_{0.2}Sr_{0.796}AlSiN_3Eu_{0.004}{:}Cl_{0.05}$, $Ca_{0.2}Sr_{0.794}AlSiN_3Eu_{0.006}{:}Cl_{0.05}$, $Ca_{0.2}Sr_{0.793}AlSiN_3Eu_{0.007}{:}Cl_{0.05}$, $Ca_{0.2}Sr_{0.792}AlSiN_3Eu_{0.008}{:}Cl_{0.05}$, $Ca_{0.2}Sr_{0.791}AlSiN_3Eu_{0.009}{:}Cl_{0.05}$, $Ca_{0.2}Sr_{0.797}AlSiN_3Eu_{0.003}{:}Cl_{0.05}$, $Ca_{0.2}Sr_{0.796}AlSiN_3Eu_{0.004}{:}Cl_{0.05}$ or $Ca_{0.2}Sr_{0.7925}AlSiN_3Eu_{0.0075}{:}Cl_{0.05}$. In other embodiments, the phosphor is $Ca_{0.2}Sr_{0.795}AlSiN_3Eu_{0.005}{:}Cl_{0.05}$.

In other embodiments, the phosphor has the formula $Ca_{1-x}AlSiN_3Eu_x{:}D$; wherein x ranges from about 0.0001 to about 0.500 and D comprises fluorine, chlorine, bromine, or iodine. In some embodiments, the phosphor has the formula $Ca_{0.993}AlSiN_3Eu_{0.007}Cl_{0.008}$.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A coated photoluminescent material, said coating being a multifunctional coating comprising:
    a photoluminescent material having a surface; and
    at least two oxides, the two oxides including:
        a primer material having a primer thickness on the surface of said photoluminescent material, said primer thickness functioning to at least inhibit a leaching of a component of said photoluminescent material into said coating;
        an outermost, sealant material having a sealant thickness that functions to inhibit or prevent oxygen and moisture from diffusing through said coating and into said photoluminescent material; and
        a gradient-interface thickness between said primer thickness and said outermost, sealant thickness, said gradient-interface thickness having a composition that changes continuously through the thickness from being predominantly a primer material composition to a predominantly sealant material composition;
    wherein said at least two oxides are selected from the group consisting of metal oxides and semiconductor oxides.

2. The coated photoluminescent material of claim 1, wherein said primer material is titanium oxide and said outermost, sealant material is silicon oxide.

3. The coated photoluminescent material of claim 1, wherein the gradient-interface thickness is a mixture of titanium oxide and silicon oxide.

4. The coated photoluminescent material of claim 1, wherein said photoluminescent material comprises a silicate phosphor, an aluminate phosphor, a nitride phosphor, an oxynitride phosphor, a sulfide phosphor or an oxysulfide phosphor.

5. The coated photoluminescent material of claim 1, wherein said photoluminescent material has the formula $Ca_{1-x}AlSiN_3Eu_x:D$; wherein, x ranges from about 0.0001 to about 0.500 and D comprises fluorine, chlorine, bromine, or iodine.

6. A light emitting device, comprising:
    a solid state light emitter; and
    the coated photoluminescent material of claim 1.

7. The coated photoluminescent material of claim 6, wherein said photoluminescent material is a nitride phosphor.

8. The coated photoluminescent material of claim 1, wherein said primer thickness is at least 20 nm.

9. The coated photoluminescent material of claim 1, wherein said sealant thickness is at least 20 nm.

10. The coated photoluminescent material of claim 1, wherein said coating is between 20 nm and 100 nm thick.

11. The coated photoluminescent material of claim 1, wherein said coating further comprises a mixed composition layer.

12. The coated photoluminescent material of claim 11, wherein said mixed composition layer comprises a mixture of aluminium oxide and silicon oxide.

13. The coated photoluminescent material of claim 11, wherein said mixed composition layer is between 10 nm and 100 nm thick.

14. The coated photoluminescent material of claim 1, wherein said primer material is aluminum oxide and said outermost, sealant material is silicon oxide.

15. The coated photoluminescent material of claim 1, wherein said composition—percentage of primer material versus sealant material—of said gradient-interface thickness changes approximately linearly through the thickness.

16. The coated photoluminescent material of claim 1, wherein said composition—percentage of primer material versus sealant material—of said gradient-interface thickness changes non-linearly through the thickness.

17. The coated photoluminescent material of claim 1, wherein said coating has a mixed oxide composition throughout the thickness of said coating.

18. The coated photoluminescent material of claim 1, wherein said photoluminescent material is a nitride phosphor.

19. A coated photoluminescent material, said coating being a multifunctional coating comprising:
    a photoluminescent material having a surface; and
    at least two oxides, the two oxides including:
        a primer material having a primer thickness on the surface of said photoluminescent material, said primer thickness functioning to at least inhibit a leaching of a component of said photoluminescent material into said coating; and
        an outermost, sealant material having a sealant thickness that functions to inhibit or prevent oxygen and moisture from diffusing through said coating and into said photoluminescent material;
    wherein said at least two oxides are selected from the group consisting of metal oxides and semiconductor oxides, wherein said coating has a mixed oxide composition throughout the thickness of said coating, and wherein said mixed oxide composition varies throughout the thickness of said coating.

20. The coated photoluminescent material of claim 19, wherein said mixed oxide composition comprises aluminium oxide and silicon oxide.

21. The coated photoluminescent material of claim 20, wherein said coating is between 10 nm and 50 nm thick.

22. The coated photoluminescent material of claim 20, wherein said coating is between 15 nm and 30 nm thick.

23. The coated photoluminescent material of claim 20, wherein the molar ratio of Al to Si is between 1:1 and 1:30.

24. The coated photoluminescent material of claim 20, wherein the molar ratio of Al to Si varies between 1:1 and 1:50.

25. The coated photoluminescent material of claim 19, wherein said photoluminescent material is a nitride phosphor.

* * * * *